(12) United States Patent
Simsek-Ege

(10) Patent No.: US 11,791,273 B2
(45) Date of Patent: Oct. 17, 2023

(54) MICROELECTRONIC DEVICES INCLUDING CONTACT STRUCTURES, AND RELATED MEMORY DEVICES, ELECTRONIC SYSTEMS, AND METHODS

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 17/500,599

(22) Filed: Oct. 13, 2021

(65) Prior Publication Data

US 2023/0110706 A1    Apr. 13, 2023

(51) Int. Cl.
*H01L 23/538*    (2006.01)
*G11C 5/06*    (2006.01)
*H10B 12/00*    (2023.01)

(52) U.S. Cl.
CPC ............ *H01L 23/5386* (2013.01); *G11C 5/06* (2013.01); *H10B 12/30* (2023.02)

(58) Field of Classification Search
CPC ....... H01L 23/5386; G11C 5/06; G11C 5/025; H10B 12/30; H10B 12/50
See application file for complete search history.

(56) References Cited

U.S. PATENT DOCUMENTS 8,067,286 B2    11/2011    Parekh et al.
8,153,499 B2    4/2012    Or-Bach et al.
(Continued)

FOREIGN PATENT DOCUMENTS

WO    2008063251 A2    5/2008

OTHER PUBLICATIONS

International Search Report for International Application No. PCT/US2022/076554, dated Jan. 10, 2023, 5 pages.
(Continued)

*Primary Examiner* — David Vu
(74) *Attorney, Agent, or Firm* — TraskBritt

(57) ABSTRACT

A microelectronic device comprises a first microelectronic device structure and a second microelectronic device structure attached to the first microelectronic device structure. The first microelectronic device structure comprises memory arrays comprising memory cells comprising access devices and storage node devices, digit lines coupled to the access devices and extending in a first direction to a digit line exit region, and word lines coupled to the access devices and extending in a second direction to a word line exit region. The second microelectronic device structure comprises control logic devices over and in electrical communication with the memory cells. The microelectronic device further comprises contact structures individually in contact with the digit lines in the digit line exit region and in electrical communication with at least some of the control logic devices, at least one of the contact structures comprising a first cross-sectional area at an interface of the first microelectronic device structure and the second microelectronic device structure, and a second cross-sectional area at an interface of one of digit lines, the second cross-sectional area smaller than the first cross-sectional area. Related microelectronic devices, memory devices, electronic systems, and methods are also described.

36 Claims, 23 Drawing Sheets

(56) References Cited

U.S. PATENT DOCUMENTS

| | | |
|---|---|---|
| 8,184,471 B2 | 5/2012 | Woo et al. |
| 8,546,188 B2 | 10/2013 | Liu et al. |
| 8,716,116 B2 | 5/2014 | Parekh et al. |
| 9,543,433 B2 | 1/2017 | Anathan et al. |
| 10,923,450 B2 * | 2/2021 | Fastow .................. H10B 41/40 |
| 2009/0108318 A1 | 4/2009 | Yoon et al. |
| 2009/0168482 A1 | 7/2009 | Park et al. |
| 2009/0325343 A1 | 12/2009 | Lee |
| 2019/0244933 A1 | 8/2019 | Or-Bach et al. |
| 2020/0066730 A1 | 2/2020 | Guo et al. |
| 2020/0176058 A1 | 6/2020 | Huo et al. |
| 2021/0118890 A1 | 4/2021 | Kim et al. |
| 2021/0265295 A1 | 8/2021 | Liu et al. |

OTHER PUBLICATIONS

International Written Opinion for International Application No. PCT/US2022/076554, dated Jan. 10, 2023, 5 pages.

* cited by examiner

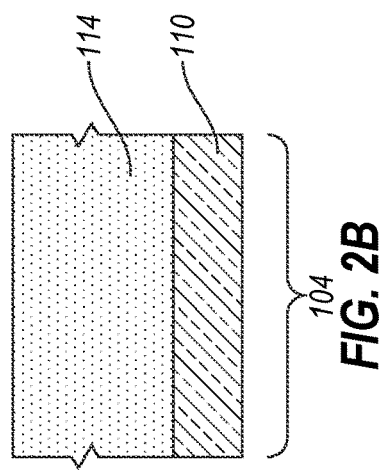
FIG. 2B
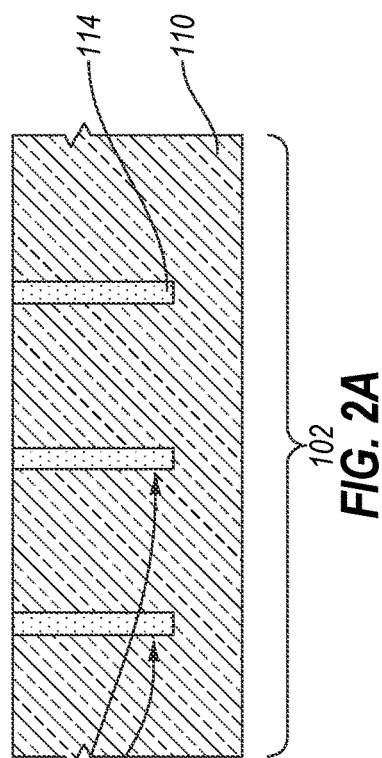
FIG. 2A

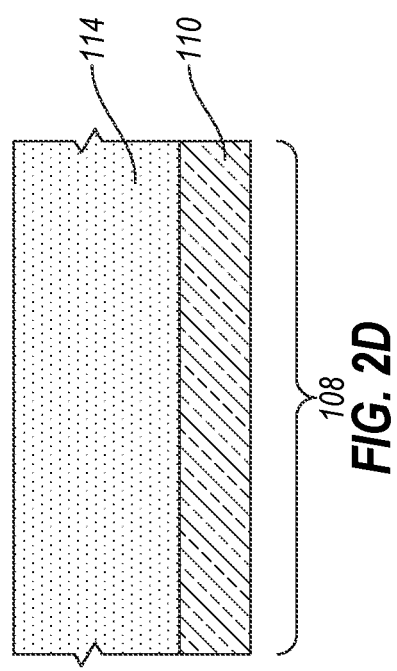
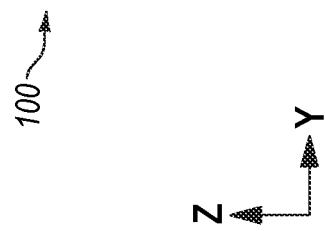
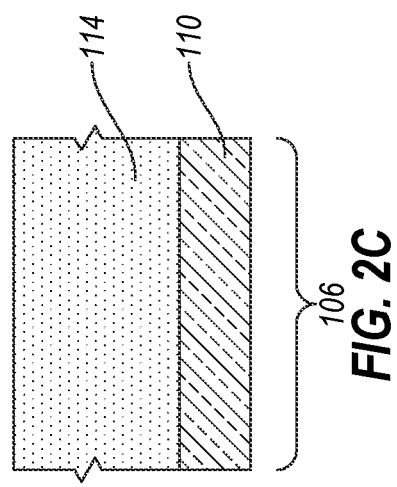

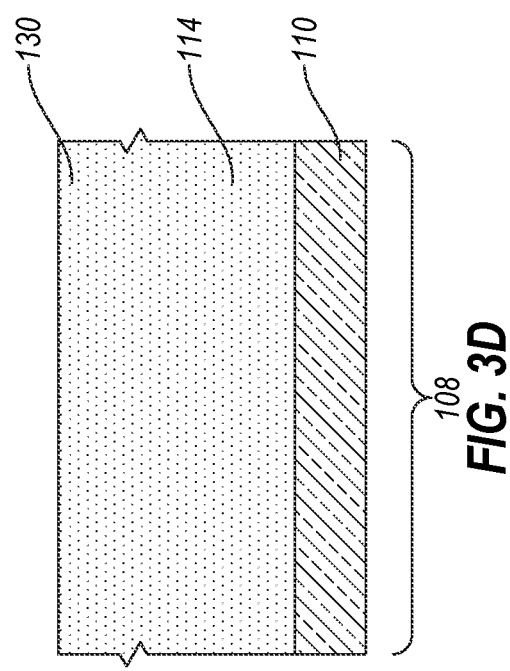
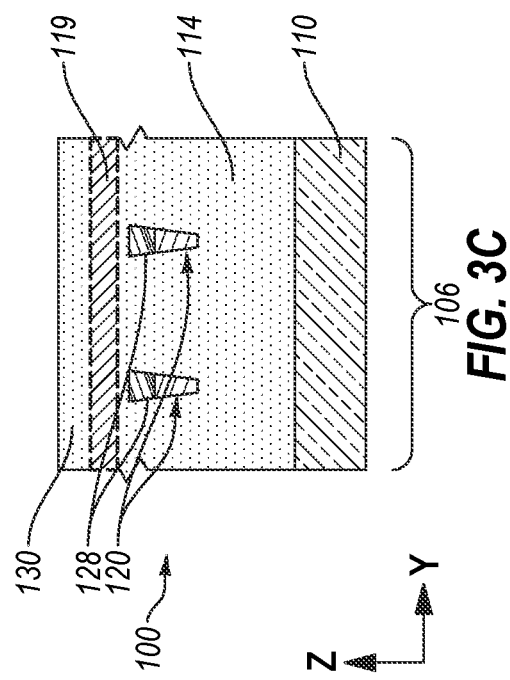

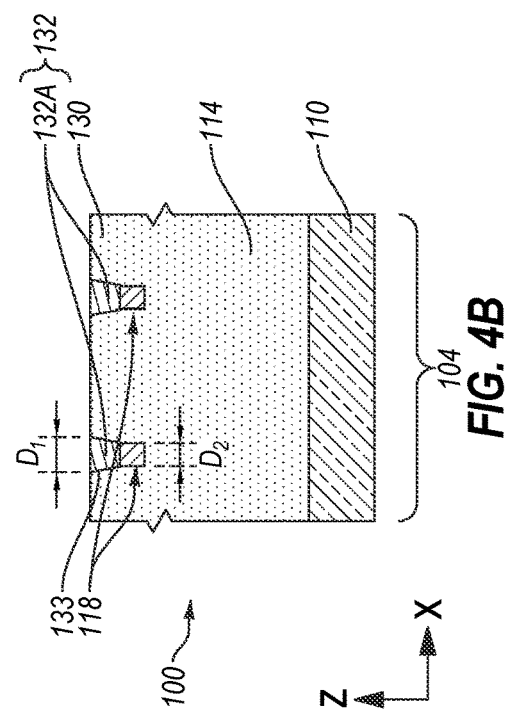
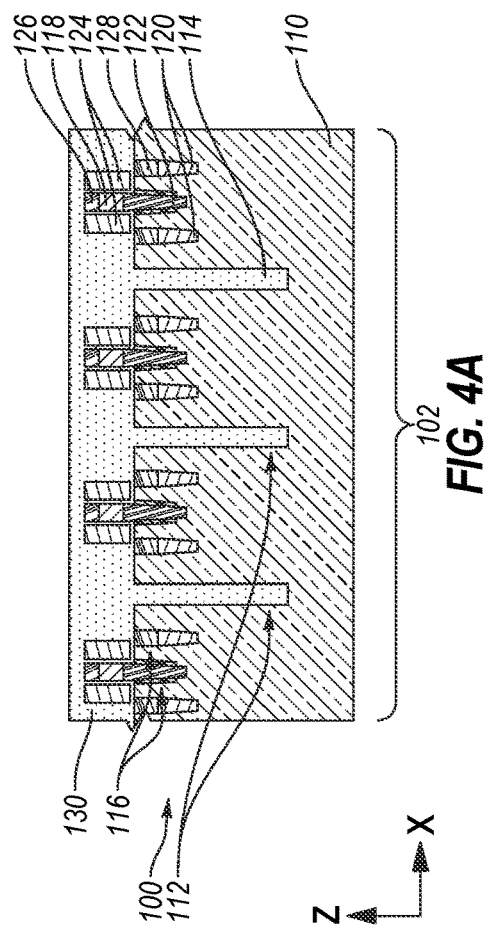

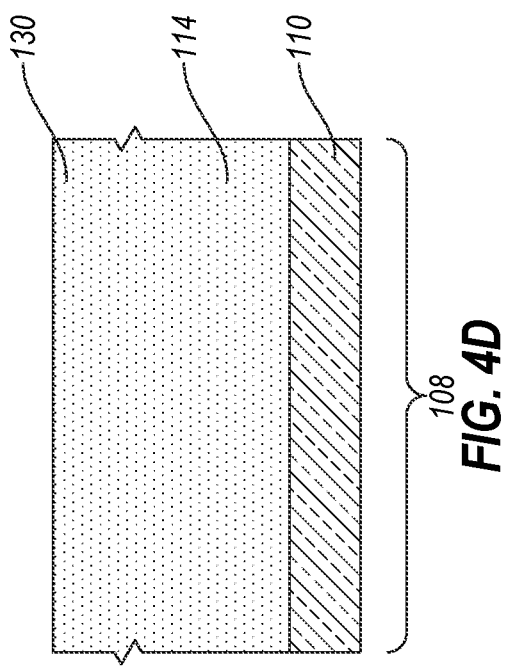
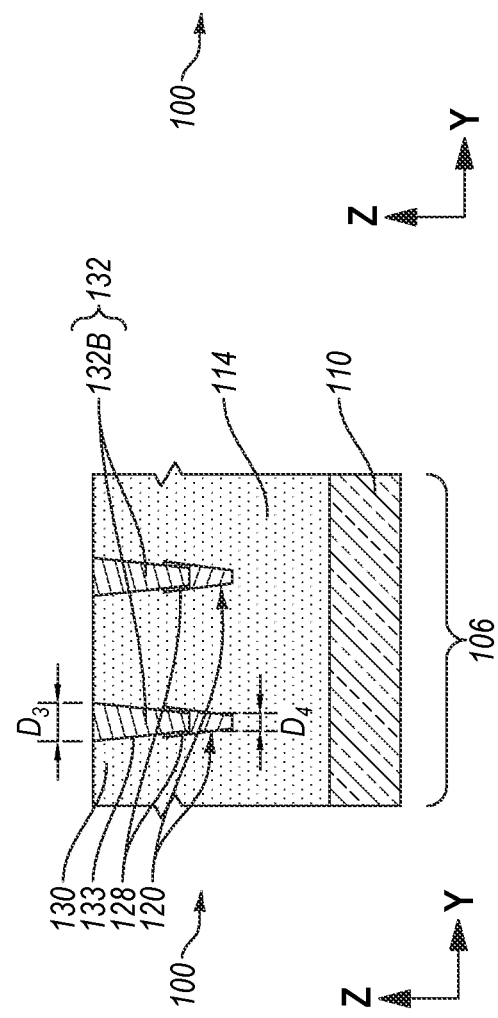

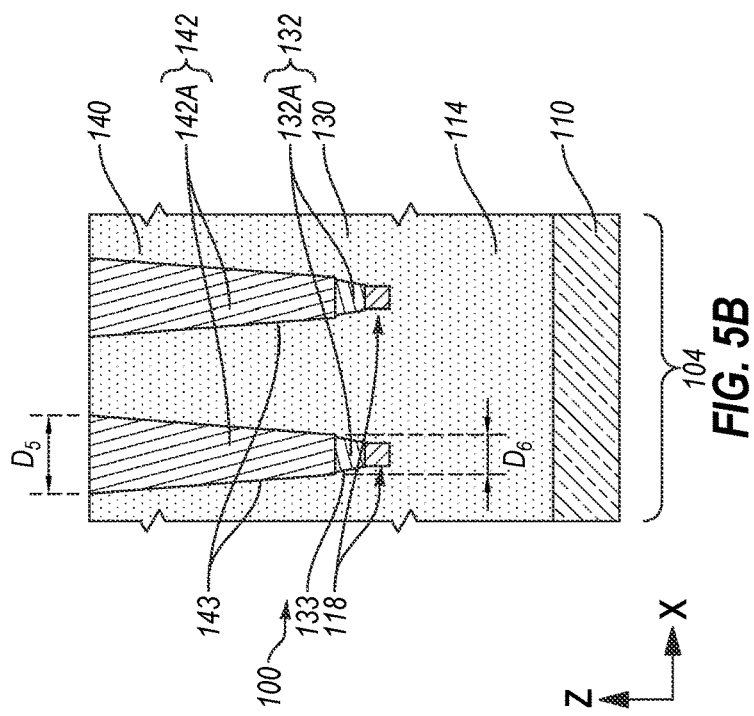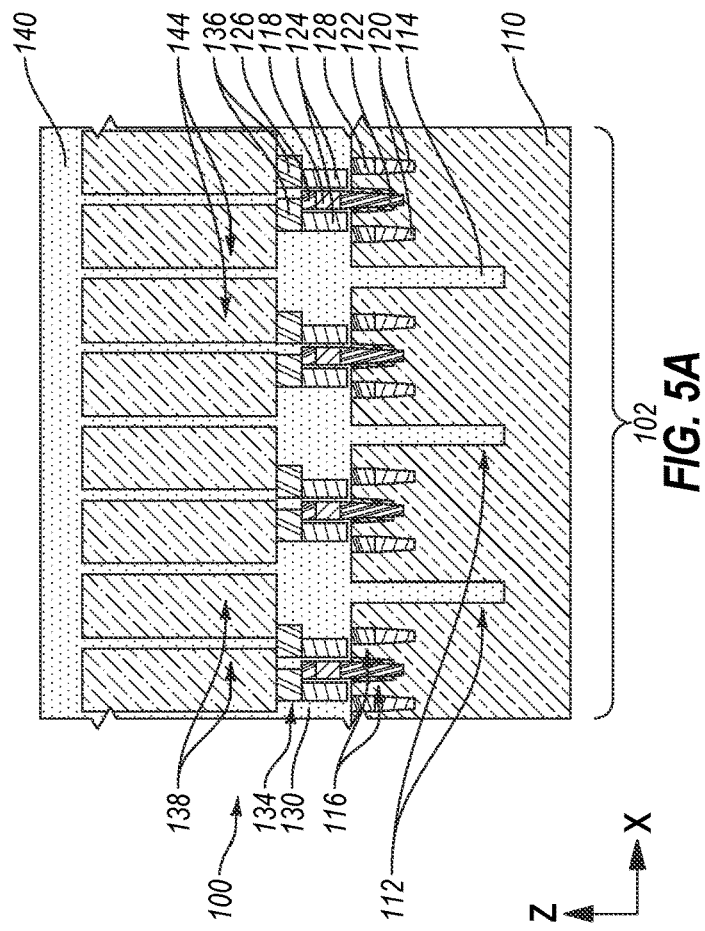

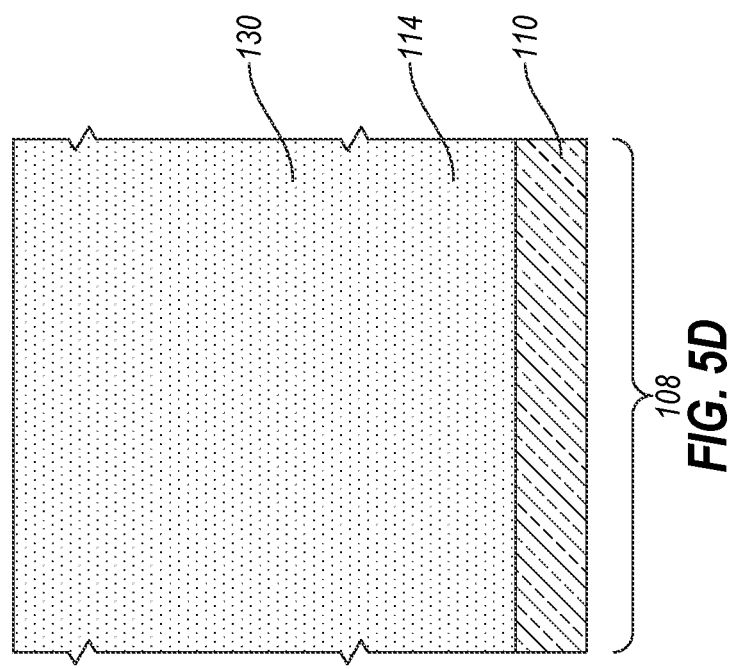
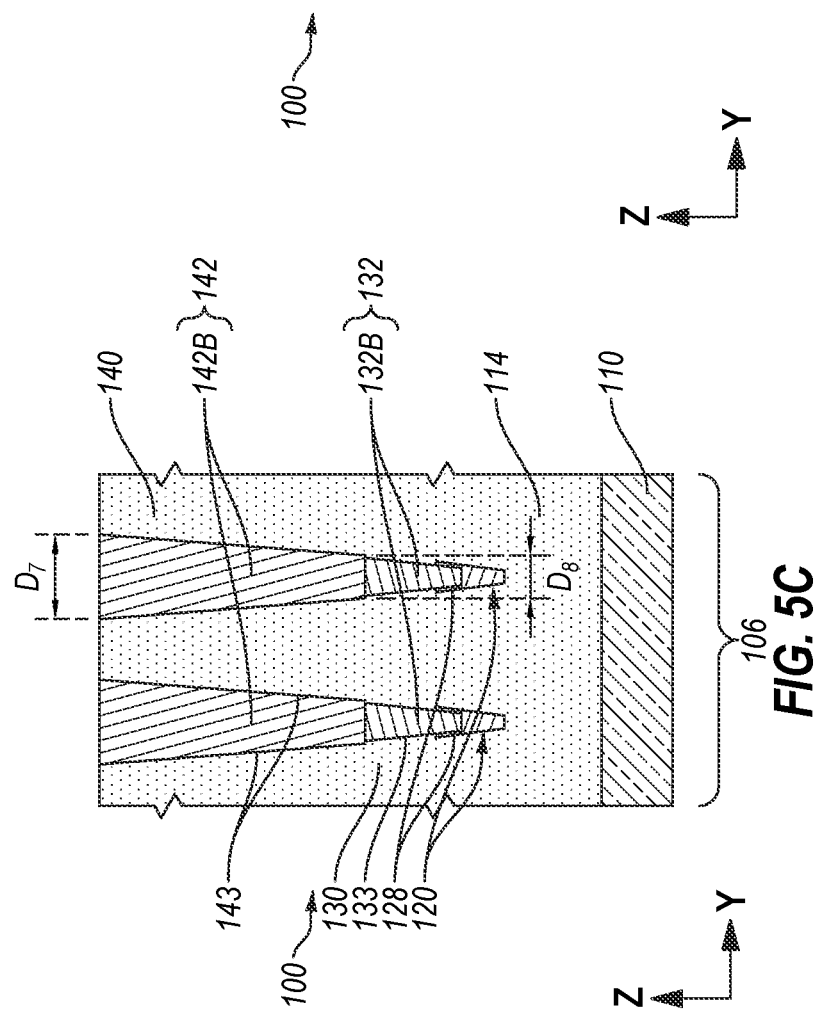

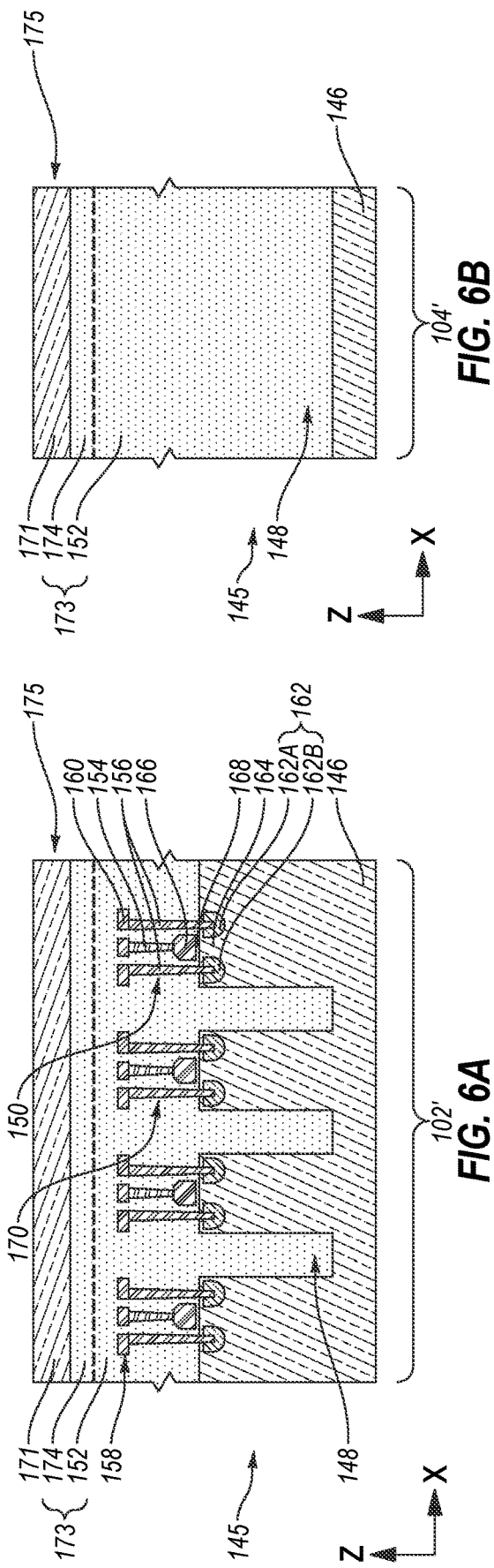

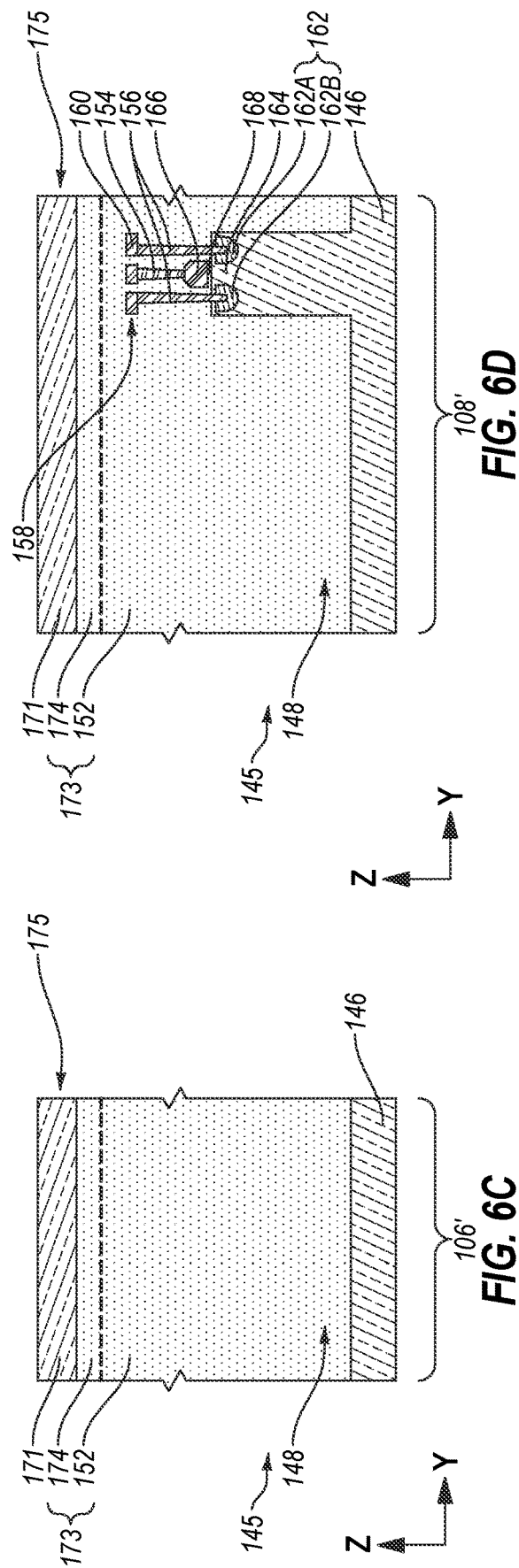

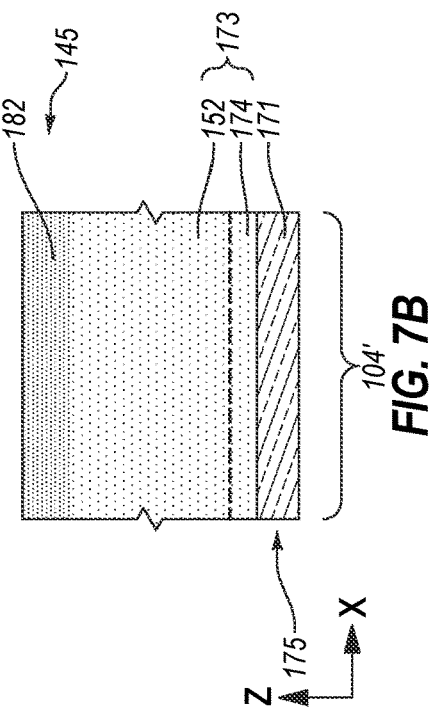
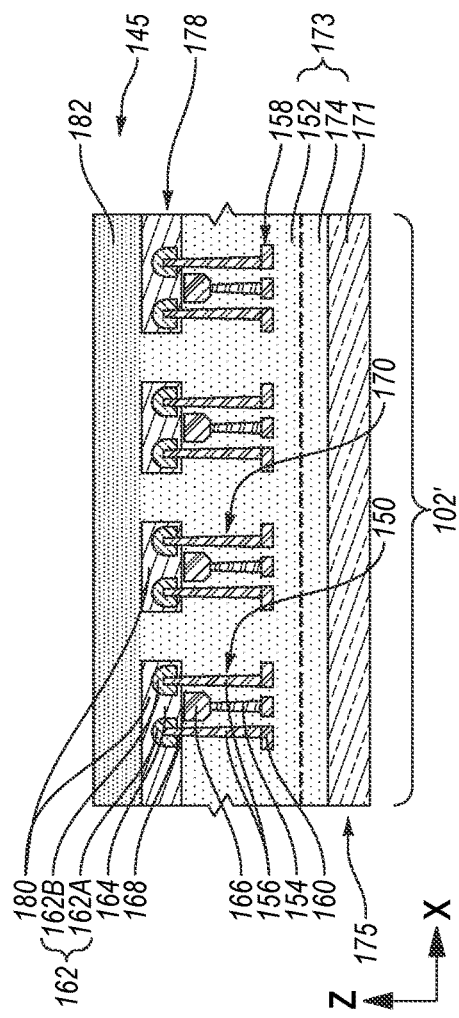

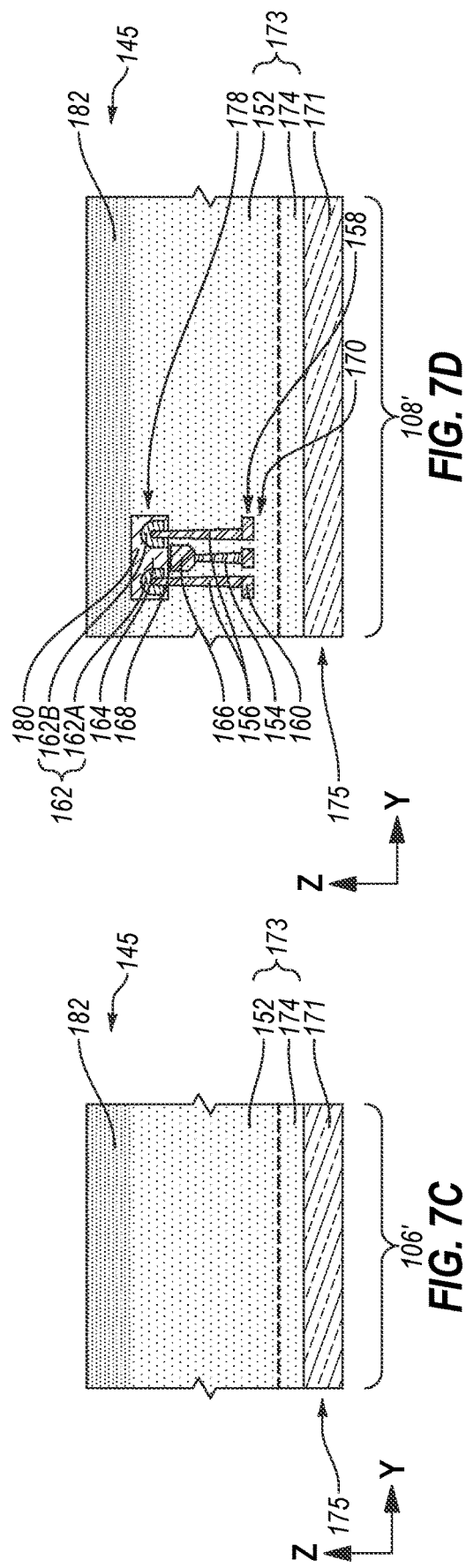

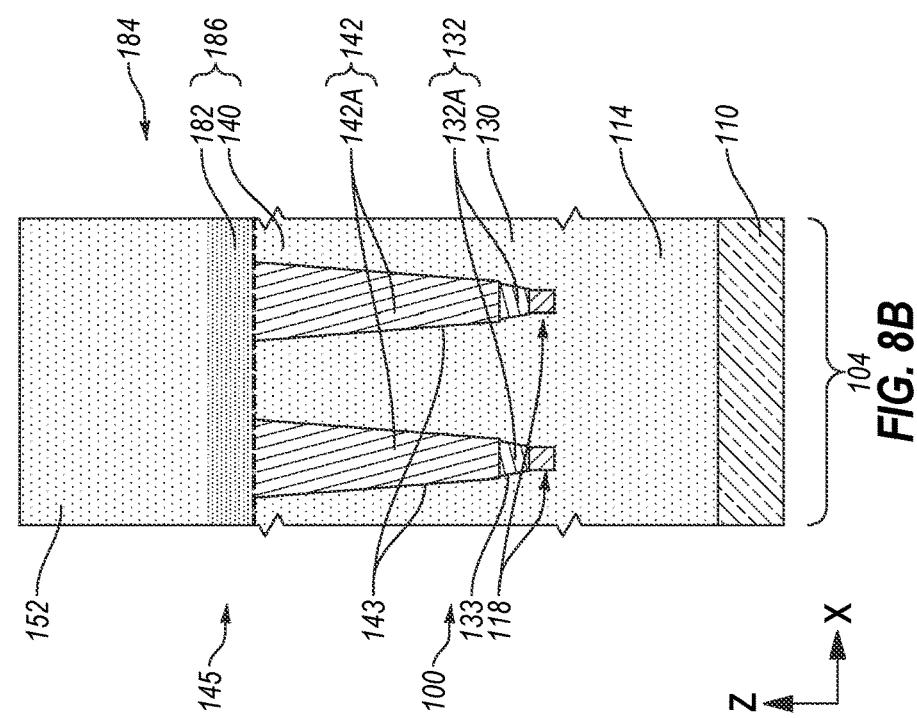
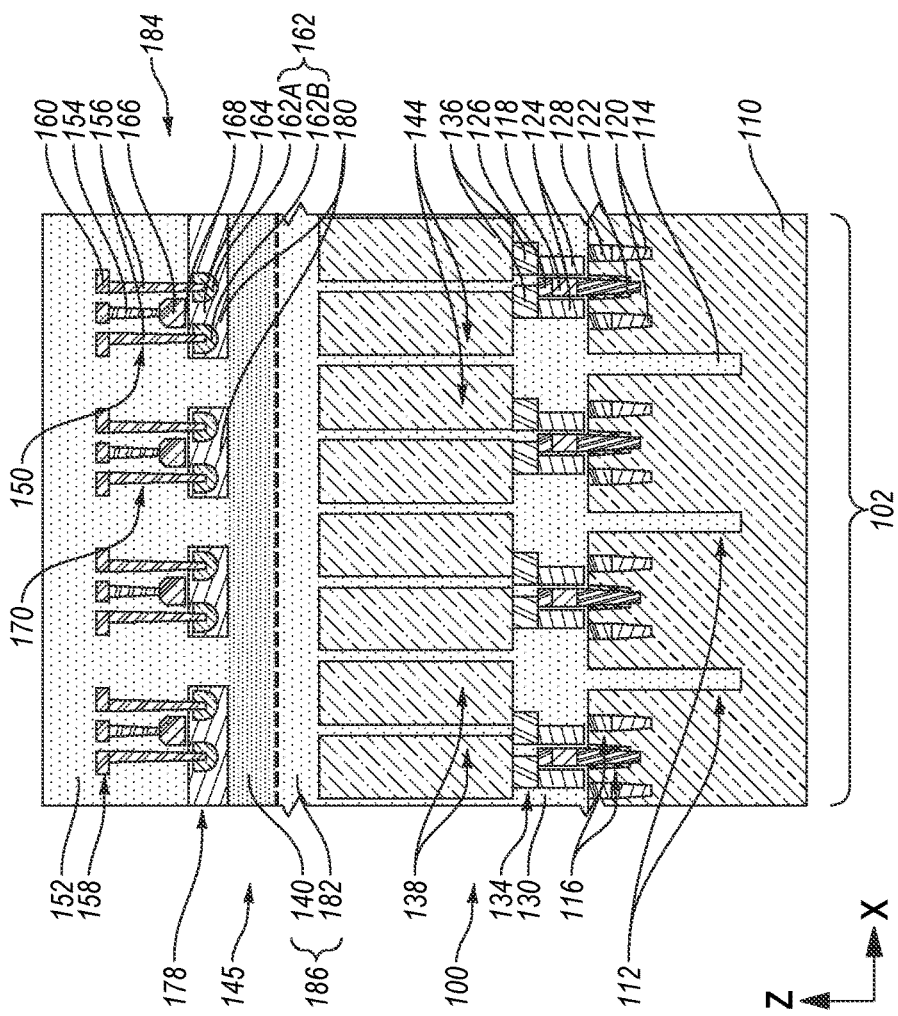

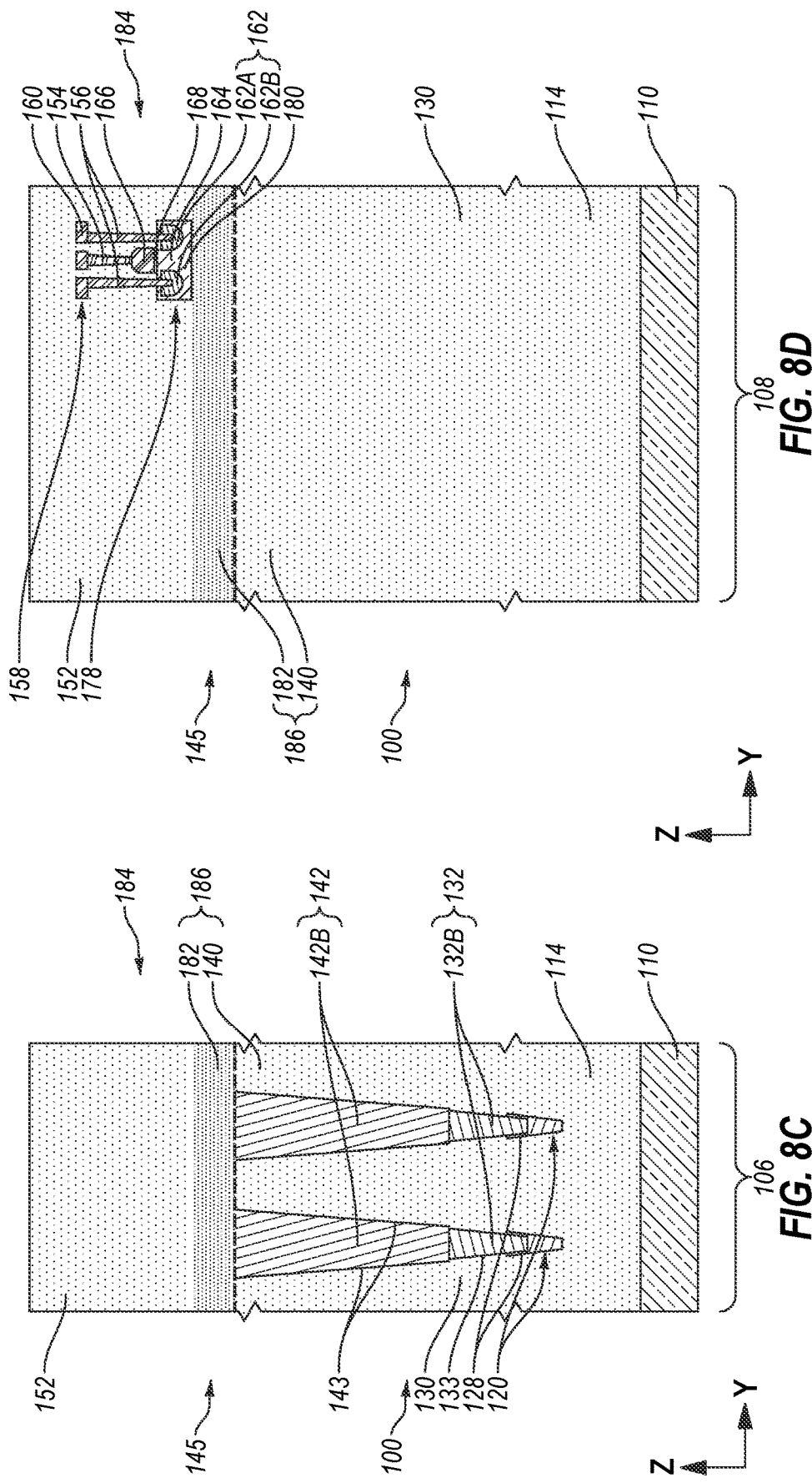

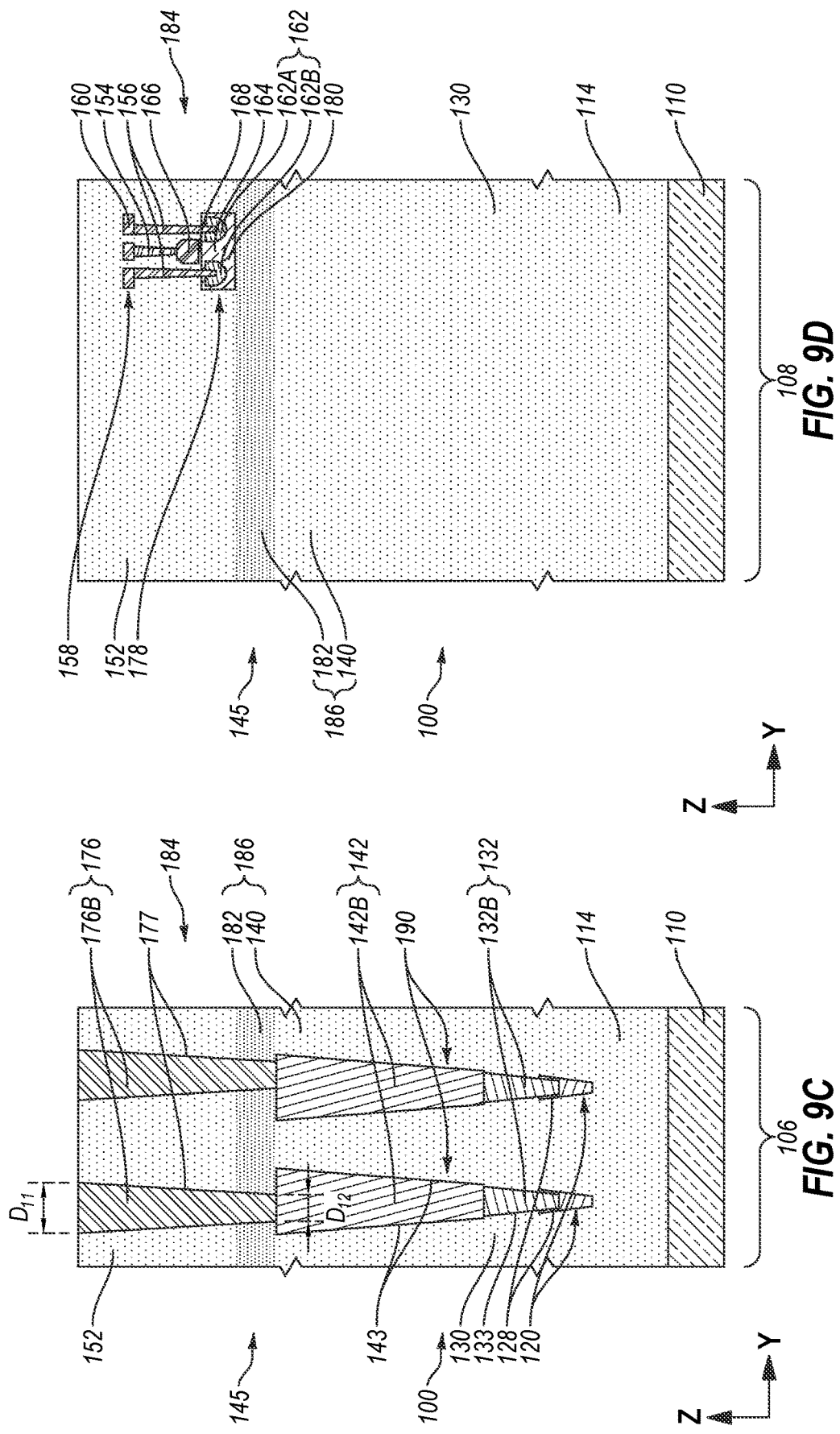

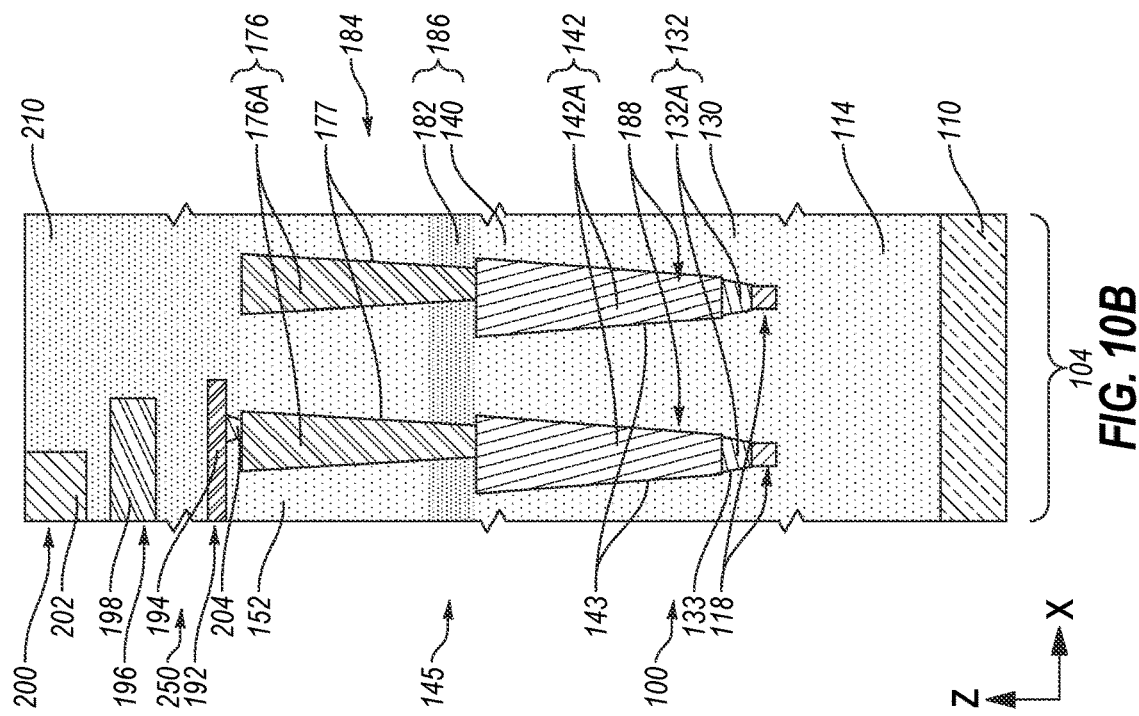
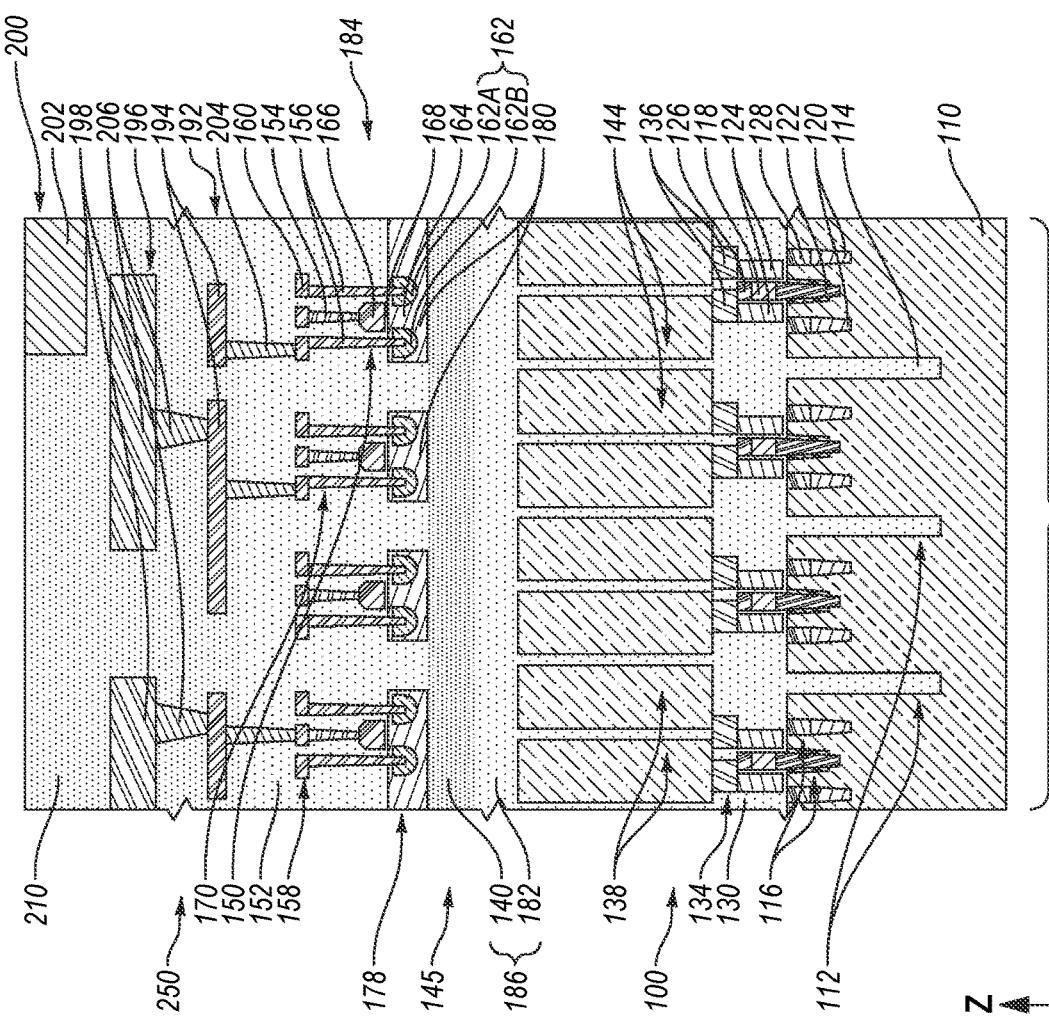
FIG. 10A
FIG. 10B

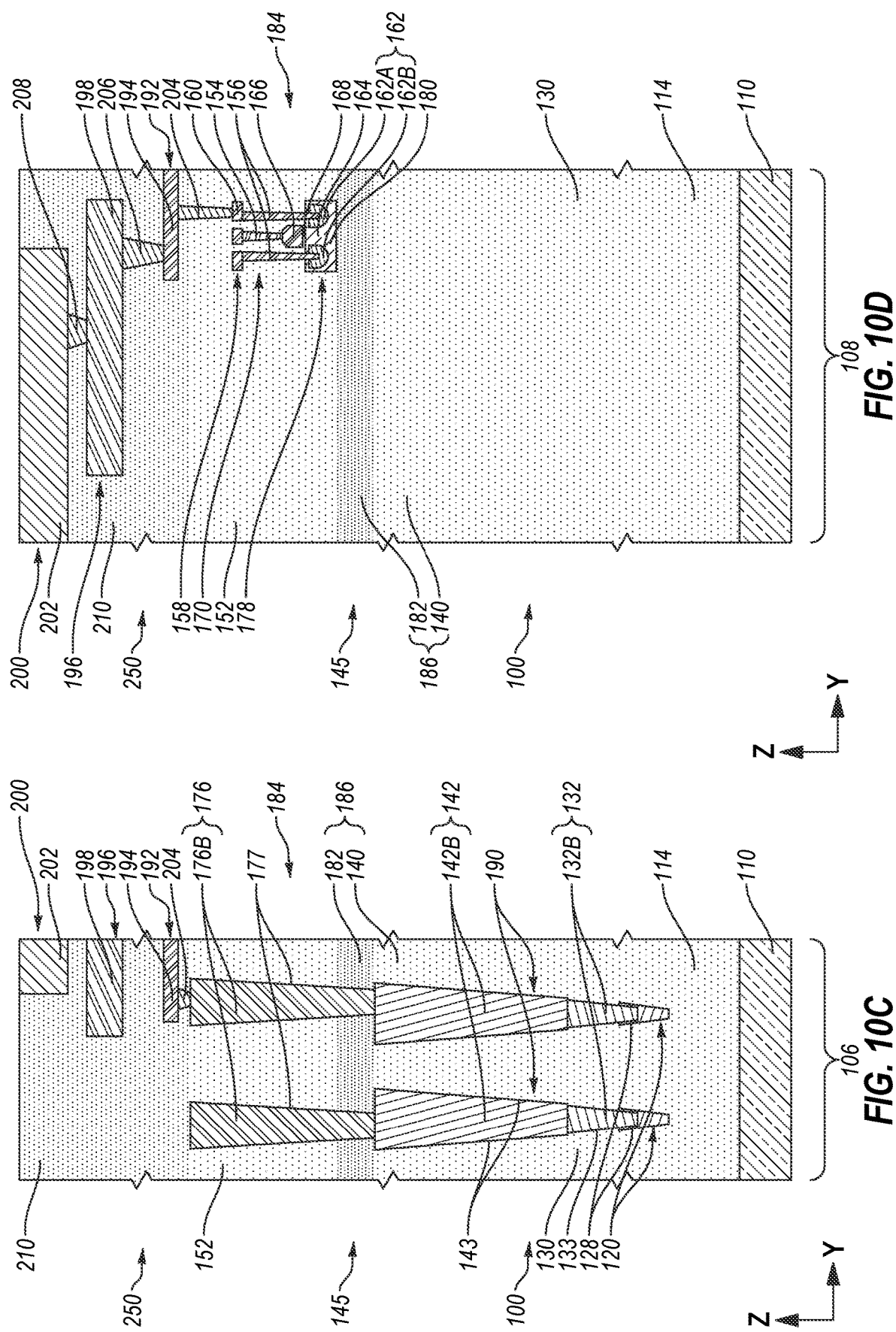

MICROELECTRONIC DEVICES INCLUDING CONTACT STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices including contact structures, and to related memory devices, electronic systems, and method.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory devices including, but not limited to, volatile memory devices. One type of volatile memory device is a dynamic random access memory (DRAM) device. A DRAM device may include a memory array including DRAM cells arranged in rows extending in a first horizontal direction and columns extending in a second horizontal direction. In one design configuration, an individual DRAM cell includes an access device (e.g., a transistor) and a storage node device (e.g., a capacitor) electrically connected to the access device. The DRAM cells of a DRAM device are electrically accessible through digit lines and word lines arranged along the rows and columns of the memory array and in electrical communication with control logic devices within a base control logic structure of the DRAM device.

Control logic devices within a base control logic structure underlying a memory array of a DRAM device have been used to control operations on the DRAM cells of the DRAM device. Control logic devices of the base control logic structure can be provided in electrical communication with digit lines and word lines coupled to the DRAM cells by way of routing and contact structures. Unfortunately, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of a memory device, and/or improvements in the performance (e.g., faster memory cell ON/OFF speed, lower threshold switching voltage requirements, faster data transfer rates, lower power consumption) of the DRAM device.

BRIEF DESCRIPTION OF THE DRAWINGS

FIG. 2A through FIG. 2D are simplified, partial longitudinal cross-sectional views of an array region (FIG. 2A), a digit line exit region (FIG. 2B), a word line exit region (FIG. 2C), and a socket region (FIG. 2D) of the microelectronic device structure shown in FIG. 1 at the processing stage of FIG. 1;

FIG. 3A through FIG. 3D are simplified, partial longitudinal cross-sectional views of the array region (FIG. 3A), the digit line exit region (FIG. 3B), the word line exit region (FIG. 3C), and the socket region (FIG. 3D) shown in FIG. 2A through FIG. 2D, respectively, at another processing stage of the method of forming the microelectronic device following the processing stage of FIG. 2A through FIG. 2D;

FIG. 4A through FIG. 4D are simplified, partial longitudinal cross-sectional views of the array region (FIG. 4A), the digit line exit region (FIG. 4B), the word line exit region (FIG. 4C), and the socket region (FIG. 4D) shown in FIG. 3A through FIG. 3D, respectively, at another processing stage of the method of forming the microelectronic device following the processing stage of FIG. 3A through FIG. 3D;

FIG. 5A through FIG. 5D are simplified, partial longitudinal cross-sectional views of the array region (FIG. 5A), the digit line exit region (FIG. 5B), the word line exit region (FIG. 5C), and the socket region (FIG. 5D) shown in FIG. 4A through FIG. 4D, respectively, at another processing stage of the method of forming the microelectronic device following the processing stage of FIG. 4A through FIG. 4D;

FIG. 6A through FIG. 6D are simplified, partial longitudinal cross-sectional views of an array region (FIG. 6A), a digit line exit region (FIG. 6B), a word line exit region (FIG. 6C), and a socket region (FIG. 6D) of a second microelectronic device structure at another processing stage of the method of forming the microelectronic device;

FIG. 7A through FIG. 7D are simplified, partial longitudinal cross-sectional views of the array region (FIG. 7A), the digit line exit region (FIG. 7B), the word line exit region (FIG. 7C), and the socket region (FIG. 7D) shown in FIG. 6A through FIG. 6D, respectively, at another processing stage of the method of forming the microelectronic device following the processing stage of FIG. 6A through FIG. 6D;

FIG. 8A through FIG. 8D are simplified, partial longitudinal cross-sectional views of the array region (FIG. 8A), the digit line exit region (FIG. 8B), the word line exit region (FIG. 8C), and the socket region (FIG. 8D) shown in FIG. 5A through FIG. 5D, respectively, at another processing stage of the method of forming the microelectronic device following the processing stage of FIG. 5A through FIG. 5D and the processing stage of FIG. 7A through FIG. 7D;

FIG. 9A through FIG. 9D are simplified, partial longitudinal cross-sectional views of the array region (FIG. 9A), the digit line exit region (FIG. 9B), the word line exit region (FIG. 9C), and the socket region (FIG. 9D), respectively, at another processing stage of the method of forming the microelectronic device following the processing stage of FIG. 8A through FIG. 8D;

FIG. 10A through FIG. 10D are simplified, partial longitudinal cross-sectional views of the array region (FIG. 10A), the digit line exit region (FIG. 10B), the word line exit region (FIG. 10C), and the socket region (FIG. 10D), respectively, at another processing stage of the method of forming the microelectronic device following the processing stage of FIG. 9A through FIG. 9D;

DETAILED DESCRIPTION

Figure 1:
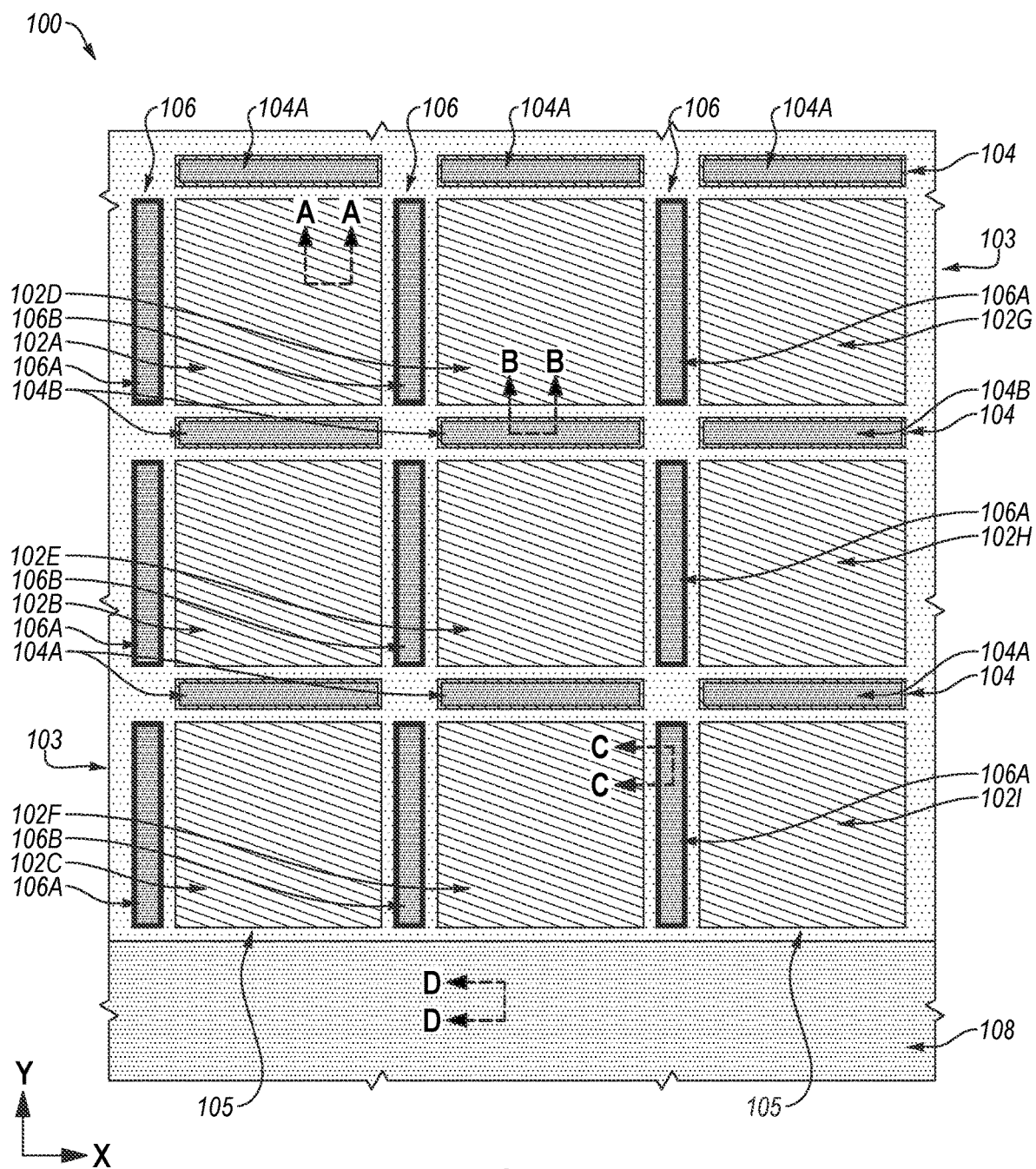
FIG. 1 is a simplified plan views of a microelectronic device structure at a processing stage of a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiOxN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiOxN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

According to embodiments described herein, a microelectronic device comprises a first microelectronic device structure attached to a second microelectronic device structure. The first microelectronic device structure comprises an array region comprising memory arrays, each comprising memory cells. The second microelectronic device structure comprises control logic devices vertically overlying the memory cells of the memory arrays and includes devices for effectuating one or more control operations of the memory cells. A socket region is horizontally offset from the array region and the control logic devices and includes additional control logic devices and structures for coupling one or more components of the microelectronic device to back end of line (BEOL) structures. The memory cells of the first microelectronic device structure comprise access devices and storage node devices. The access devices are coupled to word lines extending in a first horizontal direction and to digit lines extending in a second horizontal direction. The digit lines extend to digit line exit regions located beyond peripheral edges of the array region and the word lines extend to word line exit regions located beyond peripheral edges of the array region.

Within the digit line exit region, the digit lines are individually contacted by contact structures for providing electrical connection thereto and, for example, control logic circuitry (e.g., drive circuitry), a power source, or another structure. The contact structures in the digit line exit region comprise tapered sidewalls such that the contact structures maintain a desired relatively smaller pitch at portions in contact with the digit lines and a relatively larger pitch at portions that form contacts to conductive structures within the second microelectronic device structure during or after attachment of the second microelectronic device structure to the first microelectronic device structure. The relatively smaller pitch facilitates forming the digit lines to have a desired smaller (e.g., tighter) pitch without undesirably electrically shorted neighboring digit lines with the contact structures and the relatively larger pitch facilitates forming a large enough landing area for forming the contacts to the conductive structures of the second microelectronic device structure and to compensate for misalignment and misregistration errors during attachment of the second microelectronic device structure to the first microelectronic device structure. In addition, in some embodiments, the contact structures are coupled to the digit lines in a staggered pattern to facilitate forming the contact structures are a larger pitch than the digit lines.

Within the word line exit region, the word lines are individually contacted by additional contact structures for providing electrical connection thereto and, for example, control logic circuitry (e.g., drive circuitry), a power source, or another structure. The additional contact structures in the word line exit region comprise tapered sidewalls such that the additional contact structures maintain a desired relatively smaller pitch at portions in contact with the word lines and a relatively larger pitch at portions that form contacts to conductive structures within the second microelectronic device structure during or after attachment of the second microelectronic device structure to the first microelectronic device structure. The relatively smaller pitch facilitates forming the word lines to have a desired smaller (e.g., tighter) pitch without undesirably electrically shorted neighboring word lines with the additional contact structures and the relatively larger pitch facilitates forming a large enough landing area for forming the contacts to the conductive structures of the second microelectronic device structure and to compensate for misalignment and misregistration errors during attachment of the second microelectronic device structure to the first microelectronic device structure. In addition, in some embodiments, the additional contact structures are coupled to the word lines in a staggered pattern to facilitate forming the contact structures are a larger pitch than the word lines.

FIG. 1 through FIG. 12B are various views (described in further detail below) illustrating different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used for forming various devices and electronic systems. In other words, the methods of the disclosure may be used whenever it is desired to form a microelectronic device. With the description provided below, it will be readily apparent to one of ordinary skill in the art that the methods and structures described herein may be used to form various devices and electronic systems.

FIG. 1 is a simplified plan view of a first microelectronic device structure 100 (e.g., a first wafer) at an early processing stage of a method of forming a microelectronic device (e.g., a memory device, such as a DRAM device), in accordance with embodiments of the disclosure. As shown in FIG. 1, the first microelectronic device structure 100 may be formed to include array regions 102A-102I (collectively referred to as array regions 102), digit line exit regions 104 (also referred to as "digit line contact socket regions") interposed between pairs of the array regions 102 horizontally neighboring one another in a first horizontal direction (e.g., the Y-direction), word line exit regions 106 (also referred to as "word line contact socket regions") interposed between additional pairs of the array regions 102 horizontally neighboring one another in a second horizontal direction (e.g., the X-direction) orthogonal to the first horizontal direction, and one or more socket regions 108 (also referred to as "back end of line (BEOL) contact socket regions") horizontally neighboring some of the array regions 102 in one or more of the first horizontal direction and the second horizontal direction. The array regions 102, the digit line exit regions 104, the word line exit regions 106, and the socket regions 108 are each described in further detail below.

The array regions 102 of the first microelectronic device structure 100 may comprise horizontal areas of the first microelectronic device structure 100 configured and positioned to have arrays of memory cells (e.g., arrays of DRAM cells) subsequently formed within horizontal boundaries thereof, as described in further detail below. In addition, the array regions 102 may also be configured and positioned to have desirable arrangements of control logic devices subsequently formed within horizontal boundaries thereof, as also described in further detail below. The control logic devices to be formed within the horizontal boundaries of the array regions 102 may be formed to be vertically offset (e.g., in the Z-direction) from the memory cells to be formed within the horizontal boundaries of the array regions 102.

The first microelectronic device structure 100 may be formed to include a desired quantity of the array regions 102. For clarity and ease of understanding of the drawings and related description, FIG. 1 depicts the first microelectronic device structure 100 as being formed to include nine (9) array regions 102: a first array region 102A, a second array region 102B, a third array region 102C, a fourth array region 102D, a fifth array region 102E, a sixth array region 102F, a seventh array region 102G, an eighth array region 102H, and a ninth array region 102I. As shown in FIG. 1, the first array region 102A may horizontally neighbor the fourth array region 102D in the X-direction, and may horizontally neighbor the second array region 102B in the Y-direction; the second array region 102B may horizontally neighbor the first array region 102A and the third array region 102C in the Y-direction, and may horizontally neighbor the fifth array region 102E in the X-direction; the third array region 102C may horizontally neighbor the sixth array region 102F in the X-direction, and may horizontally neighbor the second array region 102B in the Y-direction; the fourth array region 102D may horizontally neighbor the first array region 102A and the seventh array region 102G in the X-direction, and may horizontally neighbor the fifth array region 102E in the Y-direction; the fifth array region 102E may horizontally neighbor the second array region 102B and the eighth array region 102H in the X-direction, and may horizontally neighbor the fourth array region 102D and the sixth array region 102F in the Y-direction; the sixth array region 102F may horizontally neighbor the third array region 102C and the ninth array region 102I in the X-direction, and may horizontally neighbor the fifth array region 102E in the Y-direction; the seventh array region 102G may horizontally neighbor the fourth array region 102D in the X-direction, and may horizontally neighbor the eighth array region 102H in the Y-direction; the eighth array region 102H may horizontally neighbor the fifth array region 102E in the X-direction, and may horizontally neighbor the seventh array region 102G and the ninth array region 102I in the Y-direction; and the ninth array region 102I may horizontally neighbor the sixth array region 102F in the X-direction, and may horizontally neighbor the eighth array region 102H in the Y-direction. In additional embodiments, the first microelectronic device structure 100 is formed to include a different number of array regions 102. For example, the first microelectronic device structure 100 may be formed to include greater than nine (9) array regions 102, such as greater than or equal to sixteen (16) array regions 102, greater than or equal to thirty-two (32) array regions 102, greater than or equal to sixty-four (64) array regions 102, greater than or equal to one hundred twenty eight (128) array regions 102, greater than or equal to two hundred fifty six (256) array regions 102, greater than or equal to five hundred twelve (512) array regions 102, or greater than or equal to one thousand twenty-four (1024) array regions 102.

In addition, the first microelectronic device structure 100 may be formed to include a desired distribution of the array regions 102. As shown in FIG. 1, in some embodiments, the first microelectronic device structure 100 is formed to include rows 103 of the array regions 102 extending in the X-direction, and columns 105 of the array regions 102 extending in the Y-direction. The rows 103 of the array regions 102 may, for example, include a first row 103 including the first array region 102A, the fourth array region 102D, and the seventh array region 102G; a second row 103 including the second array region 102B, the fifth array region 102E, and the eighth array region 102H; and a third row 103 including the third array region 102C, the sixth array region 102F, and the ninth array region 102I. The columns 105 of the array regions 102 may, for example, include a first column 105 including the first array region 102A, the second array region 102B, and the third array region 102C; a second column 105 including the fourth array region 102D, the fifth array region 102E, and the sixth array region 102F; and a third column 105 including the seventh array region 102G, the eighth array region 102H, and the ninth array region 102I.

With continued reference to FIG. 1, the digit line exit regions 104 of the first microelectronic device structure 100 may comprise horizontal areas of the first microelectronic device structure 100 configured and positioned to have at least some subsequently formed digit lines (e.g., bit lines, data lines) horizontally terminate therein. For an individual digit line exit region 104, at least some subsequently formed digit lines operatively associated with the array regions 102 flanking (e.g., at opposing boundaries in the Y-direction) the digit line exit region 104 may have ends within the horizontal boundaries of the digit line exit region 104. In addition, the digit line exit regions 104 may also be configured and positioned to include contact structures and routing structures with the horizontal boundaries thereof that are operatively associated with at least some of the subsequently formed digit lines. As described in further detail below, some of the contact structures to be formed within the digit line exit regions 104 may couple the subsequently formed digit lines to control logic circuitry of control logic devices (e.g., sense amplifier (SA) devices) to subsequently be formed within the array regions 102. As shown in FIG. 1, in some embodiments, the digit line exit regions 104 horizontally extend in the X-direction, and are horizontally interposed between horizontally neighboring (e.g., in the Y-direction) rows 103 of the array regions 102 in the Y-direction. The digit line exit regions 104 may, for example, horizontally alternate (e.g., in the Y-direction) with the rows 103 of the array regions 102 in the Y-direction. In other words, a digit line exit region 104 may horizontally intervene (e.g., in the Y-direction) between horizontally neighboring (e.g., in the Y-direction) array region 102 within the same column 105 of array regions 102.

The digit line exit regions 104 may be divided into multiple groups of digit line exit regions 104 including first digit line exit subregions 104A and second digit line exit subregions 104B. In some embodiments, the first digit line exit subregions 104A horizontally alternate with the second digit line exit subregions 104B in the Y-direction. In some embodiments, horizontally neighboring (e.g., in the X-direction) digit line exit regions 104 are substantially the same (e.g., comprise one of the first digit line exit subregions 104A or the second digit line exit subregions 104B). In other words, the digit line exit regions 104 horizontally between (e.g., in the Y-direction) horizontally neighboring (e.g., in the Y-direction) rows 103 of the array regions 102 may include one of the first digit line exit subregions 104A or the second digit line exit subregions 104B. The digit line exit regions 104 horizontally between (e.g., in the Y-direction) another pair of horizontally neighboring (e.g., in the Y-direction) rows 103 of the array region 102 may include the other of the first digit line exit subregions 104A or the second digit line exit subregions 104B. In some embodiments, the digit line exit regions 104 horizontally aligned with each other (e.g., in the Y-direction) may include the same of the first digit line exit subregions 104A or the second digit line exit subregions 104B. Digit line exit regions 104 horizontally aligned with each other (e.g., in the X-direction) and located with the same column 105 of the array regions 102 may comprise alternating ones of the first digit line exit subregions 104A and the second digit line exit subregions 104B. In some embodiments, each of the array regions 102 individually includes one of the first digit line exit subregions 104A horizontally neighboring (e.g., in the Y-direction) the array region 102 on a first side thereof and one of the second digit line exit subregions 104B horizontally neighboring (e.g., in the Y-direction) the array region 102 on a second, opposite side thereof.

As described in further detail below, an individual first digit line exit subregion 104A may be configured and positioned to facilitate electrical connections between a group of digit lines (e.g., odd digit lines or even digit lines) and a group of control logic devices (e.g., SA devices) operatively associated with one (1) array region 102 (e.g., the second array region 102B) of a pair of horizontally neighboring (e.g., in the Y-direction) array regions 102, and to also facilitate electrical connections between a group of additional digit lines (e.g., additional odd digit lines or additional even digit lines) and a group of additional control logic devices (e.g., additional SA devices) operatively associated with an additional array region 102 (e.g., the third array region 102C) of the pair of the horizontally neighboring array regions 102. In addition, as also described in further detail below, an individual second digit line exit subregion 104B may be configured and positioned to facilitate electrical connections between a group of further digit lines and a group of further control logic devices operatively associated with another array region 102 (e.g., the first array region 102A), and to also facilitate electrical connections between a group of yet further digit lines and a group of yet further control logic devices operatively associated with the array region 102 (e.g., the second array region 102B).

Still referring to FIG. 1, the word line exit regions 106 of the first microelectronic device structure 100 may comprise horizontal areas of the first microelectronic device structure 100 configured and positioned to have at least some subsequently formed word lines (e.g., access lines) horizontally terminate therein. For an individual word line exit region 106, at least some subsequently formed word lines operatively associated with the array regions 102 flanking (e.g., at opposing boundaries in the X-direction) the word line exit region 106 may have ends within the horizontal boundaries of the word line exit region 106. In addition, the word line exit regions 106 may also be configured and positioned to include contact structures and routing structures within the horizontal boundaries thereof that are operatively associated with the subsequently formed word lines. As described in further detail below, some of the contact structures to be formed within the word line exit regions 106 may couple the subsequently formed word lines to control logic circuitry of additional control logic devices (e.g., sub-word line driver (SWD) devices) to subsequently be formed within the array regions 102. As shown in FIG. 1, in some embodiments, the word line exit regions 106 horizontally extend in the Y-direction, and are horizontally interposed between horizontally neighboring columns 105 of the array regions 102 in the X-direction. The word line exit regions 106 may, for example, horizontally alternate with the columns 105 of the array regions 102 in the X-direction.

The word line exit regions 106 may be divided into multiple groups of word line exit regions 106 including first word line exit subregions 106A and second word line exit subregions 106B. In some embodiments, the first word line exit subregions 106A horizontally alternate with the second word line exit subregions 106B in the X-direction. In some embodiments, horizontally neighboring (e.g., in the Y-direction) word line exit regions 106 are substantially the same (e.g., include one of the first word line exit subregions 106A or the second word line exit subregions 106B). In other words, the word line exit regions 106 horizontally between (e.g., in the X-direction) horizontally neighboring (e.g., in the Y-direction) columns 105 of the array regions 102 may include one of the first word line exit subregions 106A or the second word line exit subregions 106B. The word line exit regions 106 horizontally between (e.g., in the X-direction) another pair of horizontally neighboring (e.g., in the X-direction) of the columns 105 of the array region 102 may include the other of the first word line exit subregions 106A or the second word line exit subregions 106B. In some embodiments, the word line exit regions 106 horizontally aligned with each other (e.g., in the X-direction) may include the same of the first word line exit subregions 106A or the second word line exit subregions 106B. Word line exit regions 106 horizontally aligned with each other (e.g., in the Y-direction) and located with the same row 103 of the array regions 102 may comprise alternating ones of the first word line exit subregions 106A and the second word line exit subregions 106B. In some embodiments, each of the array regions 102 individually includes one of the first word line exit subregions 106A horizontally neighboring (e.g., in the X-direction) the array region 102 on a first side thereof and one of the second word line exit subregions 106B horizontally neighboring (e.g., in the Y-direction) the array region 102 on a second, opposite side thereof. Accordingly, in some embodiments, an individual array region 102 may be horizontally neighbored (e.g., in the X-direction) by one of the first word line exit subregions 106A and one of the second word line exit subregions 106B and horizontally neighbored (e.g., in the Y-direction) by one of the first digit line exit subregions 104A and one of the second digit line exit subregions 104B.

As described in further detail below, an individual first word line exit subregion 106A may be configured and positioned to facilitate electrical connections between a group of word lines (e.g., odd word lines or even word lines) and a group of control logic devices (SWD devices) operatively associated with one (1) array region 102 (e.g., the fourth array region 102D) of a pair of horizontally neighboring (e.g., in the X-direction) array regions 102, and to also facilitate electrical connections between a group of additional word lines (e.g., additional odd word lines or additional even word lines) and a group of additional control logic devices (e.g., additional SWD devices) operatively associated with a further array region 102 (e.g., the seventh array region 102G) of the pair of horizontally neighboring array regions 102. In addition, as also described in further detail below, an individual second word line exit subregion 106B may be configured and positioned to facilitate electrical connections between a group of further word lines and a group of further control logic devices operatively associated with the one (1) array region 102 (e.g., the fourth array region 102D), and to also facilitate electrical connections between a group of yet further word lines and a group of yet further control logic devices operatively associated with a further array region 102 (e.g., the first array region 102A).

With continued reference to FIG. 1, the socket regions 108 of the first microelectronic device structure 100 may comprise horizontal areas of the first microelectronic device structure 100 configured and positioned to facilitate electrical connections (e.g., by way of contact structures and routing structures formed within horizontal boundaries thereof) between subsequently formed control logic circuitry and additional subsequently formed structures (e.g., BEOL structures), as described in further detail below. The socket regions 108 may horizontally neighbor one or more peripheral horizontal boundaries (e.g., in the Y-direction, in the X-direction) of one or more groups of the array regions 102. For clarity and ease of understanding of the drawings and related description, FIG. 1 depicts the first microelectronic device structure 100 as being formed to include one (1) socket region 108 horizontally neighboring a shared horizontal boundary of the third array region 102C, the sixth array region 102F, and the ninth array region 102I. However, the first microelectronic device structure 100 may be formed to include one or more of a different quantity and a different horizontal position of socket region(s) 108. As a non-limiting example, the socket region 108 may horizontally neighbor a shared horizontal boundary of a different group of the array regions 102 (e.g., a shared horizontal boundary of the seventh array region 102G, the eighth array region 102H, and the ninth array region 102I; a shared horizontal boundary of the first array region 102A, the fourth array region 102D, and the seventh array region 102G; a shared horizontal boundary of the first array region 102A, the second array region 102B, and the third array region 102C). As another non-limiting example, the first microelectronic device structure 100 may be formed to include multiple (e.g., a plurality of, more than one) socket regions 108 horizontally neighboring different groups of the array regions 102 than one another. In some embodiments, multiple socket regions 108 collectively substantially horizontally surround (e.g., substantially horizontally circumscribe) the array regions 102.

FIG. 2A through FIG. 2D illustrate simplified, partial longitudinal cross-sectional views of different regions of the first microelectronic device structure 100 previously described with reference to FIG. 1. FIG. 2A illustrates a simplified, partial longitudinal cross-sectional view from the perspective of the Y-direction (so as to depict an XZ-plane) of one of the array regions 102 (e.g., the first array region 102A) of the first microelectronic device structure 100 taken through section line A-A of FIG. 1. FIG. 2B illustrates a simplified, partial longitudinal cross-sectional view from the perspective of the Y-direction (so as to depict an XZ-plane) of one of the digit line exit regions 104 of the first microelectronic device structure 100 taken through section line B-B of FIG. 1. FIG. 2C illustrates a simplified, partial longitudinal cross-sectional view from the perspective of the X-direction (so as to depict an YZ-plane) of one of the word line exit regions 106 of the first microelectronic device structure 100 taken through section line C-C of FIG. 1. FIG. 2D illustrates a simplified, partial longitudinal cross-sectional view from the perspective of the X-direction (so as to depict an YZ-plane) of one of socket regions 108 of the first microelectronic device structure 100 taken through section line D-D of FIG. 1.

Referring collectively to FIG. 2A through FIG. 2D, the first microelectronic device structure 100 may be formed to include a first base semiconductor structure 110, filled trenches 112, and a first isolation material 114. The filled trenches 112 vertically extend (e.g., in the Z-direction) into the first base semiconductor structure 110. The first isolation material 114 covers and surrounds surfaces of the first base semiconductor structure 110.

The first base semiconductor structure 110 comprises a base material or construction upon which additional features (e.g., materials, structures, devices) of the first microelectronic device structure 100 are formed. The first base semiconductor structure 110 may comprise a semiconductor structure (e.g., a semiconductor wafer), or a base semiconductor material on a supporting structure. For example, the first base semiconductor structure 110 may comprise a conventional silicon substrate (e.g., a conventional silicon wafer), or another bulk substrate comprising a semiconductor material. In some embodiments, the first base semiconductor structure 110 comprises a silicon wafer. The first base semiconductor structure 110 may include one or more layers, structures, and/or regions formed therein and/or thereon.

The filled trenches 112 may comprise trenches (e.g., openings, vias, apertures) within the first base semiconductor structure 110 that are at least partially (e.g., substantially) filled with the first isolation material 114. The filled trenches 112 may, for example, be employed as shallow trench isolation (STI) structures within the first base semiconductor structure 110. The filled trenches 112 may be formed to vertically extend partially (e.g., less than completely) through the first base semiconductor structure 110. Each of the filled trenches 112 may be formed to exhibit substantially the same dimensions and shape as each other of the filled trenches 112, or at least one of the filled trenches 112 may be formed to exhibit one or more of different dimensions and a different shape than at least one other of the filled trenches 112. As a non-limiting example, each of the filled trenches 112 may be formed to exhibit substantially the same vertical dimension(s) and substantially the same vertical cross-sectional shape(s) as each other of the filled trenches 112; or at least one of the filled trenches 112 may be formed to exhibit one or more of different vertical dimension(s) and different vertical cross-sectional shape(s) than at least one other of the filled trenches 112. In some embodiments, the filled trenches 112 are all formed to vertically extend to and terminate at substantially the same depth within the first base semiconductor structure 110. In additional embodiments, at least one of the filled trenches 112 is formed to vertically extend to and terminate at a relatively deeper depth within the first base semiconductor structure 110 than at least one other of the filled trenches 112. As another non-limiting example, each of the filled trenches 112 may be formed to exhibit substantially the same horizontal dimension(s) and substantially the same horizontal cross-sectional shape(s) as each other of the filled trenches 112; or at least one of the filled trenches 112 may be formed to exhibit one or more of different horizontal dimension(s) (e.g., relatively larger horizontal dimension(s), relatively smaller horizontal dimension(s)) and different horizontal cross-sectional shape(s) than at least one other of the filled trenches 112. In some embodiments, at least one of the filled trenches 112 is formed to have one or more different horizontal dimensions (e.g., in the X-direction and/or in the Y-direction) than at least one other of the filled trenches 112.

The first isolation material 114 may be formed of and include at least one insulative material. By way of non-limiting example, the first isolation material 114 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$), at least one dielectric nitride material (e.g., $SiN_y$), at least one dielectric oxynitride material (e.g., $SiOxN_y$), at least one dielectric carboxynitride material (e.g., $SiO_xC_zN_y$), and amorphous carbon. In some embodiments, the first isolation material 114 is formed of and includes $SiO_x$ (e.g., $SiO_2$). The first isolation material 114 may be substantially homogeneous, or the first isolation material 114 may be heterogeneous. In some embodiments, the first isolation material 114 is substantially homogeneous. In additional embodiments, the first isolation material 114 is heterogeneous. The first isolation material 114 may, for example, be formed of and include a stack of at least two different dielectric materials.

Figure 3B:
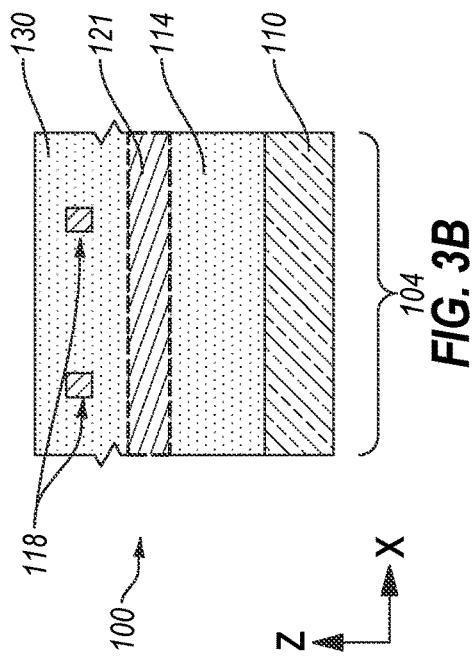
Figure 3A:
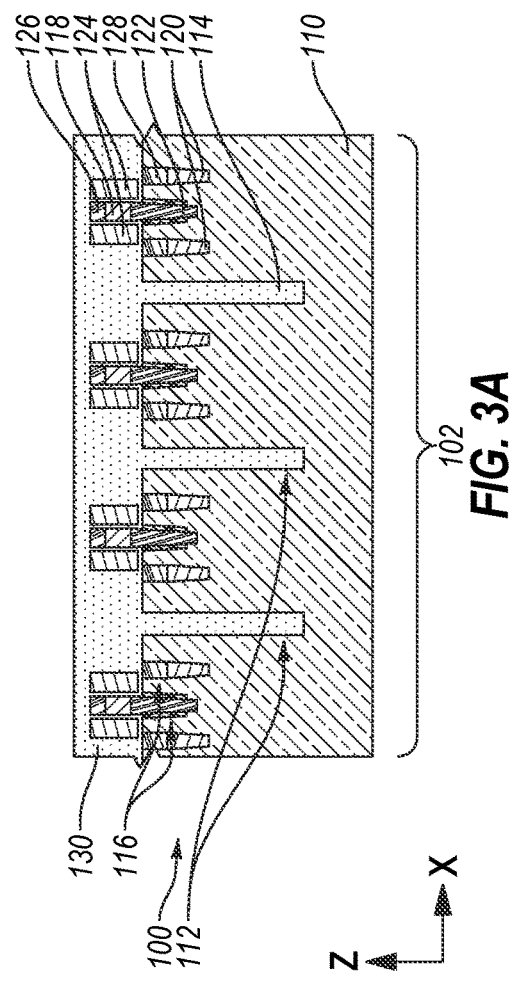

Referring next to FIG. 3A through FIG. 3D, illustrated are simplified, partial longitudinal cross-sectional views, from the directional perspectives previously described, of the array region 102 (FIG. 3A), the digit line exit region 104 (FIG. 3B), the word line exit region 106 (FIG. 3C), and the socket region 108 (FIG. 3D) at a processing stage of the method of forming the microelectronic device following the processing stage previously described with reference to FIG. 1 and FIG. 2A through FIG. 2D. As collectively depicted in FIG. 3A through FIG. 3D, access devices 116 (FIG. 3A) (e.g., access transistors) may be formed within the array region 102 (FIG. 3A). In addition, digit lines 118 (FIG. 3A and FIG. 3B) (e.g., data lines, bit lines) may be formed to be coupled to the access devices 116 (FIG. 3A) and to horizontally extend in the Y-direction through the array region 102 (FIG. 3A). At least some of the digit lines 118 (FIG. 3A and FIG. 3B) may terminate (e.g., end) within the digit line exit region 104 (FIG. 3B). Furthermore, word lines 120 (e.g., access lines) may be formed to be coupled to the access devices 116 (FIG. 3A) and to horizontally extend in the X-direction through the array region 102 (FIG. 3A). At least some of the word lines 120 (FIG. 3A and FIG. 3C) may terminate within the word line exit region 106 (FIG. 3C).

Referring to FIG. 3A, the access devices 116 formed within the array region 102 may be employed as components of memory cells (e.g., DRAM cells) to be formed within the array region 102. By way of non-limiting example, each access device 116 may individually be formed to include a channel region comprising a portion of the first base semiconductor structure 110; a source region and a drain region each individually comprising one or more of at least one conductively doped portion of the first base semiconductor structure 110 and/or at least one conductive structure formed in, on, or over the first base semiconductor structure 110; and at least one gate structure comprising a portion of at least one of the word lines 120. Each access device 116 may also include a gate dielectric material (e.g., a dielectric oxide material) formed to be interposed between the channel region thereof and the gate structure thereof.

The digit lines 118 may exhibit horizontally elongate shapes extending in parallel in the Y-direction; and the word lines 120 may exhibit horizontally elongate shapes extending in parallel in the X-direction orthogonal to the Y-direction. As used herein, the term "parallel" means substantially parallel. The digit lines 118 and the word lines 120 may each individually be formed of and include conductive material. By way of non-limiting example, the digit lines 118 and the word lines 120 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the digit lines 118 and the word lines 120 are each individually formed of and include one or more of W, Ru, Mo, and titanium nitride ($TiN_y$). Each of the digit lines 118 and each of the word lines 120 may individually be substantially homogeneous, or one or more of the digit lines 118 and/or one or more of the word lines 120 may individually be substantially heterogeneous. In some embodiments, each of the digit lines 118 and each of the word lines 120 are formed to be substantially homogeneous.

Still referring to FIG. 3A, within the array region 102, additional features (e.g., structures, materials) are also formed on, over, and/or between the access devices 116, the digit lines 118, and the word lines 120. For example, as shown in FIG. 3A, first contact structures 122 (e.g., digit line contact structures, also referred to as so-called "bitcon" structures) may be formed to vertically extend between and couple the access devices 116 to the digit lines 118; second contact structures 124 (e.g., cell contact structures, also referred to as so-called "cellcon" structures) may be formed in contact with the access devices 116 and may configured and positioned to couple the access devices 116 to subsequently formed storage node devices (e.g., capacitors); dielectric cap structures 126 may be formed on or over the digit lines 118; and additional dielectric cap structures 128 may be formed on or over the word lines 120. In addition, dielectric structures (e.g., dielectric spacers, such as low-k dielectric spacers formed of and including one or more low-k dielectric materials) may be formed to intervene (e.g., horizontally intervene) between and isolate the second contact structures 124 and digit lines 118; and further dielectric structures (e.g., gate dielectric structures, such as gate dielectric oxide structures) may be formed to intervene (e.g., horizontally intervene) between and isolate the first contact structures 122 and the word lines 120.

The first contact structures 122 and the second contact structures 124 may individually be formed of and include at least one conductive material. In some embodiments, the first contact structures 122 and the second contact structures 124 are individually formed of and include one or more of at least one metal (e.g., W), at least one alloy, at least one conductive metal silicide (e.g., one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$)), and at least one conductive metal nitride (e.g., one or more of $TiN_y$, tungsten nitride ($WN_y$), tantalum nitride ($TaN_y$), cobalt nitride ($CoN_y$), molybdenum nitride ($MoN_y$), and nickel nitride ($NiN_y$)). In addition, the dielectric cap structures 126 and the additional dielectric cap structures 128 may individually be formed of and include at least one insulative material. In some embodiments, the dielectric cap structures 126 and the additional dielectric cap structures 128 are individually formed of and include a dielectric nitride material (e.g., $SiN_y$, such as $Si_3N_4$).

Referring to FIG. 3B, within the digit line exit region 104, at least some of the digit lines 118 may horizontally terminate (e.g., end) in the Y-direction. Each of the digit lines 118 horizontally extending through the array region 102 (FIG. 3A) and horizontally terminating within the digit line exit region 104 may be formed to terminate at substantially the same horizontal position in the Y-direction; or at least one of the digit lines 118 horizontally terminating within the digit line exit region 104 may be formed to terminate at a different horizontal position in the Y-direction within the digit line exit region 104 than at least one other of the digit lines 118 horizontally terminating within the digit line exit region 104. In some embodiments, at least some digit lines 118 horizontally neighboring one another in the X-direction have terminal ends (e.g., terminal surfaces) horizontally offset from one another in the Y-direction. Horizontally offsetting the terminal ends of some of the digit lines 118 from the terminal ends of some other of the digit lines 118 within the digit line exit region 104 may, for example, promote or facilitate desirable contact structure arrangements within the digit line exit region 104. As described in further detail below, in some embodiments, the terminal ends of the digit lines 118 may be arranged in a staggered pattern in the digit line exit region 104 to facilitate formation of larger contacts (e.g., deep contact structures) to the digit lines 118 at the digit line exit region 104 for forming electrical connections between the first microelectronic device structure 100 and a second microelectronic device structure at the digit line exit region 104. The larger contacts may facilitate attaching the first microelectronic device structure to the second microelectronic device structure such that features of the first microelectronic device structure are substantially aligned with and electrically connected with features of the second microelectronic device structure despite potential limitations in alignment and registration of the second microelectronic device structure and the first microelectronic device structure during attachment thereof.

As shown in FIG. 3B, within the digit line exit region 104, dummy word lines 121 may, optionally, be formed vertically below the digit lines 118. If formed, the dummy word lines 121 may be formed at substantially the same vertical position (e.g., vertical elevation) within the first microelectronic device structure 100 (e.g., within the first base semiconductor structure 110 thereof) as the word lines 120 (FIGS. 3A and 3C), and may be formed to horizontally extend orthogonal to the digit lines 118 (e.g., in the X-direction). A material composition of the dummy word lines 121 may be substantially the same as a material composition of the word lines 120 (FIGS. 3A and 3C). If formed, the dummy word lines 121 may be electrically isolated from one another and other components (e.g., the word lines 120 (FIGS. 3A and 3C), the digit lines 118) of the first microelectronic device structure 100. The dummy word lines 121 (if any) within the digit line exit region 104 may not be employed as part of data paths during use and operation of a microelectronic device formed through the methods of the disclosure. In additional embodiments, the dummy word lines 121 are absent (e.g., omitted) from the digit line exit region 104.

Referring next to FIG. 3C, within the word line exit region 106, at least some of the word lines 120 may horizontally terminate (e.g., end) in the X-direction. Each of the word lines 120 horizontally extending through the array region 102 (FIG. 3A) and horizontally terminating within the word line exit region 106 may be formed to terminate at substantially the same horizontal position in the X-direction; or at least one of the word lines 120 horizontally terminating within the word line exit region 106 may be formed to terminate at a different horizontal position in the X-direction within the word line exit region 106 than at least one other of the word lines 120 horizontally terminating within the word line exit region 106. In some embodiments, at least some word lines 120 horizontally neighboring one another in the Y-direction have terminal ends (e.g., terminal surfaces) horizontally offset from one another in the X-direction. Horizontally offsetting the terminal ends of some of the word lines 120 from the terminal ends of some other of the word lines 120 within the word line exit region 106 may, for example, promote or facilitate desirable contact structure arrangements within the word line exit region 106. As described in further detail below, in some embodiments, the terminal ends of the word lines 120 may be arranged in a staggered pattern in the word line exit region 106 to facilitate formation of larger contacts (e.g., deep contact structures) to the word lines 120 at the word line exit region 106 for forming electrical connections between the first microelectronic device structure 100 and a second microelectronic device structure at the word line exit region 106. The larger contacts may facilitate attaching the first microelectronic device structure to the second microelectronic device structure such that features of the first microelectronic device structure are substantially aligned with and electrically connected with features of the second microelectronic device structure.

As shown in FIG. 3C, within the word line exit region 106, dummy digit lines 119 may, optionally, be formed vertically above the word lines 120. If formed, the dummy digit lines 119 may be formed at substantially the same vertical position (e.g., vertical elevation) within the first microelectronic device structure 100 (e.g., within the second isolation material 130 thereof) as the digit lines 118 (FIGS. 3A and 3B), and may be formed to horizontally extend orthogonal to the word lines 120 (e.g., in the Y-direction). A material composition of the dummy digit lines 119 may be substantially the same as a material composition of the digit lines 118 (FIGS. 3A and 3B). If formed, the dummy digit lines 119 may be electrically isolated from one another and the other components (e.g., the digit lines 118 (FIGS. 3A and 3B), the word lines 120) of the first microelectronic device structure 100. The dummy digit lines 119 (if any) within the word line exit region 106 may not be employed as part of data paths during use and operation of a microelectronic device formed through the methods of the disclosure. In additional embodiments, the dummy digit lines 119 are absent (e.g., omitted) from the word line exit region 106.

Referring collectively to FIG. 3A through FIG. 3D, the second isolation material 130 may be formed on or over portions of at least the first base semiconductor structure 110, the access devices 116 (FIG. 3A), the digit lines 118 (FIG. 3A and FIG. 3B), the word lines 120 (FIG. 3A and FIG. 3C), the second contact structures 124, and the first isolation material 114. The second isolation material 130 may be formed of and include at least one insulative material. A material composition of second isolation material 130 may be substantially the same as a material composition of the first isolation material 114, or the material composition of the second isolation material 130 may be different than the material composition of the first isolation material 114. In some embodiments, the second isolation material 130 is formed of and includes a dielectric oxide material, such as $SiO_x$ (e.g., $SiO_2$). The second isolation material 130 may be substantially homogeneous, or the second isolation material 130 may be heterogeneous. In some embodiments, the second isolation material 130 is substantially homogeneous. In additional embodiments, the second isolation material 130 is heterogeneous. The second isolation material 130 may, for example, be formed of and include a stack of at least two different dielectric materials.

Referring next to FIG. 4A through FIG. 4D, illustrated are simplified, partial longitudinal cross-sectional views, from the directional perspectives previously described, of the array region 102 (FIG. 4A), the digit line exit region 104 (FIG. 4B), the word line exit region 106 (FIG. 4C), and the socket region 108 (FIG. 4D) at a processing stage of the method of forming the microelectronic device following the processing stage previously described with reference to FIG. 3A through FIG. 3D. As shown in FIG. 4B and FIG. 4C, third contact structures 132 may be formed within each of the digit line exit region 104 (FIG. 4B) and the word line exit region 106 (FIG. 4C). As described in further detail below, some of the third contact structures 132 may be formed to contact to portions of the digit lines 118 (FIG. 4B) within the digit line exit region 104 (FIG. 4B), and some other of the third contact structures 132 may be formed to contact portions of the word lines 120 (FIG. 4C) within the word line exit region 106 (FIG. 4C).

Referring to FIG. 4B, within the digit line exit region 104, a first group 132A of the third contact structures 132 may be formed to contact at least some of the digit lines 118 horizontally extending (e.g., in the Y-direction) into the digit line exit region 104. Each third contact structure 132 of the first group 132A of third contact structures 132 may be considered to be a portion of a digit line contact structure (e.g., a so-called "edge of array" digit line contact structure). As shown in FIG. 4B, each third contact structure 132 of the first group 132A of third contact structures 132 may be formed to physically contact an individual digit line 118. For example, within the digit line exit region 104, each third contact structure 132 of the first group 132A may be formed to vertically extend through the second isolation material 130 and the first isolation material 114, and contact one of the digit lines 118. Accordingly, each third contact structure 132 of the first group 132A may be formed to be coupled to one of the digit lines 118.

Referring next to FIG. 4C, within the word line exit region 106, a second group 132B of the third contact structures 132 may be formed to contact at least some of the word lines 120 horizontally extending (e.g., in the X-direction) into the word line exit region 106. Each third contact structure 132 of the second group 132B of third contact structures 132 may be considered to be a portion of a word line contact structure (e.g., a so-called "edge of array" word line contact structure). As shown in FIG. 4C, each third contact structure 132 of the second group 132B of third contact structures 132 may be formed to physically contact an individual word line 120. For example, within the word line exit region 106, each third contact structure 132 of the second group 132B may be formed to vertically extend through each of the second isolation material 130 and the first isolation material 114, and to physically contact one of the word lines 120. Accordingly, each third contact structure 132 of the second group 132B may be formed to be coupled to one of the word lines 120.

Collectively referring again to FIG. 4B and FIG. 4C, the third contact structures 132, including the first group 132A (FIG. 4B) and the second group 132B (FIG. 4C), may be formed of and include conductive material. By way of non-limiting example, the third contact structures 132 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 132 are each individually formed of and include W. Each of the third contact structures 132 may be substantially homogeneous, or one or more of the third contact structures 132 may individually be heterogeneous. In some embodiments, each of the third contact structures 132 is substantially homogeneous. In additional embodiments, each of the third contact structures 132 is heterogeneous. Each third contact structure 132 may, for example, be formed of and include a stack of at least two different conductive materials.

Referring to FIG. 4B and FIG. 4C, in some embodiments, a cross-sectional shape of the third contact structures 132 in the XY plane may be substantially circular, substantially oval, substantially rectangular, or substantially square. In some embodiments, the cross-sectional shape of the third contact structures 132 is substantially oval.

In some embodiments, the third contact structures 132, including the first group 132A (FIG. 4B) and the second group 132B (FIG. 4C), may be formed to exhibit tapered sidewalls 133. With reference to FIG. 4B, an upper dimension $D_1$ of the third contact structures 132 of the first group 132A may be larger than a lower dimension $D_2$ of the third contact structures 132 in a first horizontal direction (e.g., the X-direction). In addition, the upper dimension $D_1$ of the third contact structures 132 of the first group 132A may be larger than the lower dimension $D_2$ of the third contact structures 132 in a second horizontal direction (e.g., the Y-direction).

In some embodiments, the upper dimension $D_1$ is within a range of from about 30 nanometers (nm) to about 50 nm, such as from about 30 nm to about 40 nm, or from about 40 nm to about 50 nm and the lower dimension $D_2$ is within a range of from about 20 nm to about 40 nm, such as from about 20 nm to about 30 nm, or from about 30 nm to about 40 nm.

In some embodiments, the upper dimension $D_1$ and the lower dimension $D_2$ of the third contact structures 132 of the first group 132A is larger in a first horizontal direction (e.g., in the X-direction) substantially perpendicular to a second horizontal direction (e.g., the Y-direction) in which the digit lines 118 with which the first group 132A of third contact structures 132 are in contact. In some such embodiments, the upper dimension $D_1$ and the lower dimension $D_2$ of the first group 132A of third contact structures 132 are larger in the first horizontal direction than the respective upper dimension $D_1$ and the lower dimension $D_2$ of the first group 132A of third contact structures 132 in the second horizontal direction. In some embodiments, the upper dimension $D_1$ of the first group 132A of third contact structures 132 is about 50 nm in a first horizontal direction (e.g., the X-direction) and about 30 nm in the second horizontal direction (e.g., the Y-direction) and the lower dimension $D_2$ is about 40 nm in the first horizontal direction and about 20 nm in the second horizontal direction.

In some embodiments, a ratio of $D_1:D_2$ is within a range of from about 1.5:1.0 to about 2.5:1.0, such as from about 1.5:1.0 to about 2.0:1.0, or from about 2.0:1.0 to about 2.5:1.0.

With reference to FIG. 4C, an upper dimension $D_3$ of the third contact structures 132 is larger than a lower dimension $D_4$ of the third contact structures 132 in the second horizontal direction (e.g., the Y-direction). In addition, the upper dimension $D_3$ of the third contact structures 132 of the second group 132B may be larger than the lower dimension $D_4$ of the third contact structures 132 in the first horizontal direction (e.g., the X-direction).

In some embodiments, the upper dimension $D_3$ is within a range of from about 30 nm to about 50 nm, such as from about 30 nm to about 40 nm, or from about 40 nm to about 50 nm and the lower dimension $D_4$ is within a range of from about 20 nm to about 40 nm, such as from about 20 nm to about 30 nm, or from about 30 nm to about 40 nm. In some embodiments, the upper dimension $D_3$ of the second group 132B of third contact structures 132 is substantially the same as the upper dimension $D_1$ of the first group 132A of third contact structures 132; and the lower dimension $D_4$ of the second group 132B of third contact structures 132 is substantially the same as the lower dimension $D_2$ of the first group 132A of third contact structures 132.

In some embodiments, the upper dimension $D_3$ and the lower dimension $D_4$ of the third contact structures 132 of the second group 132B is larger in the second horizontal direction (e.g., in the Y-direction) substantially perpendicular to a horizontal direction (e.g., the X-direction) in which the word lines 120 with which the second group 132B of third contact structures 132 are in contact extend. In some such embodiments, the upper dimension $D_3$ and the lower dimension $D_4$ of the second group 132B of third contact structures 132 are larger in the second horizontal direction than the respective upper dimension $D_3$ and lower dimension $D_4$ of the second group 132B of third contact structures 132 in the first horizontal direction. In some embodiments, the upper dimension $D_3$ of the second group 132B of third contact structures 132 is about 50 nm in the second horizontal direction (e.g., the Y-direction) and about 30 nm in a first horizontal direction (e.g., the X-direction) and the lower dimension $D_4$ is about 40 nm in the second horizontal direction and about 20 nm in the first horizontal direction. Thus, in some embodiments, the upper dimension $D_1$ and the lower dimension $D_2$ of the first group 132A of third contact structures 132 are larger than the respective upper dimension $D_3$ and lower dimension $D_4$ of the second group 132B of third contact structures 132 in a first horizontal direction (e.g., the X-direction) and smaller than the respective upper dimension $D_3$ and lower dimension $D_4$ of the second group 132B of third contact structures 132 in a second horizontal direction (e.g., the Y-direction).

In some embodiments, a ratio of $D_3:D_1$ is within a range of from about 1.5:1.0 to about 2.5:1.0, such as from about 1.5:1.0 to about 2.0:1.0, or from about 2.0:1.0 to about 2.5:1.0

Referring next to FIG. 5A through FIG. 5D, illustrated are simplified, partial longitudinal cross-sectional views, from the directional perspectives previously described, of the array region 102 (FIG. 5A), the digit line exit region 104 (FIG. 5B), the word line exit region 106 (FIG. 5C), and the socket region 108 (FIG. 5D) at a processing stage of the method of forming the microelectronic device following the processing stage previously described with reference to FIG. 4A through FIG. 4D. As collectively depicted in FIG. 5A through FIG. 5D, at least one first routing tier 134 including first routing structures 136 may be formed over the access devices 116 (FIG. 5A); storage node devices 138 (e.g., capacitors) may be formed over and in electrical communication with at least some of the first routing structures 136 within the array region 102 (FIG. 5A); fourth contact structures 142 may be formed in each of the digit line exit region 104 (FIG. 5B) and the word line exit region 106 (FIG. 5C); and a third isolation material 140 may be formed on or over portions of at least the second isolation material 130, the first routing structures 136 (FIG. 5A), and the storage node devices 138 (FIG. 5A).

Referring to FIG. 5A, the first routing structures 136 of the first routing tier 134 may be employed to facilitate electrical communication between additional features (e.g., structures, materials, devices) coupled thereto. The first routing structures 136 may each individually be formed of and include conductive material. By way of non-limiting example, the first routing structures 136 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first routing structures 136 are formed of and include W.

At least some of the first routing structures 136 may be formed and configured to couple the access devices 116 (e.g., access devices) to the storage node devices 138 (e.g., capacitors) to form memory cells 144 (e.g., DRAM cells) within the array region 102. Each memory cell 144 may individually include one of the access devices 116; one of the storage node devices 138; one of the second contact structures 124 interposed between the access device 116 and the storage node device 138; and one of the first routing structures 136 interposed between the second contact structure 124 and the storage node device 138. At least some of the first routing structures 136 within the array region 102 may, for example, be configured and employed as redistribution material (RDM) structures (also referred to as "redistribution layer" (RDL) structures) to effectively shift (e.g., stagger, adjust, modify) lateral positions of semiconductor pillars of the access devices 116 to accommodate a desired arrangement (e.g., a hexagonal close packed arrangement) of the storage node devices 138 vertically over and in electrical communication with the access devices 116.

While FIG. 5A shows the formation of a single (e.g., only one) first routing tier 134 including first routing structures 136, multiple (e.g., more than one) first routing tiers 134 each individually including a desired arrangement (e.g., pattern) of first routing structures 136 may be formed. By of non-limiting example, two or more (e.g., three or more) of the first routing tiers 134 may be formed, wherein different first routing tiers 134 are vertically offset from one another and each individually include a desired arrangement of first routing structures 136 therein. At least some of the first routing structures 136 within at least one of the first routing tiers 134 may be coupled to at least some of the first routing structures 136 within at least one other of the first routing tiers 134 by way of conductive interconnect structures. In addition, while FIG. 5A through FIG. 5D show the first routing structures 136 of the first routing tier 134 as only being formed within the array region 102 (FIG. 5A), the disclosure is not so limited. Rather, at least some of the first routing structures 136 of the first routing tier 134 may be formed to be at least partially positioned within one or more other regions of the first microelectronic device structure 100, such as within the socket region 108 (FIG. 5D).

Still referring to FIG. 5A, within the array region 102, the storage node devices 138 may individually be formed and configured to store a charge representative of a programmable logic state of the memory cell 144 including the storage node device 138. In some embodiments, the storage node devices 138 comprise capacitors. During use and operation, a charged capacitor may represent a first logic state, such as a logic 1; and an uncharged capacitor may represent a second logic state, such as a logic 0. Each of the storage node devices 138 may, for example, be formed to include a first electrode (e.g., a bottom electrode), a second electrode (e.g., a top electrode), and a dielectric material between the first electrode and the second electrode.

Referring to FIG. 5B, within the digit line exit region 104, a first group 142A of the fourth contact structures 142 may be formed to contact at least some of the first group 132A of third contact structures 132 contacting the digit lines 118 horizontally extending (e.g., in the Y-direction) into the digit line exit region 104. Each fourth contact structure 142 of the first group 142A of fourth contact structures 142 may be considered to be a portion of a digit line contact structure (e.g., a so-called "edge of array" digit line contact structure). As shown in FIG. 5B, each fourth contact structure 142 of the first group 142A of fourth contact structures 142 may be formed to physically contact and vertically extend to one of the third contact structures 132 of the first group 132A of third contact structures 132. For example, within the digit line exit region 104, each third contact structure 132 of the first group 132A may be formed to physically contact and vertically extend through the third isolation material 140 to the third contact structure 132. Accordingly, each fourth contact structure 142 of the first group 142A may be formed to be coupled to one third contact structures 132 of the first group 132A.

Referring to FIG. 5C, within the word line exit region 106, a second group 142B of the fourth contact structures 142 may be formed to contact at least some of the second group 132B of third contact structures 132 contacting the word lines 120 horizontally extending (e.g., in the X-direction) into the word line exit region 106. Each fourth contact structure 142 of the second group 142B of fourth contact structures 142 may be considered to be a portion of a word line contact structure (e.g., a so-called "edge of array" word line contact structure). As shown in FIG. 5C, each fourth contact structure 142 of the second group 142B of fourth contact structures 142 may be formed to physically contact and vertically extend to one of the third contact structures 132 of the second group 132B of third contact structures 132. For example, within the word line exit region 106, each fourth contact structure 142 of the second group 142B may be formed to physically contact and vertically extend through the third isolation material 140 to a third contact structure 132 of the second group 132B. Accordingly, each fourth contact structure 142 of the second group 142B may be formed to be coupled to one third contact structure 132 of the second group 132B.

Collectively referring again to FIG. 5B and FIG. 5C, the fourth contact structures 142, including the first group 142A (FIG. 5B) and the second group 142B (FIG. 5C), may be formed of and include conductive material. By way of non-limiting example, the fourth contact structures 142 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 142 comprise substantially the same material composition as the third contact structures 132. In other embodiments, the fourth contact structures 142 comprise a different material composition than the third contact structures 132. In some embodiments, the fourth contact structures 142 are each individually formed of and include W. Each of the fourth contact structures 142 may be substantially homogeneous, or one or more of the fourth contact structures 142 may individually be heterogeneous. In some embodiments, each of the fourth contact structures 142 is substantially homogeneous. In additional embodiments, each of the fourth contact structures 142 is heterogeneous. Each fourth contact structure 142 may, for example, be formed of and include a stack of at least two different conductive materials.

Referring to FIG. 5B and FIG. 5C, in some embodiments, a cross-sectional shape of the fourth contact structures 142 in the XY plane may be substantially circular, substantially oval, substantially rectangular, or substantially square. In some embodiments, the cross-sectional shape of the fourth contact structures 142 is substantially oval.

In some embodiments, the fourth contact structures 142, including the first group 142A (FIG. 5B) and the second group 142B (FIG. 5C), may be formed to exhibit tapered sidewalls 143. With reference to FIG. 5B, an upper dimension $D_5$ of the fourth contact structures 142 of the first group 142A may be larger than a lower dimension $D_6$ of the fourth contact structures 142 in a first horizontal direction (e.g., the X-direction). In addition, the upper dimension $D_5$ of the fourth contact structures 142 of the first group 142A may be larger than the lower dimension $D_6$ of the fourth contact structures 142 in a second horizontal direction (e.g., the Y-direction).

In some embodiments, the upper dimension $D_5$ is within a range of from about 40 nm to about 70 nm, such as from about 40 nm to about 45 nm, from about 45 nm to about 50 nm, from about 50 nm to about 55 nm, from about 55 nm to about 60 nm, from about 60 nm to about 65 nm, or from about 65 nm to about 70 nm and the lower dimension $D_6$ is within a range of from about 20 nm to about 50 nm, such as from about 20 nm to about 25 nm, from about 25 nm to about 30 nm, from about 30 nm to about 35 nm, from about 35 nm to about 40 nm, from about 40 nm to about 45 nm, or from about 45 nm to about 50 nm. However, the disclosure is not so limited and the upper dimension $D_5$ and the lower dimension $D_6$ may be different than those described. In some embodiments, the upper dimension $D_5$ and the lower dimension $D_6$ are larger than the respective upper dimension $D_1$ and lower dimension $D_2$ of the third contact structures 132 of the first group 132A.

In some embodiments, the upper dimension $D_5$ and the lower dimension $D_6$ of the fourth contact structures 142 of the first group 142A is larger in a first horizontal direction (e.g., in the X-direction) substantially perpendicular to a second horizontal direction (e.g., the Y-direction) in which the digit lines 118 with which the first group 142A of fourth contact structures 142 are electrically connected extend. In some such embodiments, the upper dimension $D_5$ and the lower dimension $D_6$ of the first group 142A of fourth contact structures 142 are larger in the first horizontal direction than the respective upper dimension $D_5$ and the lower dimension $D_6$ of the first group 142A of fourth contact structures 142 in the second direction. In some embodiments, the upper dimension $D_5$ of the first group 142A of fourth contact structures 142 is about 70 nm in a first horizontal direction (e.g., the X-direction) and about 60 nm in a second horizontal direction (e.g., the Y-direction) and the lower dimension $D_6$ is about 50 nm in the first direction and about 40 nm in the second direction.

In some embodiments, a ratio of $D_5$:$D_6$ is within a range of from about 1.2:1.0 to about 1.75:1.0, such as from about 1.2:1.0 to about 1.5:1.0, or from about 1.5:1.0 to about 1.75:1.0.

With reference to FIG. 5C, an upper dimension $D_7$ of the fourth contact structures 142 is larger than a lower dimension $D_5$ of the fourth contact structures 142 in the second horizontal direction (e.g., the Y-direction). In addition, the upper dimension $D_7$ of the fourth contact structures 142 of the second group 142B may be larger than the lower dimension $D_8$ of the fourth contact structures 142 in the first horizontal direction (e.g., the X-direction).

In some embodiments, the upper dimension $D_7$ is within a range of from about 40 nm to about 70 nm, such as from about 40 nm to about 45 nm, from about 45 nm to about 50 nm, from about 50 nm to about 55 nm, from about 55 nm to about 60 nm, from about 60 nm to about 65 nm, or from about 65 nm to about 70 nm and the lower dimension $D_5$ is within a range of from about 20 nm to about 25 nm, from about 25 nm to about 30 nm, from about 30 nm to about 35 nm, from about 35 nm to about 40 nm, from about 40 nm to about 50 nm, such as from about 40 nm to about 45 nm, or from about 45 nm to about 50 nm. However, the disclosure is not so limited and the upper dimension $D_7$ and the lower dimension $D_5$ may be different than those described. In some embodiments, the upper dimension $D_7$ and the lower dimension $D_5$ are larger than the respective upper dimension $D_3$ and lower dimension $D_4$ of the fourth contact structures 142 of the second group 142B. In some embodiments, the upper dimension $D_7$ of the second group 142B of fourth contact structures 142 is substantially the same as the upper dimension $D_5$ of the first group 142A of fourth contact structures 142; and the lower dimension $D_8$ of the second group 142B of fourth contact structures 142 is substantially the same as the lower dimension $D_6$ of the first group 142A of fourth contact structures 142.

In some embodiments, the upper dimension $D_7$ and the lower dimension $D_5$ of the fourth contact structures 142 of the second group 142B is larger in the second horizontal direction (e.g., in the Y-direction) substantially perpendicular to the first horizontal direction (e.g., the X-direction) in which the word lines 120 to which the second group 142B of fourth contact structures 142 are electrically connected extend. In some such embodiments, the upper dimension $D_7$ and the lower dimension $D_5$ of the second group 142B of fourth contact structures 142 are larger in the second horizontal direction than the respective upper dimension $D_7$ and lower dimension $D_5$ of the second group 142B of fourth contact structures 142 in the first horizontal direction. In some embodiments, the upper dimension $D_7$ of the second group 142B of fourth contact structures 142 is about 70 nm in the second horizontal direction (e.g., the Y-direction) and about 60 nm in the first horizontal direction (e.g., the X-direction) and the lower dimension $D_5$ is about 50 nm in the second horizontal direction and about 40 nm in the first horizontal direction. Thus, in some embodiments, the upper dimension $D_5$ and the lower dimension $D_6$ of the first group 142A of fourth contact structures 142 are larger than the respective upper dimension $D_7$ and lower dimension $D_5$ of the second group 142B of fourth contact structures 142 in the first horizontal direction (e.g., the X-direction) and smaller than the respective upper dimension $D_7$ and lower dimension $D_5$ of the second group 142B of fourth contact structures 142 in the second horizontal direction (e.g., the Y-direction).

In some embodiments, a ratio of $D_7:D_8$ is within a range of from about 1.2:1.0 to about 1.75:1.0, such as from about 1.2:1.0 to about 1.5:1.0, or from about 1.5:1.0 to about 1.75:1.0.

In some embodiments, a ratio of the vertically upper (e.g., in the Z-direction) dimension $D_5$ of the first group 142A of the fourth contact structures 142 to the vertically lower (e.g., in the Z-direction) dimension $D_1$ of the first group 132A of the third contact structures 132 ($D_5:D_1$) may be within a range of from about 1.5:1.0 to about 3.5:1.0, such as from about 1.5:1.0 to about 2.0:1.0, from about 2.0:1.0 to about 2.5:1.0, from about 2.5:1.0 to about 3.0:1.0, or from about 3.0:1.0 to about 3.5:1.0. In other words, in some embodiments, $D_5$ may be from about 1.5 times to about 3.5 times the size of $D_1$. In some embodiments, the ratio of $D_7:D_3$ may be within a range of from about 1.5:1.0 to about 3.5:1.0 as described above with reference to $D_5:D_1$. In some embodiments, the ratio of $D_7:D_3$ is about the same as the ratio of $D_5:D_1$. In other embodiments, the ratio of $D_7:D_3$ is different (e.g., smaller, larger) than the ratio of $D_5:D_1$.

In some embodiments, the cross-sectional area of the upper portions of the first group 142A and the second group 142B of fourth contact structures 142 is larger than the cross-sectional area of the lower portions of the first group 132A and the second group 132B of the third contact structures 132 in contact with the respective digit lines 118 and word lines 120.

With collective reference to FIG. 5A through FIG. 5D, the third isolation material 140 may be formed of and include at least one insulative material. A material composition of the third isolation material 140 may be substantially the same as a material composition of the second isolation material 130, or the material composition of the third isolation material 140 may be different than the material composition of the second isolation material 130. In some embodiments, the third isolation material 140 is formed of and includes a dielectric oxide material, such as $SiO_x$ (e.g., $SiO_2$). The third isolation material 140 may be substantially homogeneous, or the third isolation material 140 may be heterogeneous. In some embodiments, the third isolation material 140 is substantially homogeneous. In additional embodiments, the third isolation material 140 is heterogeneous. The third isolation material 140 may, for example, be formed of and include a stack of at least two different dielectric materials. As shown in FIG. 5A through FIG. 5D, an upper surface of third isolation material 140 may be formed to be substantially planar and to vertically overlie upper surfaces of the storage node devices 138.

Referring next to FIG. 6A through FIG. 6D, illustrated are simplified, partial longitudinal cross-sectional views of different regions of a second microelectronic device structure 145 (e.g., a second wafer) formed separate from the first microelectronic device structure 100 (FIG. 5A through FIG. 5D). The second microelectronic device structure 145 may be formed to have an arrangement of different regions (e.g., array regions, digit line exit regions, word line exit regions, socket regions) corresponding to (e.g., substantially the same as) the arrangement of different regions (e.g., the array regions 102, the digit line exit regions 104, the word line exit regions 106, the socket regions 108) previously described with reference to FIG. 1 through FIG. 5D. FIG. 6A illustrates a simplified, partial longitudinal cross-sectional view from the perspective of the Y-direction (so as to depict an XZ-plane) of an array region 102' of the second microelectronic device structure 145. FIG. 6B illustrates a simplified, partial longitudinal cross-sectional view from the perspective of the Y-direction (so as to depict an XZ-plane) of a digit line exit region 104' of the second microelectronic device structure 145. FIG. 6C illustrates a simplified, partial longitudinal cross-sectional view from the perspective of the X-direction (so as to depict an YZ-plane) of a word line exit region 106' of the second microelectronic device structure 145. FIG. 6D illustrates a simplified, partial longitudinal cross-sectional view from the perspective of the X-direction (so as to depict an YZ-plane) of a socket region 108' of the second microelectronic device structure 145.

As shown in FIG. 6A through FIG. 6D, the second microelectronic device structure 145 may be formed to include a second base semiconductor structure 146, additional filled trenches 148, transistors 150 (FIG. 6A and FIG. 6D), a fourth isolation material 152, fifth contact structures 154 (FIG. 6A and FIG. 6D), sixth contact structures 156 (FIG. 6A and FIG. 6D), and at least one second routing tier 158 (FIG. 6A and FIG. 6D) including second routing structures 160 (FIG. 6A and FIG. 6D). The additional filled trenches 148 vertically extend (e.g., in the Z-direction) into the second base semiconductor structure 146. The transistors 150 at least partially vertically overlie the second base semiconductor structure 146 and the additional filled trenches 148. The fifth contact structures 154 and sixth contact structures 156 contact the transistors 150. Some of the second routing structures 160 contact some of the fifth contact structures 154, and some other of the second routing structures 160 contact some of the sixth contact structures 156. The fourth isolation material 152 may substantially cover and surround the second base semiconductor structure 146, the transistors 150, the fifth contact structures 154, the sixth contact structures 156, and the second routing structures 160.

The second base semiconductor structure 146 comprises a base material or construction upon which additional features (e.g., materials, structures, devices) of the second microelectronic device structure 145 are formed. The second base semiconductor structure 146 may comprise a semiconductor structure (e.g., a semiconductor wafer), or a base semiconductor material on a supporting structure. For example, the second base semiconductor structure 146 may comprise a conventional silicon substrate (e.g., a conventional silicon wafer), or another bulk substrate comprising a semiconductor material. In some embodiments, the second base semiconductor structure 146 comprises a silicon wafer. The second base semiconductor structure 146 may include one or more layers, structures, and/or regions formed therein and/or thereon.

The additional filled trenches 148 may comprise trenches (e.g., openings, vias, apertures) within the second base semiconductor structure 146 that are at least partially (e.g., substantially) filled with the fourth isolation material 152. The additional filled trenches 148 may, for example, be employed as STI structures within the second base semiconductor structure 146. The additional filled trenches 148 may be formed to vertically extend partially (e.g., less than completely) through the second base semiconductor structure 146. Each of the additional filled trenches 148 may be formed to exhibit substantially the same dimensions and shape as each other of the additional filled trenches 148, or at least one of the additional filled trenches 148 may be formed to exhibit one or more of different dimensions and a different shape than at least one other of the additional filled trenches 148. As a non-limiting example, each of the additional filled trenches 148 may be formed to exhibit substantially the same vertical dimension(s) and substantially the same vertical cross-sectional shape(s) as each other of the additional filled trenches 148; or at least one of the additional filled trenches 148 may be formed to exhibit one or more of different vertical dimension(s) and different vertical cross-sectional shape(s) than at least one other of the additional filled trenches 148. In some embodiments, the additional filled trenches 148 are all formed to vertically extend to and terminate at substantially the same depth within the second base semiconductor structure 146. In additional embodiments, at least one of the additional filled trenches 148 is formed to vertically extend to and terminate at a relatively deeper depth within the second base semiconductor structure 146 than at least one other of the additional filled trenches 148. As another non-limiting example, each of the additional filled trenches 148 may be formed to exhibit substantially the same horizontal dimension(s) and substantially the same horizontal cross-sectional shape(s) as each other of the additional filled trenches 148; or at least one of the additional filled trenches 148 may be formed to exhibit one or more of different horizontal dimension(s) (e.g., relatively larger horizontal dimension(s), relatively smaller horizontal dimension(s)) and different horizontal cross-sectional shape(s) than at least one other of the additional filled trenches 148. In some embodiments, at least one of the additional filled trenches 148 is formed to have one or more different horizontal dimensions (e.g., in the X-direction and/or in the Y-direction) than at least one other of the additional filled trenches 148.

Referring collectively to FIG. 6A and FIG. 6D, the transistors 150 may individually be formed to include conductively doped regions 162, a channel region 164, a gate structure 166, and a gate dielectric material 168. For a transistor 150, the conductively doped regions 162 may be formed within the second base semiconductor structure 146 (e.g., within an relatively elevated portion of the formed within portions (e.g., relatively elevated portions) of the second base semiconductor structure 146 horizontally neighboring the additional filled trenches 148 horizontally neighboring at least one of the additional filled trenches 148); the channel region 164 may be within the second base semiconductor structure 146 and may be horizontally interposed between the conductively doped regions 162 thereof; the gate structure 166 may vertically overlie the channel region 164; and the gate dielectric material 168 (e.g., a dielectric oxide) may be vertically interposed (e.g., in the Z-direction) between the gate structure 166 and the channel region 164. The conductively doped regions 162 of an individual transistor 150 may include a source region 162A and a drain region 162B.

Referring collectively to FIG. 6A and FIG. 6D, for an individual transistor 150, the conductively doped regions 162 thereof may comprise semiconductor material of the second base semiconductor structure 146 doped with one or more desired conductivity-enhancing dopants. In some embodiments, the conductively doped regions 162 of the transistor 150 comprise semiconductor material (e.g., silicon) doped with at least one N-type dopant (e.g., one or more of phosphorus, arsenic, antimony, and bismuth). In some of such embodiments, the channel region 164 of the transistor 150 comprises the semiconductor material doped with at least one P-type dopant (e.g., one or more of boron, aluminum, and gallium). In some other of such embodiments, the channel region 164 of the transistor 150 comprises substantially undoped semiconductor material (e.g., substantially undoped silicon). In additional embodiments, for an individual transistor 150, the conductively doped regions 162 thereof comprise semiconductor material (e.g., silicon) doped with at least one P-type dopant (e.g., one or more of boron, aluminum, and gallium). In some of such additional embodiments, the channel region 164 of the transistor 150 comprises the semiconductor material doped with at least one N-type dopant (e.g., one or more of phosphorus, arsenic, antimony, and bismuth). In some other of such additional embodiments, the channel region 164 of the transistor 150 comprised substantially undoped semiconductor material (e.g., substantially undoped silicon).

Still referring collectively to FIG. 6A and FIG. 6D, the gate structures 166 (e.g., gate electrodes) may individually horizontally extend (e.g., in the X-direction) between and be employed by multiple transistors 150. The gate structures 166 may be formed of and include conductive material. The gate structures 166 may individually be substantially homogeneous, or the gate structures 166 may individually be heterogeneous. In some embodiments, the gate structures 166 are each substantially homogeneous. In additional embodiments, the gate structures 166 are each heterogeneous. Individual gate structures 166 may, for example, be formed of and include a stack of at least two different conductive materials.

Still referring to FIG. 6A and FIG. 6D, the fifth contact structures 154 may individually be formed to vertically extend between and couple the gate structures 166 (and, hence, the transistors 150) to one or more of the second routing structures 160 of the second routing tier 158. The fifth contact structures 154 may individually be formed of and include conductive material. By way of non-limiting example, the fifth contact structures 154 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fifth contact structures 154 are formed of and include W. In additional embodiments, the fifth contact structures 154 are formed of and include Cu.

As also shown in FIG. 6A and FIG. 6D, the sixth contact structures 156 may be formed to vertically extend between and couple the conductively doped regions 162 (e.g., the source region 162A, the drain region 162B) of the transistors 150 to some of the second routing structures 160 of the second routing tier 158. The sixth contact structures 156 may individually be formed of and include conductive material. By way of non-limiting example, the sixth contact structures 156 may be formed of and include one or more of at least one metal, at least one alloy, and at least one conductive metal-containing material (e.g., a conductive metal nitride, a conductive metal silicide, a conductive metal carbide, a conductive metal oxide). A material composition of the sixth contact structures 156 may be substantially the same as a material composition of the fifth contact structures 154, or the material composition of one or more of the sixth contact structures 156 may be different than the material composition of one or more of the fifth contact structures 154. In some embodiments, the sixth contact structures 156 are formed of and include W. In additional embodiments, the sixth contact structures 156 are formed of and include Cu.

Referring collectively to FIG. 6A through FIG. 6D, the second routing structures 160 of the second routing tier 158 may be formed of and include conductive material. By way of non-limiting example, the second routing structures 160 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second routing structures 160 are formed of and include W. In additional embodiments, the second routing structures 160 are formed of and include Cu. At least some of the second routing structures 160 may be employed as local routing structures of a microelectronic device (e.g., a memory device, such as a DRAM device).

While FIG. 6A through FIG. 6D show the formation of a single (e.g., only one) second routing tier 158 including second routing structures 160, multiple (e.g., more than one) second routing tiers 158 each individually including a desired arrangement (e.g., pattern) of second routing structures 160 may be formed. By of non-limiting example, two or more (e.g., three or more) of the second routing tiers 158 may be formed, wherein different second routing tiers 158 are vertically offset from one another and each individually include a desired arrangement of second routing structures 160 therein. At least some of the second routing structures 160 within at least one of the second routing tiers 158 may be coupled to at least some of the second routing structures 160 within at least one other of the second routing tiers 158 by way of conductive interconnect structures.

With continued collective reference to FIG. 6A through FIG. 6D, the transistors 150, the second routing structures 160, the fifth contact structures 154, the sixth contact structures 156 may form control logic circuitry of various control logic devices 170 (FIG. 6A and FIG. 6D) configured to control various operations of various features (e.g., the memory cells 144 (FIG. 5A)) of a microelectronic device (e.g., a memory device, such as a DRAM device) to be formed through the methods of disclosure. In some embodiments, the control logic devices 170 comprise CMOS circuitry. As a non-limiting example, the control logic devices 170 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. Different regions (e.g., the array region 102' (FIG. 6A), the socket region 108' (FIG. 6D)) may have different control logic devices 170 formed within horizontal boundaries thereof.

Referring to FIG. 6A through FIG. 6D, the fourth isolation material 152 covering and surrounding the second base semiconductor structure 146, the transistors 150 (FIG. 6A and FIG. 6D), the gate structures 166 (FIG. 6A and FIG. 6D), the fifth contact structures 154 (FIG. 6A and FIG. 6D), the sixth contact structures 156 (FIG. 6A and FIG. 6D), and the second routing structures 160 (FIG. 6A and FIG. 6D) may be formed of and include at least one insulative material. A material composition of the fourth isolation material 152 may be substantially the same as a material composition of the third isolation material 140 (FIG. 5A through FIG. 5D) of the first microelectronic device structure 100 (FIG. 5A through FIG. 5D), or the material composition of the fourth isolation material 152 may be different than the material composition of the third isolation material 140 (FIG. 5A through FIG. 5D). In some embodiments, the fourth isolation material 152 is formed of and includes a dielectric oxide material, such as $SiO_x$ (e.g., $SiO_2$). The fourth isolation material 152 may be substantially homogeneous, or the fourth isolation material 152 may be heterogeneous. In some embodiments, the fourth isolation material 152 is substantially homogeneous. In additional embodiments, the fourth isolation material 152 is heterogeneous. The fourth isolation material 152 may, for example, be formed of and include a stack of at least two different dielectric materials. An upper surface of the fourth isolation material 152 may be formed to vertically overlie upper boundaries (e.g., upper surfaces) of the second routing structures 160 (FIG. 6A through FIG. 6D).

With continued reference to FIG. 6A through FIG. 6D, an additional microelectronic device structure 175 (e.g., a second wafer) including an additional base structure 171 and a fifth isolation material 174 may be attached to the fourth isolation material 152. The additional base structure 171 of the additional microelectronic device structure 175 comprises a base material or construction upon which additional features (e.g., materials, structures, devices) of the formed. In some embodiments, the additional base structure 171 comprises a wafer. The additional base structure 171 may be formed of and include one or more of semiconductor material (e.g., one or more of a silicon material, such monocrystalline silicon or polycrystalline silicon (also referred to herein as "polysilicon"); silicon-germanium; germanium; gallium arsenide; a gallium nitride; gallium phosphide; indium phosphide; indium gallium nitride; and aluminum gallium nitride), a base semiconductor material on a supporting structure, glass material (e.g., one or more of borosilicate glass (BSP), phosphosilicate glass (PSG), fluorosilicate glass (FSG), borophosphosilicate glass (BPSG), aluminosilicate glass, an alkaline earth boro-aluminosilicate glass, quartz, titania silicate glass, and soda-lime glass), and ceramic material (e.g., one or more of poly-aluminum nitride (p-AlN), silicon on poly-aluminum nitride (SOPAN), aluminum nitride (AlN), aluminum oxide (e.g., sapphire; $\alpha\text{-}Al_2O_3$), and silicon carbide). By way of non-limiting example, the additional base structure 171 may comprise a semiconductor wafer (e.g., a silicon wafer), a glass wafer, or a ceramic wafer. The additional base structure 171 may include one or more layers, structures, and/or regions formed therein and/or thereon.

The fifth isolation material 174 of the additional microelectronic device structure 175 may be formed of and include at least one insulative material. A material composition of the fifth isolation material 174 may be substantially the same as a material composition of the fourth isolation material 152; or the material composition of the fifth isolation material 174 may be different than the material composition of the fourth isolation material 152. In some embodiments, the fifth isolation material 174 is formed of and includes a dielectric oxide material, such as $SiO_x$ (e.g., $SiO_2$).

To attach the additional microelectronic device structure 175 to the fourth isolation material 152, the fifth isolation material 174 of the additional microelectronic device structure 175 may be provided in physical contact with the fourth isolation material 152, and the fifth isolation material 174 and the fourth isolation material 152 may be exposed to annealing conditions to form bonds (e.g., oxide-to-oxide bonds) between the fifth isolation material 174 and the fourth isolation material 152. By way of non-limiting example, the fifth isolation material 174 and the fourth isolation material 152 may be exposed to a temperature greater than or equal to about 400° C. (e.g., within a range of from about 400° C. to about 800° C., greater than about 800° C.) to form oxide-to-oxide bonds between the fourth isolation material 152 and the fifth isolation material 174. In some embodiments, the fourth isolation material 152 and the fifth isolation material 174 are exposed to at least one temperature greater than about 800° C. to form oxide-to-oxide bonds between the fourth isolation material 152 and the fifth isolation material 174.

As shown in FIG. 6A through FIG. 6D, bonding the fifth isolation material 174 to the fourth isolation material 152 may form a first connected isolation structure 173. In FIG. 6A through FIG. 6D, the fifth isolation material 174 and the fourth isolation material 152 of the first connected isolation structure 173 are distinguished from one another by way of a dashed line. However, the fifth isolation material 174 and the fourth isolation material 152 may be integral and continuous with one another. Put another way, the first connected isolation structure 173 may be a substantially monolithic structure including the fifth isolation material 174 as a first region thereof, and the fourth isolation material 152 as a second region thereof. In some such embodiments, the fifth isolation material 174 may be attached to the fourth isolation material 152 thereof without a bond line.

Referring next to FIG. 7A through FIG. 7D, illustrated are simplified, partial longitudinal cross-sectional views, from the directional perspectives previously described, of the array region 102' (FIG. 7A), the digit line exit region 104' (FIG. 7B), the word line exit region 106' (FIG. 7C), and the socket region 108' (FIG. 7D) at a processing stage of the method of forming the microelectronic device following the processing stage previously described with reference to FIG. 6A through FIG. 6D. As collectively depicted in FIG. 7A through FIG. 7D, the second microelectronic device structure 145 may be vertically inverted (e.g., flipped upside down in the Z-direction), and an upper portion of the second base semiconductor structure 146 (FIG. 6A through FIG. 6D) may be removed to expose (e.g., uncover) the fourth isolation material 152 within the additional filled trenches 148 (FIG. 6A through FIG. 6D) and form a semiconductor tier 178 (FIG. 7A and FIG. 7D) including semiconductor structures 180 separated from one another by remaining portions of the fourth isolation material 152. Thereafter, a sixth isolation material 182 may be formed on or over surfaces of the semiconductor structures 180 and the fourth isolation material 152.

The upper portion of the second base semiconductor structure 146 (FIG. 6A through FIG. 6D) vertically overlying the additional filled trenches 148 (FIG. 6A through FIG. 6D) following the vertical inversion of the second microelectronic device structure 145 may be removed using at least one conventional wafer thinning process (e.g., a conventional CMP process; a conventional etching process, such as a conventional dry etching process, or a conventional wet etching process). The semiconductor structures 180 may be formed to exhibit a desired vertical height (e.g., in the Z-direction) through the material removal process. The material removal process may also remove portions (e.g., upper portions following the vertical inversion of the second microelectronic device structure 145) of the fourth isolation material 152.

Referring collectively to FIG. 7A through FIG. 7D, the sixth isolation material 182 formed to cover the semiconductor structures 180 (FIG. 7A and FIG. 7D) and the fourth isolation material 152 may be formed of and include at least one insulative material. A material composition of the sixth isolation material 182 may be substantially the same as a material composition of the fourth isolation material 152, or the material composition of the sixth isolation material 182 may be different than the material composition of the fourth isolation material 152. In some embodiments, the sixth isolation material 182 is formed of and includes a dielectric oxide material, such as $SiO_x$ (e.g., $SiO_2$). The sixth isolation material 182 may be substantially homogeneous, or the sixth isolation material 182 may be heterogeneous. In some embodiments, the sixth isolation material 182 is substantially homogeneous. In additional embodiments, the sixth isolation material 182 is heterogeneous. The sixth isolation material 182 may, for example, be formed of and include a stack of at least two different dielectric materials. As shown in FIG. 7A through FIG. 7D, an upper surface of the sixth isolation material 182 may be formed to be substantially planar.

Referring next to FIG. 8A through FIG. 8D, illustrated are simplified, partial longitudinal cross-sectional views, from the directional perspectives previously described, of the array region 102 (FIG. 8A), the digit line exit region 104 (FIG. 8B), the word line exit region 106 (FIG. 8C), and the socket region 108 (FIG. 8D) previously described with reference to FIG. 5A through FIG. 5D at a processing stage of the method of forming the microelectronic device following the processing stages previously described with reference to FIG. 5A through FIG. 5D and FIG. 7A through FIG. 7D. As depicted in FIG. 8A through FIG. 8D, following the processing stage previously described with reference to FIG. 7A through FIG. 7D, the second microelectronic device structure 145 may be vertically inverted (e.g., flipped upside down in the Z-direction) and the sixth isolation material 182 thereof may be attached (e.g., bonded, such as through oxide-oxide bonding) to the third isolation material 140 of the first microelectronic device structure 100 to form a microelectronic device structure assembly 184. Attaching (e.g., bonding) the sixth isolation material 182 of the second microelectronic device structure 145 to the third isolation material 140 of the first microelectronic device structure 100 may form a second connected isolation structure 186 of the microelectronic device structure assembly 184 comprising the sixth isolation material 182 and the third isolation material 140. Following the attachment of the sixth isolation material 182 to the third isolation material 140, at least the additional microelectronic device structure 175 (FIG. 7A through FIG. 7D) including the additional base structure 171 (FIG. 7A through FIG. 7D) of the second microelectronic device structure 145 may be removed to expose the fifth isolation material 174. In some embodiments, after attachment of the sixth isolation material 182 to the third isolation material 140 to form the microelectronic device structure assembly 184, portions of the fifth isolation material 174 (FIG. 7A through FIG. 7D) may be removed using at least one conventional wafer thinning process (e.g., a conventional CMP process; a conventional etching process, such as a conventional dry etching process, or a conventional wet etching process).

As depicted in FIG. 8A through FIG. 8D, the microelectronic device structure assembly 184 may be attached to the first microelectronic device structure 100 such that array regions 102' (FIG. 7A), digit line exit regions 104' (FIG. 7B), word line exit region 106' (FIG. 7C), and socket regions 108' (FIG. 7D) of the second microelectronic device structure 145 horizontally overlap (e.g., are substantially horizontally aligned with) array regions 102 (FIG. 5A), digit line exit regions 104 (FIG. 5B), word line exit regions 106 (FIG. 5C), and socket regions 108 (FIG. 5D) of the first microelectronic device structure 100, respectively. Thus, in FIG. 8A through FIG. 8D, the array region 102 (FIG. 8A), the digit line exit region 104 (FIG. 8B), the word line exit region 106 (FIG. 8C), and the socket region 108 (FIG. 8D) respectively include features of the array region 102' (FIG. 7A), the digit line exit region 104' (FIG. 7B), the word line exit region 106' (FIG. 7C), and the socket region 108' (FIG. 7D) of the second microelectronic device structure 145 following the processing stage previously described with reference to FIG. 7A through FIG. 7D. While the different regions shown in FIG. 8A through FIG. 8D were previously described as different regions of the first microelectronic device structure 100 (FIG. 1 and FIG. 5A through FIG. 5D) formed by processing the first microelectronic device structure 100 according to the methods of the disclosure, it will be understood that these regions become regions of a microelectronic device of the disclosure formed using the first microelectronic device structure 100 and the second microelectronic device structure 145, as described in further detail below. Thus, these different regions are not limited to the features (e.g., structures, materials, devices) and/or portions of features of the first microelectronic device structure 100. Instead, these regions evolve through the methods of the disclosure to encompass and include additional features (e.g., additional structures, additional materials, additional devices), portions of additional features, and/or modified features.

To form the microelectronic device structure assembly 184, the sixth isolation material 182 of the second microelectronic device structure 145 may be provided in physical contact with the third isolation material 140 of the first microelectronic device structure 100, and then then the sixth isolation material 182 and the third isolation material 140 may be exposed to annealing conditions to form bonds (e.g., oxide-to-oxide bonds) between the sixth isolation material 182 and the third isolation material 140. By way of non-limiting example, the sixth isolation material 182 and the third isolation material 140 may be exposed to a temperature greater than or equal to about 400° C. (e.g., within a range of from about 400° C. to about 800° C., greater than about 800° C.) to form oxide-to-oxide bonds between the sixth isolation material 182 and the third isolation material 140. In some embodiments, the sixth isolation material 182 and the third isolation material 140 are exposed to at least one temperature greater than about 800° C. to form oxide-to-oxide bonds between the sixth isolation material 182 and the third isolation material 140.

In FIG. 8A through FIG. 8D, the sixth isolation material 182 and the third isolation material 140 of the second connected isolation structure 186 are distinguished from one another by way of a dashed line. However, the sixth isolation material 182 and the third isolation material 140 may be integral and continuous with one another. Put another way, second connected isolation structure 186 may be a substantially monolithic structure including the sixth isolation material 182 as a first region (e.g., an upper region) thereof, and the third isolation material 140 as a second region (e.g., a lower region) thereof. For the second connected isolation structure 186, the sixth isolation material 182 thereof may be attached to the third isolation material 140 thereof without a bond line.

Figure 9B:
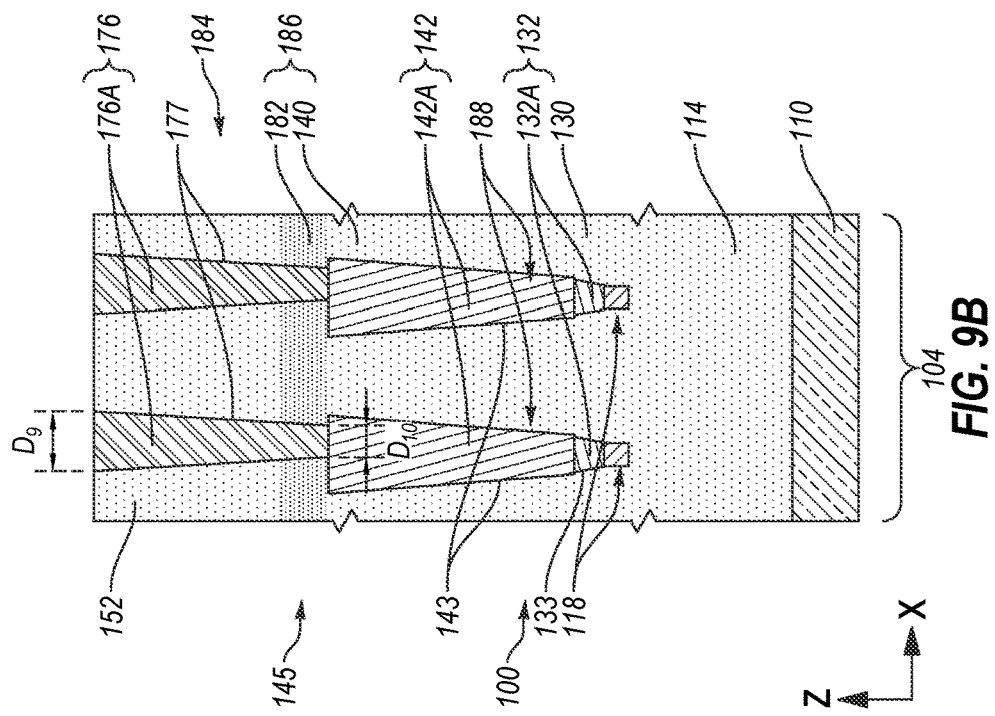
Figure 9A:
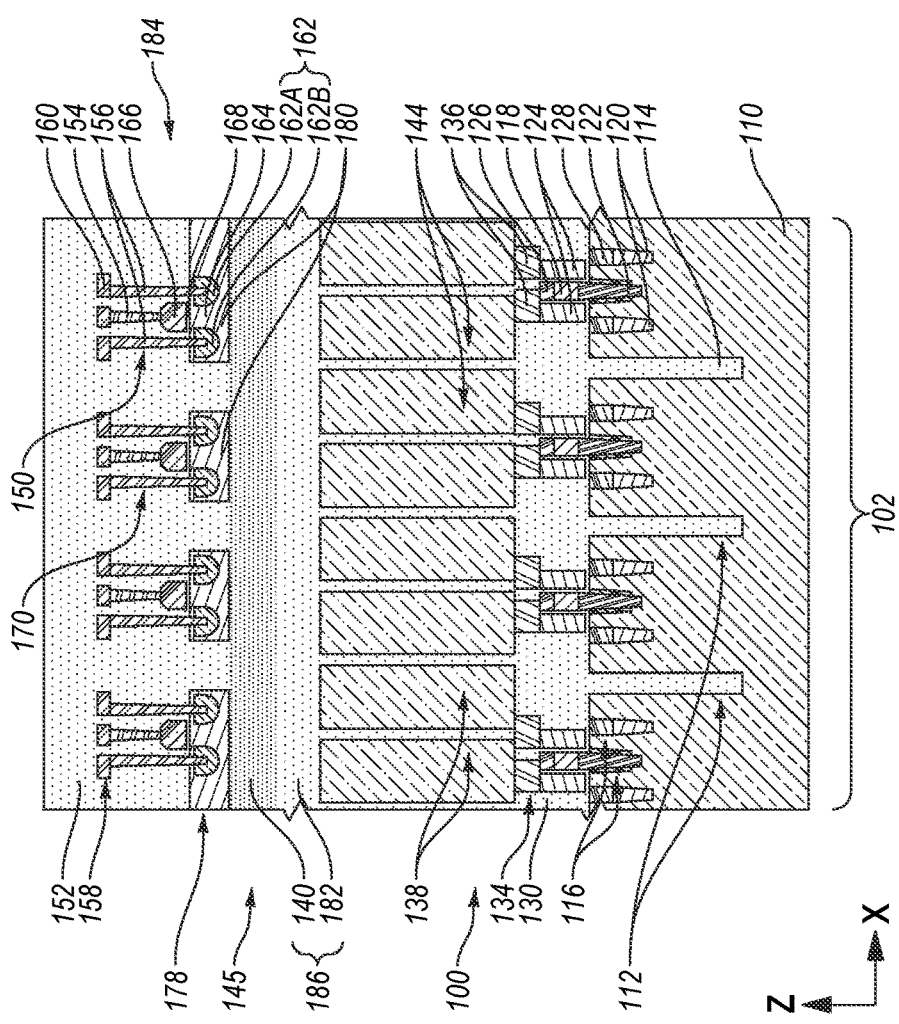

Referring next to FIG. 9A through FIG. 9D, illustrated are simplified, partial longitudinal cross-sectional views, from the directional perspectives previously described, of the array region 102 (FIG. 9A), the digit line exit region 104 (FIG. 9B), the word line exit region 106 (FIG. 9C), and the socket region 108 (FIG. 9D) at a processing stage of the method of forming the microelectronic device following the processing stage previously described with reference to FIG. 8A through FIG. 8D. As collectively depicted in FIG. 9B and FIG. 9C, seventh contact structures 176 may be formed within the digit line exit region 104 (FIG. 9B) and the word line exit region 106 (FIG. 9C). The seventh contact structures 176 include a first group 176A (FIG. 9B) of seventh contact structures 176 and a second group 176B (FIG. 9C) of seventh contact structures 176. The first group 176A of seventh contact structures 176 may be located within the digit line exit region 104 and the second group 176B of seventh contact structures 176 may be located within the word line exit region 106. The first group 176A of the seventh contact structures 176 may be formed to be coupled to the first group 142A of fourth contact structures 142 within the digit line exit region 104 (FIG. 9B) and the second group 176B of seventh contact structures 176 may be formed to be coupled to the second group 142B of fourth contact structures 142 within the word line exit region 106 (FIG. 9C). For example, the first group 176A of seventh contact structures 176 may be formed to physically contact and vertically extend (e.g., in the Z-direction) to the fourth contact structures 142 of the first group 142A; and the second group 176B of seventh contact structures 176 may be formed to physically contact and vertically extend (e.g., in the Z-direction) to the fourth contact structures 142 of the second group 142B.

With continued reference to FIG. 9B and FIG. 9C, in some embodiments, a cross-sectional shape of the seventh contact structures 176 in the XY plane may be substantially circular, substantially oval, substantially rectangular, or substantially square. In some embodiments, the cross-sectional shape of the seventh contact structures 176 is substantially oval.

In some embodiments, the seventh contact structures 176, including the first group 176A (FIG. 9B) and the second group 176B (FIG. 9C), may be formed to exhibit tapered sidewalls 177. With reference to FIG. 9B, an upper dimension $D_9$ of the seventh contact structures 176 of the first group 176A may be larger than a lower dimension $D_{10}$ of the seventh contact structures 176 in a first horizontal direction (e.g., the X-direction). In addition, the upper dimension $D_9$ of the seventh contact structures 176 of the first group 176A may be larger than the lower dimension $D_{10}$ of the seventh contact structures 176 in a second horizontal direction (e.g., the Y-direction).

In some embodiments, the upper dimension $D_9$ is within a range of from about 40 nm to about 60 nm, such as from about 40 nm to about 50 nm, or from about 50 nm to about 60 nm and the lower dimension $D_{10}$ is within a range of from about 30 nm to about 50 nm, such as from about 30 nm to about 40 nm, or from about 40 nm to about 50 nm. However, the disclosure is not so limited and the upper dimension $D_9$ and the lower dimension $D_{10}$ may be different than those described. In some embodiments, the upper dimension $D_9$ and the lower dimension $D_{10}$ are larger than the respective upper dimensions $D_1$, $D_3$ and lower dimensions $D_2$, $D_4$ of the third contact structures 132 and smaller than the respective upper dimensions $D_5$, $D_7$ and lower dimension $D_6$, $D_8$ of the fourth contact structures 142.

In some embodiments, a ratio of $D_9$:$D_{10}$ is within a range of from about 1.2:1.0 to about 2.0:1.0, such as from about 1.2:1.0 to about 1.5:1.0, or from about 1.5:1.0 to about 2.0:1.0.

In some embodiments, the upper dimension $D_9$ and the lower dimension $D_{10}$ of the seventh contact structures 176 of the first group 176A is larger in the first horizontal direction (e.g., in the X-direction) substantially perpendicular to a second horizontal direction (e.g., the Y-direction) in which the digit lines 118 extend. In some such embodiments, the upper dimension $D_9$ and the lower dimension $D_{10}$ of the first group 176A of seventh contact structures 176 are larger in the first horizontal direction than the respective upper dimension $D_9$ and the lower dimension $D_{10}$ of the first group 176A of fourth contact structures 142 in the second horizontal direction. In some embodiments, the upper dimension $D_9$ of the first group 176A of seventh contact structures 176 is about 60 nm in the first horizontal direction (e.g., the X-direction) and about 40 nm in the second horizontal direction (e.g., the Y-direction) and the lower dimension $D_{10}$ is about 50 nm in the first direction and about 30 nm in the second horizontal direction.

In some embodiments, the upper dimension $D_9$ and the lower dimension $D_{10}$ are larger than the respective upper dimensions $D_1$, $D_3$ and lower dimensions $D_2$, $D_4$ of the third contact structures 132 and smaller than the respective upper dimensions $D_5$, $D_7$ and lower dimension $D_6$, $D_8$ of the fourth contact structures 142.

With reference to FIG. 9C, an upper dimension $D_{11}$ of the seventh contact structures 176 is larger than a lower dimension $D_{12}$ of the seventh contact structures 176 in the second horizontal direction (e.g., the Y-direction). In addition, the upper dimension $D_{11}$ of the seventh contact structures 176 of the second group 176B may be larger than the lower dimension $D_{12}$ of the fourth contact structures 142 in the first horizontal direction (e.g., the X-direction).

In some embodiments, the upper dimension $D_{11}$ is within a range of from about 40 nm to about 60 nm, such as from about 40 nm to about 50 nm, or from about 50 nm to about 60 nm and the lower dimension $D_{12}$ is within a range of from about 30 nm to about 50 nm, such as from about 30 nm to about 40 nm, or from about 40 nm to about 50 nm. However, the disclosure is not so limited and the upper dimension $D_{11}$ and the lower dimension $D_{12}$ may be different than those described. In some embodiments, the upper dimension $D_{11}$ and the lower dimension $D_{12}$ are larger than the respective upper dimensions $D_1$, $D_3$ and lower dimensions $D_2$, $D_4$ of the third contact structures 132 and smaller than the respective upper dimensions $D_5$, $D_7$ and lower dimension $D_6$, $D_8$ of the fourth contact structures 142. In some embodiments, the upper dimension $D_{11}$ of the second group 176B of seventh contact structures 176 is substantially the same as the upper dimension $D_9$ of the first group 176A of seventh contact structures 176; and the lower dimension $D_{12}$ of the second group 176B of seventh contact structures 176 is substantially the same as the lower dimension $D_{10}$ of the first group 176A of seventh contact structures 176.

In some embodiments, the upper dimension $D_{11}$ and the lower dimension $D_{12}$ of the seventh contact structures 176 of the second group 176B is larger in the second horizontal direction (e.g., in the Y-direction) substantially perpendicular to the first horizontal direction (e.g., the X-direction) in which the word lines 120 extend. In some such embodiments, the upper dimension $D_{11}$ and the lower dimension $D_{12}$ of the second group 176B of seventh contact structures 176 are larger in the second horizontal direction than the respective upper dimension $D_{11}$ and lower dimension $D_{12}$ of the second group 176B of seventh contact structures 176 in the second direction. In some embodiments, the upper dimension $D_{11}$ of the second group 176B of seventh contact structures 176 is about 60 nm in the second horizontal direction (e.g., the Y-direction) and about 40 nm in the first horizontal direction (e.g., the X-direction) and the lower dimension $D_{12}$ is about 50 nm in the second horizontal direction and about 30 nm in the first horizontal direction. Thus, in some embodiments, the upper dimension $D_9$ and the lower dimension $D_{11}$ of the first group 176A of seventh contact structures 176 are larger than the respective upper dimension $D_{11}$ and lower dimension $D_{12}$ of the second group 176B of seventh contact structures 176 in the first horizontal direction (e.g., the X-direction) and smaller than the respective upper dimension $D_{11}$ and lower dimension $D_{12}$ of the second group 176B of seventh contact structures 176 in the second horizontal direction (e.g., the Y-direction).

Referring to FIG. 9B, within the digit line exit region 104, the first group 176A of seventh contact structures 176, the first group 142A of fourth contact structures 142, and the first group 132A of third contact structures 132 may form first deep contact structures 188 electrically connected to the digit lines 118. The first deep contact structures 188 may vertically extend (e.g., in the Z-direction) through the fourth isolation material 152, the sixth isolation material 182, and the third isolation material 140. Each of the first deep contact structures 188 (each individually including one of the seventh contact structures 176 of the first group 176A, the fourth contact structures 142 of the first group 142A, and the third contact structures 132 of the first group 132A) may be referred to as a so-called "edge of array" digit line contact structure.

Referring to FIG. 9C, within the word line exit region 106, the second group 176B of seventh contact structures 176, the second group 142B of fourth contact structures 142, and the second group 132B of third contact structures 132 may form second deep contact structures 190 electrically connected to the word lines 120. The second deep contact structures 190 may vertically extend (e.g., in the Z-direction) through the fourth isolation material 152, the sixth isolation material 182, and the third isolation material 140. Each of the second deep contact structures 190 (each individually including one of the seventh contact structures 176 of the second group 176B, the fourth contact structures 142 of the second group 142B, and the third contact structures 132 of the second group 132B) may be referred to as a so-called "edge of array" word line contact structure. In some embodiments, the first deep contact structures 188 are larger than the second deep contact structures 190. For example, in some embodiments, one or more of (e.g., each of) the first group 132A of the third contact structures 132, the first group 142A of the fourth contact structures 142, and the first group 176A of the seventh contact structures 176 of the first deep contact structures 188 are larger than the respective second group 132B of the third contact structures 132, the second group 142B of the fourth contact structures 142, and the second group 176B of the seventh contact structures 176 of the second deep contact structures 190.

With reference to FIG. 9B and FIG. 9C, the seventh contact structures 176 may be formed by, for example, forming openings through the fourth isolation material 152 and the sixth isolation material 182 to expose upper (e.g., in the Z-direction) surfaces of the fourth contact structures 142 of the first group 142A and the second group 142B. After forming the openings through the fourth isolation material 152 and the sixth isolation material 182, the openings may be filled with conductive material to form the seventh contact structures 176. In some embodiments, registration marks for the formation of the seventh contact structures 176 may be clearly observed through the isolation materials (e.g., dielectric oxide materials, such as $SiO_x$) of the microelectronic device structure assembly 184.

In some embodiments, the upper portions of the seventh contact structures 176 vertically extend (e.g., in the Z-direction) above upper surfaces of the control logic devices 170 (FIG. 10A and FIG. 10D).

Still referring to FIG. 9B and FIG. 9C, the seventh contact structures 176 (including the first group 176A (FIG. 9B) and the second group 176B (FIG. 9C) thereof) may be formed of and include conductive material. By way of non-limiting example, the seventh contact structures 176 may each individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the seventh contact structures 176 are each individually formed of and include W. Each of the seventh contact structures 176 may be substantially homogeneous, or one or more of the seventh contact structures 176 may individually be heterogeneous. In some embodiments, each of the seventh contact structures 176 is substantially homogeneous. In additional embodiments, each of the seventh contact structures 176 is heterogeneous. Each seventh contact structure 176 may, for example, be formed of and include a stack of at least two different conductive materials.

Referring next to FIG. 10A through FIG. 10D, illustrated are simplified, partial longitudinal cross-sectional views, from the directional perspectives previously described, of the array region 102 (FIG. 10A), the digit line exit region 104 (FIG. 10B), the word line exit region 106 (FIG. 10C), and the socket region 108 (FIG. 10D) at a processing stage of the method of forming the microelectronic device following the processing stage previously described with reference to FIG. 9A through FIG. 9D. As collectively depicted in FIG. 10A through FIG. 10D, BEOL structures may be formed over the second routing tier 158 and the seventh contact structures 176 (FIG. 10B and FIG. 10C) to form a microelectronic device 250. For example, at least one third routing tier 192 (FIG. 10A and FIG. 10D) including third routing structures 194 (FIG. 10A and FIG. 10D) may be formed over the second routing tier 158; at least one fourth routing tier 196 including fourth routing structures 198 may be formed over the third routing tier 192 (FIG. 10A and FIG. 10D); and at least one fifth routing tier 200 including fifth routing structures 202 may be formed over the fourth routing tier 196. One or more of the third routing structures 194 (FIG. 10A and FIG. 10D) of the third routing tier 192 (FIG. 10A and FIG. 10D) may be coupled to one or more of the second routing structures 160 of the second routing tier 158 by way of eighth contact structures 204 (FIG. 10A and FIG. 10D). In addition, one or more of the fourth routing structures 198 of the fourth routing tier 196 may be coupled to one or more of the third routing structures 194 (FIG. 10A and FIG. 10D) of the third routing tier 192 (FIG. 10A and FIG. 10D) by way of ninth contact structures 206 (FIG. 10A and FIG. 10D). Furthermore, one or more of the fifth routing structures 202 (e.g., one or more conductive pad structures) of the fifth routing tier 200 may be coupled to one or more of the fourth routing structures 198 of the fourth routing tier 196 by way of tenth contact structures 208 (FIG. 10D). In additional embodiments, at least some (e.g., all) of the tenth contact structures 208 (FIG. 10D) are omitted (e.g., are not formed), and one or more of the fifth routing structures 202 of the fifth routing tier 200 are formed to directly physically contact one or more of the fourth routing structures 198 of the fourth routing tier 196.

The third routing structures 194 (FIG. 10A and FIG. 10D), the fourth routing structures 198, the fifth routing structures 202, the eighth contact structures 204 (FIG. 10A and FIG. 10D), the ninth contact structures 206 (FIG. 10A and FIG. 10D), and the tenth contact structures 208 (FIG. 10D) (if any) may each be formed of and include conductive material. By way of non-limiting example, the third routing structures 194 (FIG. 10A through FIG. 10D), the fourth routing structures 198, the fifth routing structures 202, the eighth contact structures 204 (FIG. 10A and FIG. 10D), the ninth contact structures 206 (FIG. 10A and FIG. 10D), and the tenth contact structures 208 (FIG. 10D) may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 194 (FIG. 10A through FIG. 10D) are each formed of and include W; the fourth routing structures 198 are each formed of and include Cu; the fifth routing structures 202 are formed of and include Al; and the eighth contact structures 204 (FIG. 10A and FIG. 10D), the ninth contact structures 206 (FIG. 10A and FIG. 10D), and the tenth contact structures 208 (FIG. 10D) are each formed of and include W.

Still referring to collectively to FIG. 10A through FIG. 10D, a seventh isolation material 210 may be formed on or over portions of at least the third routing structures 194 (FIG. 10A through FIG. 10D), the fourth routing structures 198, the fifth routing structures 202, the eighth contact structures 204 (FIG. 10A and FIG. 10D), the ninth contact structures 206 (FIG. 10A and FIG. 10D), and the tenth contact structures 208 (FIG. 10D) (if any). The seventh isolation material 210 may be formed of and include at least one insulative material. In some embodiments, the seventh isolation material 210 is formed of and includes a dielectric oxide material, such as $SiO_x$ (e.g., $SiO_2$). The seventh isolation material 210 may be substantially homogeneous, or the seventh isolation material 210 may be heterogeneous. In some embodiments, the seventh isolation material 210 is substantially homogeneous. In additional embodiments, the seventh isolation material 210 is heterogeneous. The seventh isolation material 210 may, for example, be formed of and include a stack of at least two different dielectric materials. In addition, one or more openings may be formed within the seventh isolation material 210 to expose (and, hence, facilitate access to) one or more portions of one or more of the fifth routing structures 202 (e.g., one or more conductive pad structures) of the fifth routing tier 200.

As shown in FIG. 10A through FIG. 10D, the method described above with reference to FIG. 1 through FIG. 10D may effectuate the formation of the microelectronic device 250 (e.g., a memory device, such as a DRAM device) including the features (e.g., structures, materials, devices) previously described herein. In some embodiments, at least some of the third routing structures 194 (FIG. 10A through FIG. 10D), the fourth routing structures 198, and the fifth routing structures 202 are employed as global routing structures for the microelectronic device 250. The third routing structures 194 (FIG. 10A through FIG. 10D), the fourth routing structures 198, and the fifth routing structures 202 may, for example, be configured to receive global signals from an external bus, and to relay the global signals to other features (e.g., structures, devices) of the microelectronic device 250.

The digit lines 118 may be coupled to one or more of the control logic devices 170 (FIG. 10A and FIG. 10D) by means of the third routing structures 194. In addition, the word lines 120 may be coupled to one or more of the control logic devices 170 (FIG. 10A and FIG. 10D) by means of the third routing structures 194

The formation of the fourth contact structures 142 having the relatively larger upper dimension $D_5$, $D_7$ compared to the lower dimensions $D_4$, $D_5$ may facilitate electrically coupled the seventh contact structures 176 to the fourth contact structures 142 for forming the first deep contact structures 188 (FIG. 10B) and the second deep contact structures 190 (FIG. 10C) to electrically connect to the respective digit lines 118 and the word lines 120 after attaching the second microelectronic device structure 145 to the first microelectronic device structure 100. In addition, the relatively smaller size of the lower portions (lower ends) of the third contact structures 132 (e.g., $D_2$, $D_4$) facilitates electrical connection of the first deep contact structures 188 and the second deep contact structures 190 to the respective digit lines 118 and the word lines 120 at the pitch and spacing of the digit lines 118 and the word lines 120. Accordingly, the upper portions of the first deep contact structures 188 and the second deep contact structures 190 may be spaced at a larger pitch than the lower portions of the first deep contact structures 188 and the second deep contact structures 190. In addition, as described in further detail below, the first deep contact structures 188 and the second deep contact structures 190 may be arranged in a staggered pattern such that the spacing between neighboring first deep contact structures 188 and the second deep contact structures 190 may be increased relative to the spacing of the digit lines 118 and the spacing of the word lines 120.

The first deep contact structures 188 and the second deep contact structures 190 may comprise a larger cross-sectional area (e.g., in the XY plane) at an interface of the fourth contact structures 142 and the third contact structures 132 (e.g., the interface between the first microelectronic device structure 100 and the second microelectronic device structure 145) than at the interface of the third contact structures 132.

Accordingly, the fourth contact structures 142 may reduce contact misalignment risks and alleviate the need for relatively complex contact alignment operations and systems as compared to conventional methods of the forming contact structures coupled to conductive line structures (e.g., digit lines, word lines).

In some embodiments, the reduced dimension of the size of the fourth contact structures 142 including the first group 142A and the second group 142B of the fourth contact structures 142 may facilitate forming the first microelectronic device structure 100 to include a greater quantity (number) of memory cells 144 than a quantity (number) of transistors 150 of the control logic devices 170 of the second microelectronic device structure 145.

Figure 11:
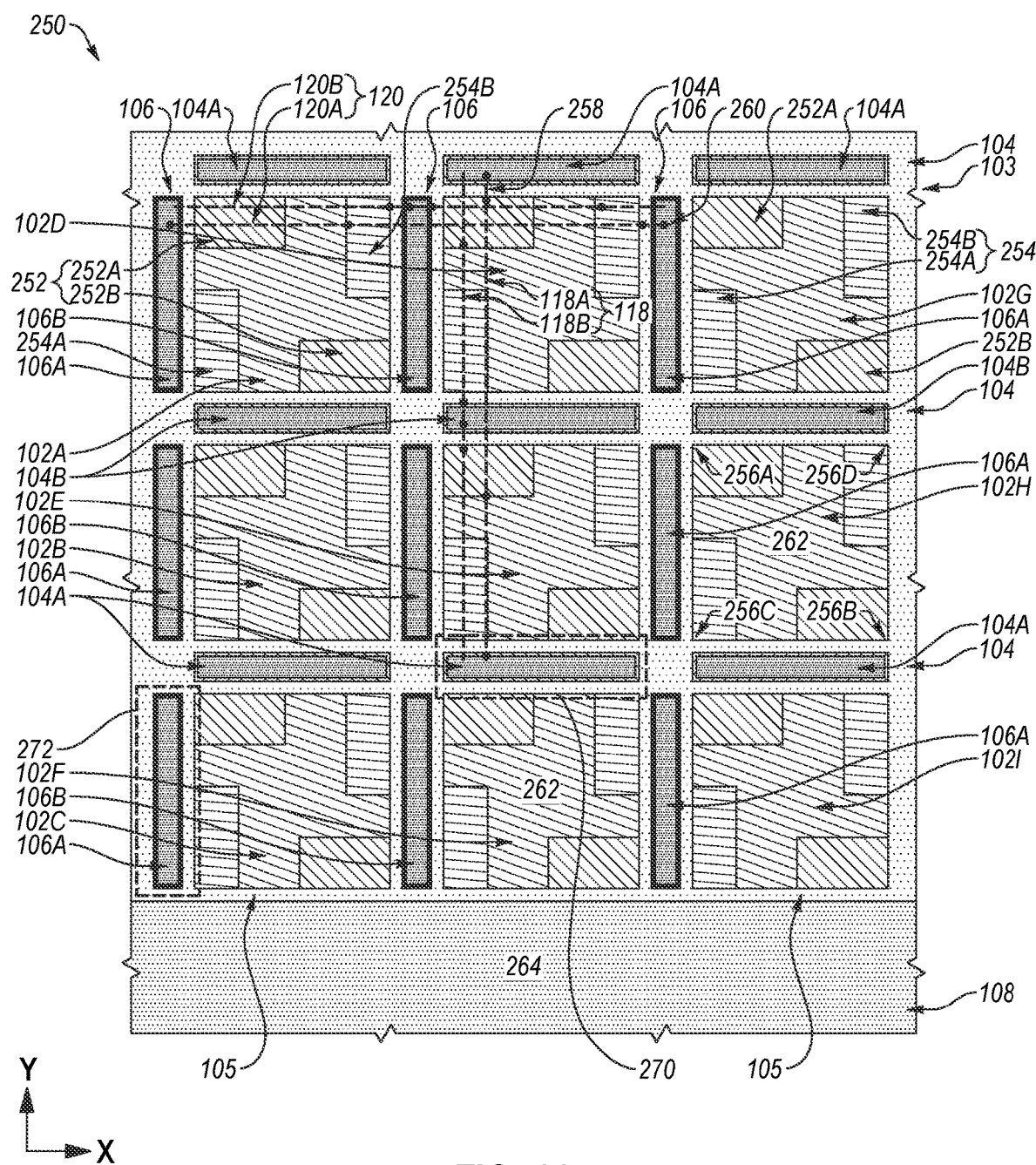
FIG. 11 a simplified plan view of the microelectronic device of FIG. 10A through FIG. 10D, in accordance with an embodiment of the disclosure.

Referring next to FIG. 11, depicted is a simplified plan view of the microelectronic device 250 illustrating an arrangement of different control logic sections (described in further detail below) within individual different regions (e.g., the array regions 102, such as the first array region 102A, the second array region 102B, the third array region 102C, the fourth array region 102D, the fifth array region 102E, the sixth array region 102F, the seventh array region 102G, the eighth array region 102H, the ninth array region 102I; the socket regions 108) of the microelectronic device 250, as well as routing arrangements to different control logic devices (e.g., corresponding to the control logic devices 170 (FIG. 10A and FIG. 10D)) within the different control logic sections, in accordance with embodiments of the disclosure. The different control logic devices of the different control logic sections may be positioned vertically above (e.g., in the Z-direction) the memory cells 144 (FIG. 10A) of the microelectronic device 250. At least some of the different control logic devices may be coupled to the memory cells 144 (FIG. 10A) in the manner previously described with reference to FIG. 10A through FIG. 10D. For clarity and ease of understanding the description, not all features (e.g., structures, materials, devices) of the microelectronic device 250 previously described with reference to FIG. 10A through FIG. 10D are illustrated in FIG. 11.

As shown in FIG. 11, within a horizontal area of each array region 102, the microelectronic device 250 may be formed to include a desired arrangement of sense amplifier (SA) sections 252 and sub-word line driver (SWD) sections 254. The SA sections 252 may include SA devices coupled to the digit lines 118 of the microelectronic device 250, as described in further detail below. The digit lines 118 may vertically underlie (e.g., in the Z-direction) the SA devices of the SA sections 252 within the microelectronic device 250. The SWD sections 254 may include SWD devices coupled to the word lines 120 of the microelectronic device 250, as also described in further detail below. The word lines 120 may vertically underlie (e.g., in the Z-direction) the SWD devices of the SWD sections 254 within the microelectronic device 250.

The SA sections 252 within a horizontal area of an individual array region 102 (e.g., the first array region 102A, the second array region 102B, the third array region 102C, the fourth array region 102D, the fifth array region 102E, the sixth array region 102F, the seventh array region 102G, the eighth array region 102H) may include a first SA section 252A and a second SA section 252B. For an individual array region 102, the first SA section 252A and the second SA section 252B may be positioned at or proximate opposite corners (e.g., diagonally opposite corners) of the array region 102 than one another. For example, as shown in FIG. 11, for an individual array region 102, the first SA section 252A may be positioned at or proximate a first corner 256A of the array region 102, and the second SA section 252B may be positioned at or proximate a second corner 256B of the array region 102 located diagonally opposite (e.g., kitty-corner) the first corner 256A.

For each SA section 252 (e.g., the first SA section 252A, the second SA section 252B) within an individual array region 102, the SA devices of the SA section 252 may be coupled to a group of the digit lines 118 horizontally extending (e.g., in the Y-direction) through the array region 102 by way of digit line routing and contact structures 258. The digit line routing and contact structures 258 may, for example, correspond to some of the routing structures (e.g., some of the second routing structures 160 (FIG. 10A and FIG. 10B)) and some of the contact structures (e.g., some of the first deep contact structures 188 (FIG. 10B)) previously described herein.

The SWD sections 254 within a horizontal area an individual array region 102 (e.g., the first array region 102A, the second array region 102B, the third array region 102C, the fourth array region 102D, the fifth array region 102E, the sixth array region 102F, the seventh array region 102G, the eighth array region 102H) may include a first SWD section 254A and a second SWD section 254B. For an individual array region 102, the first SWD section 254A and the second SWD section 254B may be positioned at or proximate different corners than the first SA section 252A and a second SA section 252B. In addition, the corner of the array region 102 associated with first SWD section 254A may oppose (e.g., diagonally oppose) the corner of the array region 102 associated with second SWD section 254B. For example, as shown in FIG. 11, for an individual array region 102, the first SWD section 254A may be positioned at or proximate a third corner 256C of the array region 102, and the second SWD section 254B may be positioned at or proximate a fourth corner 256D of the array region 102 located diagonally opposite (e.g., kitty-corner) the third corner 256C.

For each SWD section 254 (e.g., the first SWD section 254A, the second SWD section 254B) within an individual array region 102, the SWD devices of the SWD section 254 may be coupled to a group of the word lines 120 horizontally extending (e.g., in the X-direction) through the array region 102 by way of word line routing and contact structures 260. The word line routing and contact structures 260 may, for example, correspond to some of the routing structures (e.g., some of the second routing structures 160 (FIG. 10A and FIG. 10B)) and some of the contact structures (e.g., some of the second deep contact structures 190 (FIG. 10C)) previously described herein.

The first digit line exit subregions 104A may be coupled to a first group of digit lines 118, such as odd digit lines 118A and the second digit line exit subregions 104B may be coupled to a second group of digit lines 118, such as even digit lines 118B. The first digit line exit subregions 104A may alternate with the second digit line exit subregions 104B located within the same column 105 of array regions 102. In some such embodiments, the first digit line exit subregions 104A alternate with the second digit line exit subregions 104B in a horizontal direction (e.g., in the Y-direction). In some embodiments, the first digit line exit subregions 104A horizontally neighboring one another in a horizontal direction (e.g., in the X-direction) are the same. Accordingly, the digit lines 118 coupled to digit line exit subregions 104A, 104B located in horizontally neighboring columns 105 of array regions 102 may be coupled to the same type of digit lines 118 (one of the odd digit lines 118A or the even digit lines 118B).

The first word line exit subregions 106A may be coupled to a first group of word lines 120, such as odd word lines 120A and the second word line exit subregions 106B may be coupled to a second group of word lines 120, such as even word lines 120B. The first word line exit subregions 106A may alternate with the second word line exit subregions 106B located within the same row 103 of array regions 102. In some such embodiments, the first word line exit subregions 106A alternate with the second word line exit subregions 106B in a horizontal direction (e.g., in the X-direction). In some embodiments, the first word line exit subregions 106A horizontally neighboring one another in a horizontal direction (e.g., in the Y-direction) are the same. Accordingly, the word lines 120 coupled word line exit subregions 106A, 106B horizontally neighboring one another and located in horizontally neighboring rows 103 of array regions 102 may be coupled to the same type of word lines 120 (one of the odd word lines 120A or the even word lines 120B).

Each of the array regions 102 may be horizontally neighbored by one of the first digit line exit subregions 104A and one of the second digit line exit subregions 104B in a first horizontal direction (e.g., in the Y-direction) and horizontally neighbored by one of the first word line exit subregions 106A and one of the second word line exit subregions 106B in a second horizontal direction (e.g., in the X-direction). In some embodiments, a first digit line exit subregion 104A may be located at a first horizontal end (e.g., in the Y-direction) of an array region 102 and a second digit line exit subregion 104B may be located on a second, opposite horizontal end (e.g., in the Y-direction) of the array region 102; and a first word line exit subregion 106A may be located on a different first horizontal end (e.g., in the X-direction) of the array region 102 and a second word line exit subregion 106B may be located on a different second, opposite horizontal end (e.g., in the X-direction) of the array region 102. In some such embodiments, substantially all sides of the array regions 102 are surrounded by one of the first digit line exit subregions 104A, the second digit line exit subregions 104B, the first word line exit subregions 106A, and the second word line exit subregions 106B.

Each of the SA sections 252 within an array region 102 may be connected to the odd digit lines 118A and the even digit lines 118B and each of the SWD sections 254 within the array region 102 may be connected to odd word lines 120A and even word lines 120B.

With maintained reference to FIG. 11, within a horizontal area of each array region 102, the microelectronic device 250 may include additional control logic sections individually including additional control logic devices (e.g., control logic devices other than SA devices and SWD devices). For example, for each array region 102, additional control logic sections 262 may be positioned horizontally between (e.g., at relatively more horizontally central positions within the array region 102) the SA sections 252 and the SWD sections 254. The additional control logic sections 262 may include, but are not limited to, column decoder device sections including column decoder device, and main word line (MWD) sections including MWD devices.

Still referring to FIG. 11, within a horizontal area of each socket region 108, the microelectronic device 250 may include further control logic sections 264 individually including further control logic devices (e.g., control logic devices in addition to those located within the horizontal areas of the array regions 102). At least some of the further control logic devices within the further control logic sections 264 may have different configurations and different operational functions than the control logic devices located within the horizontal areas of the array regions 102. By way of non-limiting example, the further control logic sections 264 may include bank logic sections including bank logic devices.

Figure 12A:
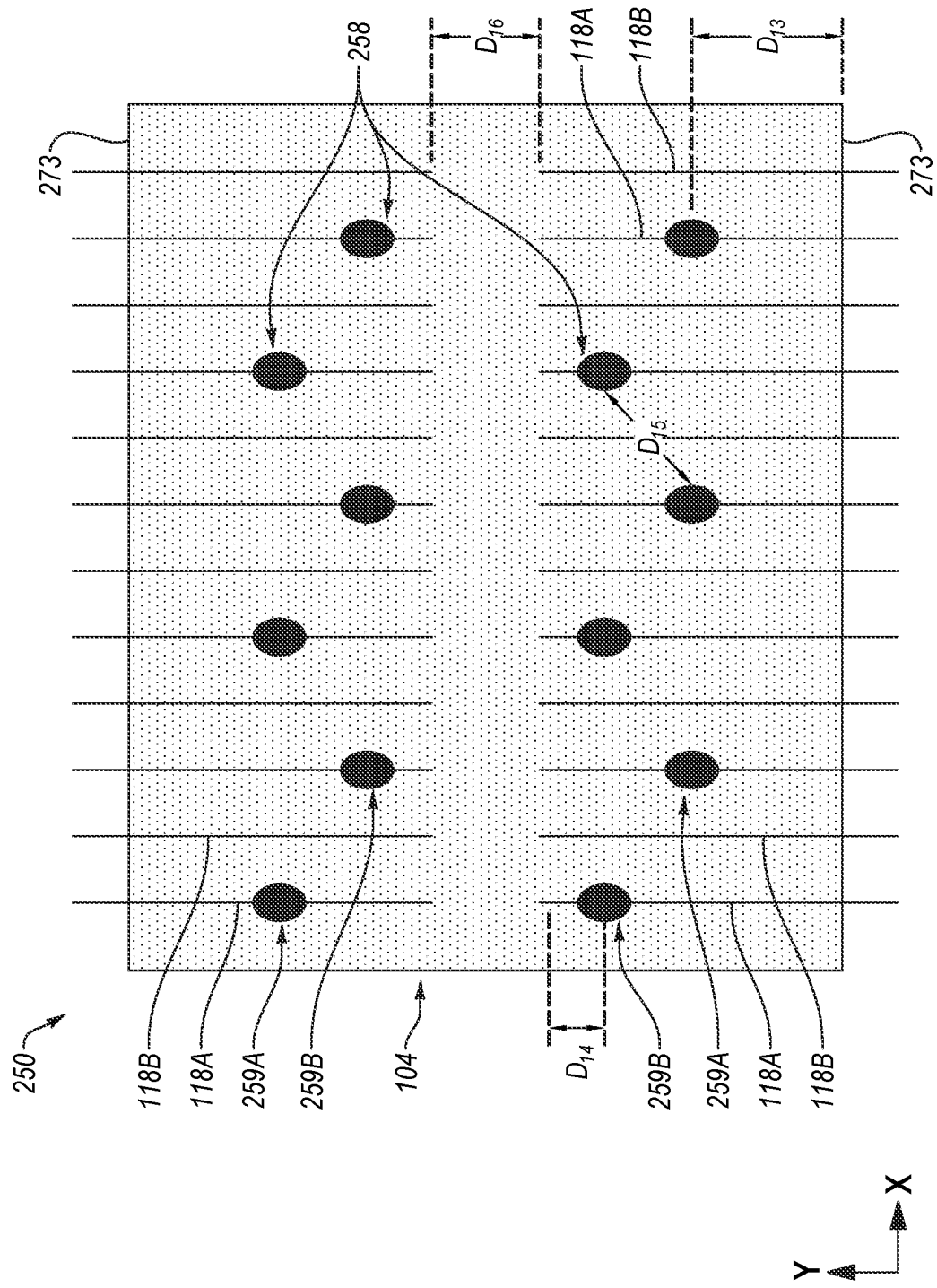
FIG. 12A is a simplified plan view of a digit line exit subregion of the microelectronic device of FIG. 11, in accordance with an embodiment of the disclosure.

FIG. 12A is a simplified plan view of the first digit line exit subregion 104A illustrated in box 270 of the microelectronic device 250 of FIG. 11. Digit lines 118 may horizontally (e.g., in the Y-direction) terminate within the first digit line exit subregion 104A. In some embodiments, every other one of the digit lines 118 (e.g., the odd digit lines 118A) is coupled to a digit line routing and contact structure 258 within the first digit line exit subregion 104A.

A horizontal boundary 273 of the first digit line exit subregion 104A may comprise an interface between the first digit line exit subregion 104A and a horizontally neighboring (e.g., in the Y-direction) array region 102. In other words, in some embodiments, the first digit line exit subregion 104A may be located directly between and contacting horizontally neighboring array region 102 within a column 105 (FIG. 11) of array regions 102.

In some embodiments, the digit line contact and routing structures 258 are staggered. In some such embodiments, the digit line contact and routing structures 258 coupled to horizontally neighboring (e.g., in the X-direction) odd digit lines 118A are horizontally offset (e.g., in the Y-direction) from each other. A first row 259A of the digit line contact and routing structures 258 may be located closer to the horizontal boundary 273 of the first digit line exit subregion 104A and, therefore, to a horizontally neighboring (e.g., in the Y-direction) array region 102 (FIG. 11) than a second row 259B of the digit line contact and routing structures 258. The digit line contact and routing structures 258 of the first row 259A may be horizontally aligned (e.g., in the Y-direction) with the other digit line contact and routing structures 258 of the first row 259A and offset from the digit line contact and routing structures 258 of the second row 259B. The digit line contact and routing structures 258 of the second row 259B may be horizontally aligned (e.g., in the Y-direction) with the other digit line contact and routing structures 258 of the second row 259B and offset from the digit line contact and routing structures 258 of the first row 259A.

In some embodiments, the digit line contact and routing structures 258 of the every fourth digit line 118 is horizontally aligned (e.g., in the Y-direction) due to the staggered pattern of the digit line contact and routing structures 258. In some such embodiments, the first deep contact structure 188 (FIG. 10B) of every fourth digit line 118 are horizontally aligned in the Y-direction. A distance between horizontally neighboring (e.g., in the X-direction) and horizontally aligned (e.g., in the Y-direction) digit line contact and routing structures 258 may be substantially the same in each of the first row 259A and the second row 259B.

In some embodiments, the digit lines 118 extending into the first digit line exit subregion 104A from a first horizontal boundary 273 are connected to SA sections 252 (FIG. 11) of a first array region 102A and digit lines 118 extending into the first digit line exit subregion 104A from a second, opposing horizontal boundary 273 are connected to SA sections 252 (FIG. 11) of a second, different array region 102. Digit line contact and routing structures 258 coupled to horizontally aligned (e.g., in the X-direction) odd digit lines 118A may be coupled to SA sections 252 of different array regions 102. Digit line contact and routing structures 258 coupled to horizontally aligned (e.g., in the X-direction) odd digit lines 118A may be located a different distance from a nearest horizontal boundary 273 and, therefore a different distance from a nearest array region 102.

The digit line contact and routing structures 258 within the first row 259A may be located a distance $D_{13}$ from a nearest horizontal boundary 273. The distance $D_{13}$ may be within a range of from about 80 nm to about 140 nm, such as from about 80 nm to about 100 nm, from about 100 nm to about 120 nm, or from about 120 nm to about 140 nm. In some embodiments, the distance $D_{13}$ is about 110 nm.

A distance $D_{14}$ between the horizontal end of an odd digit line 118A and a digit line routing and contact structure 258 within the second row 259B may be within a range of from about 20 nm to about 30 nm, such as from about 20 nm to about 25 nm, or from about 25 nm to about 30 nm. In some embodiments, the distance $D_{14}$ is about 25 nm.

A distance $D_{15}$ between the digit line contact and routing structures 258 of horizontally neighboring odd digit lines 118A (a digit line routing and contact structure 258 within a first row 259A and a digit line routing and contact structure 258 within a second row 259B) may be within a range of from about 50 nm to about 70 nm, such as from about 50 nm to about 60 nm, or from about 60 nm to about 70 nm. In some embodiments, the distance $D_{15}$ is about 62 nm.

In some embodiments, a distance $D_{16}$ between a horizontal end of a first group of the odd digit lines 118A coupled to a first array region 102A (FIG. 11) and a horizontal end of a second group of the odd digit lines 118A coupled to a second array region 102B (FIG. 11) may be within a range of from about 40 nm to about 80 nm, such as from about 40 nm to about 60 nm, or from about 60 nm to about 80 nm. In some embodiments, the distance $D_{16}$ is about 60 nm.

Figure 12B:
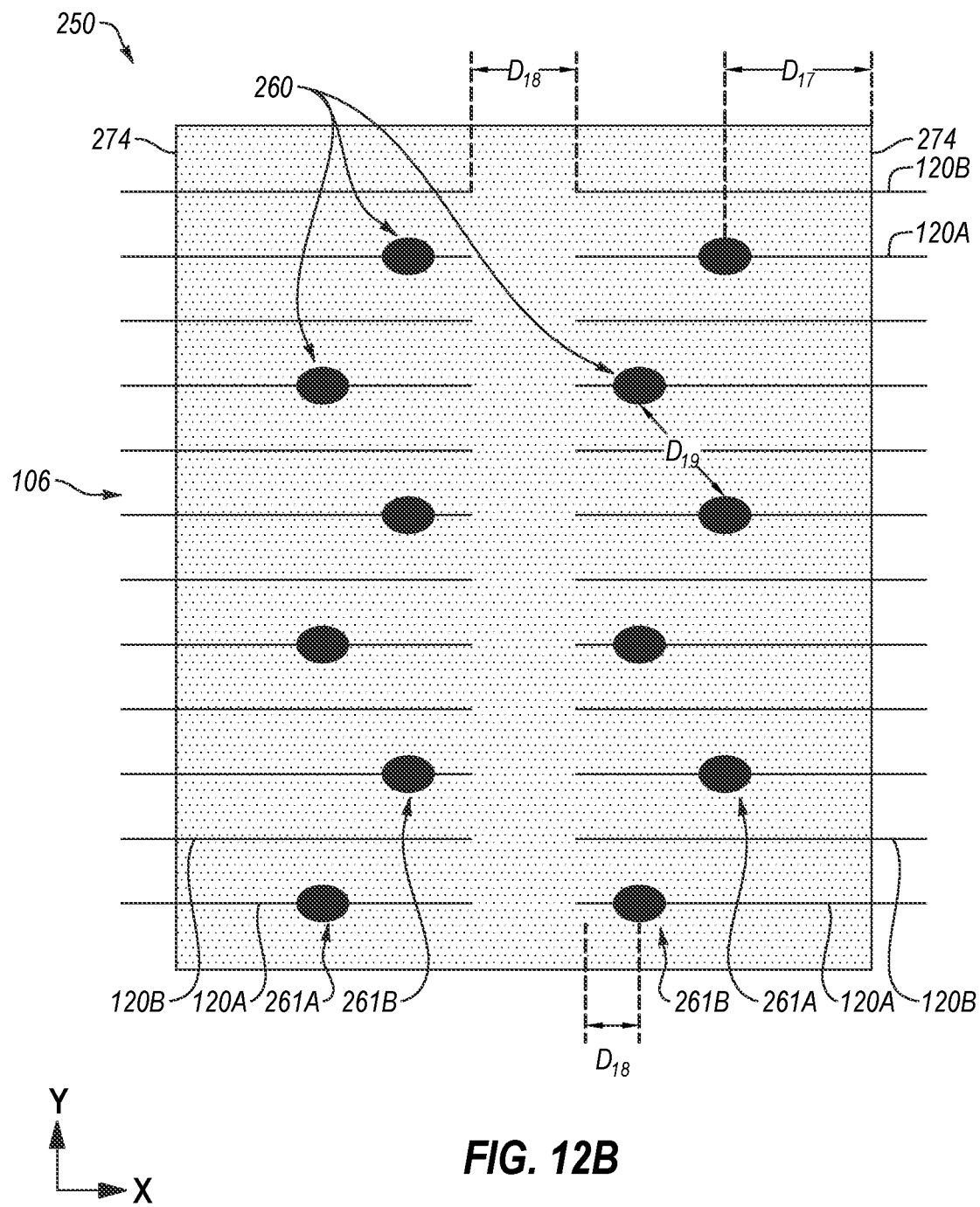
FIG. 12B is a simplified plan view of a word line exit subregion of the microelectronic device of FIG. 11, in accordance with an embodiment of the disclosure.

FIG. 12B is a simplified plan view of the first word line exit subregion 106A illustrated in box 272 of the microelectronic device 250 of FIG. 11. Word lines 120 may horizontally (e.g., in the X-direction) terminate within the first word line exit subregion 106A. In some embodiments, every other one of the word lines 120 (e.g., the odd word lines 120A) is coupled to a word line routing and contact structure 260 within the first word line exit subregion 106A.

A horizontal boundary 274 of the first word line exit subregion 106A may comprise an interface between the first word line exit subregion 106A and a horizontally neighboring (e.g., in the X-direction) array region 102. In other words, in some embodiments, the first word line exit subregion 106A may be located directly between and contacting horizontally neighboring array region 102 within a row 103 (FIG. 11) of array regions 102.

In some embodiments, the word line contact and routing structures 260 are staggered. In some such embodiments, the word line contact and routing structures 260 coupled to horizontally neighboring (e.g., in the Y-direction) odd word lines 120A are horizontally offset (e.g., in the Y-direction) from each other. A first row 261A of the word line contact and routing structures 260 may be located closer to the horizontal boundary 274 of the first word line exit subregion 106A and, therefore, to a horizontally neighboring (e.g., in the X-direction) array region 102 (FIG. 11) than a second row 261B of the word line contact and routing structures 260. The word line contact and routing structures 260 of the first row 261A may be horizontally aligned (e.g., in the X-direction) with the other word line contact and routing structures 260 of the first row 261A and offset from the word line contact and routing structures 260 of the second row 261B. The word line contact and routing structures 260 of the second row 261B may be horizontally aligned (e.g., in the Y-direction) with the other word line contact and routing structures 260 of the second row 261B and offset from the word line contact and routing structures 260 of the first row 261A.

In some embodiments, the word line contact and routing structures 260 of the every fourth word line 120 is horizontally aligned (e.g., in the X-direction) due to the staggered pattern of the word line contact and routing structures 260. The second deep contact structure 190 (FIG. 10C) of every fourth word line 120 are horizontally aligned in the X-direction. In some embodiments, a distance between horizontally neighboring (e.g., in the Y-direction) and horizontally aligned (e.g., in the X-direction) word line contact and routing structures 260 may be substantially the same in each of the first row 261A and the second row 261B.

In some embodiments, the word lines 120 extending into the first word line exit subregion 106A from a first horizontal boundary 274 are connected to SWD sections 254 (FIG. 11) of a first array region 102A and word lines 120 extending into the first word line exit subregion 106A from a second, opposing horizontal boundary 274 are connected to SWD sections 254 (FIG. 11) of a second, different array region 102. Word line contact and routing structures 260 coupled to horizontally aligned (e.g., in the X-direction) odd word lines 120A may be coupled to SWD sections 254 of different array regions 102. In some embodiments, word line contact and routing structures 260 coupled to horizontally aligned (e.g., in the Y-direction) odd word lines 120A may be located a different distance from a nearest horizontal boundary 274 and, therefore a different distance from a nearest array region 102.

The word line contact and routing structures 260 within the first row 261A may be located a distance $D_{17}$ from a nearest horizontal boundary 274. The distance $D_{17}$ may be within a range of from about 80 nm to about 140 nm, such as from about 80 nm to about 100 nm, from about 100 nm to about 120 nm, or from about 120 nm to about 140 nm. In some embodiments, the distance $D_{14}$ is about 110 nm. In some embodiments, the distance $D_{17}$ is substantially the same as the distance $D_{13}$ (FIG. 12A). In other embodiments, the distance $D_{17}$ is less than the distance $D_{13}$.

A distance $D_{18}$ between the horizontal end of an odd word line 120A and a word line routing and contact structure 260 within the second row 261B may be within a range of from about 20 nm to about 30 nm, such as from about 20 nm to about 25 nm, or from about 25 nm to about 30 nm. In some embodiments, the distance $D_{14}$ is about 25 nm. In some embodiments, the distance $D_{18}$ is substantially the same as the distance $D_{14}$ (FIG. 12A). In other embodiments, the distance $D_{18}$ is less than the distance $D_{14}$.

A distance $D_{19}$ between the word line contact and routing structures 260 of horizontally neighboring odd word lines 120A (a word line routing and contact structure 260 within a first row 261A and a word line routing and contact structure 260 within a second row 261B) may be within a range of from about 50 nm to about 70 nm, such as from about 50 nm to about 60 nm, or from about 60 nm to about 70 nm. In some embodiments, the distance $D_{18}$ is about 62 nm. In some embodiments, the distance $D_{19}$ is substantially the same as the distance $D_{15}$ (FIG. 12A). In other embodiments, the distance $D_{19}$ is less than the distance $D_{15}$.

A distance $D_{20}$ between a horizontal end of a first group of the odd word lines 120A coupled to a first array region 102A (FIG. 11) and a horizontal end of a second group of the odd word lines 120A coupled to a second array region 102B (FIG. 11) may be within a range of from about 40 nm to about 80 nm, such as from about 40 nm to about 60 nm, or from about 60 nm to about 80 nm. In some embodiments, the distance $D_{20}$ is about 60 nm.

Forming the microelectronic device to 250 (FIG. 10A through FIG. 10D and FIG. 11) by forming the fourth contact structures 142 (FIG. 10B and FIG. 10C) of the first group 142A (FIG. 10B) and the second group 142B (FIG. 10C) to have the respective dimensions $D_{10}$ (FIG. 9B), $D_{12}$ (FIG. 9C) facilitates electrical connection of the fourth contact structures 142 to the seventh contact structures 172 (FIG. 10B and FIG. 10C) of the first group 172A (FIG. 10B) and of the second group 172B (FIG. 10C) and electrical connection between the digit lines 118 (FIG. 10B) and the BEOL structures (e.g., the third routing structures 194 (FIG. 10B) of the third routing tier 192 (FIG. 10B)) and the control logic devices 170 (FIG. 10A and FIG. 10D) and electrical connection between the word lines 120 (FIG. 10C) and the BEOL structures (e.g., the third routing structures 194 (FIG. 10C) of the third routing tier 192 (FIG. 10C)) and the control logic devices 170 (FIG. 10A and FIG. 10D) after attachment of the second microelectronic device structure 145 (FIG. 8A through FIG. 8D) to the first microelectronic device structure 100 (FIG. 8A through FIG. 8D).

The dimensions $D_{10}$ (FIG. 9B) and $D_{12}$ (FIG. 9C) of the fourth contact structures 142 (FIG. 10B and FIG. 10C) of the first group 142A (FIG. 10B) and the second group 142B (FIG. 10C) facilitate formation of the first deep contact structures 188 (FIG. 10B) and the second deep contact structures 190 (FIG. 10C) and electrical connection thereof to the respective digit lines 118 (FIG. 10B) and word lines 120 (FIG. 10C), even if there are misregistration errors between the second microelectronic device structure 145 (FIG. 8A through FIG. 8D) and the first microelectronic device structure 100 (FIG. 8A through FIG. 8D) during attachment thereof (e.g., the second microelectronic device structure 145 is not completely aligned with the first microelectronic device structure 100 during attachment thereof).

In addition, forming the fourth contact structures 142 (FIG. 10B and FIG. 10C) of the first group 142A (FIG. 10B) and the second group 142B (FIG. 10C) to include the tapered sidewalls 133 (FIG. 10B and FIG. 10C) facilitates forming the first deep contact structures 188 (FIG. 10B) and the second deep contact structures 190 (FIG. 10C) to each individually contact a respective digit line 118 (FIG. 10B) and word lines 120 (FIG. 10C) without electrically shorting to a neighboring digit line 118 or word line 120. In addition, the tapered sidewalls 133 and the staggering of the digit line routing and contact structures 258 (FIG. 12B) and the word line routing and contact structures 260 (FIG. 12C) facilitates formation of the first group 142A (FIG. 10B) and the second group 142B (FIG. 10C) of the fourth contact structures 142 to have an upper dimension $D_{10}$, $D_{12}$, respectively, for forming electrical connections to the seventh contact structures 176.

Forming the digit line routing and contact structures 258 (FIG. 12A) and the word line routing and contact structures 260 (FIG. 12B), and the associated respective first deep contact structures 188 (FIG. 10B) and second deep contact structures (FIG. 10C) to have the staggered pattern facilitates forming the first deep contact structures 188 and the second deep contact structures to have a pitch that is about two times the pitch of the respective digit lines 118 (FIG. 10B) and the word lines 120 (FIG. 10C), while forming the fourth contact structures 142 (FIG. 10B and FIG. 10C) to have a desired dimension for forming the electrical connection between the seventh contact structures 176 (FIG. 10B and FIG. 10C) and the fourth contact structures 142.

Thus, in accordance with embodiments of the disclosure, a microelectronic device comprises a first microelectronic device structure and a second microelectronic device structure attached to the first microelectronic device structure. The first microelectronic device structure comprises memory arrays comprising memory cells comprising access devices and storage node devices, digit lines coupled to the access devices and extending in a first direction to a digit line exit region, and word lines coupled to the access devices and extending in a second direction to a word line exit region. The second microelectronic device structure comprises control logic devices over and in electrical communication with the memory cells. The microelectronic device further comprises contact structures individually in contact with the digit lines in the digit line exit region and in electrical communication with at least some of the control logic devices, at least one of the contact structures comprising a first cross-sectional area at an interface of the first microelectronic device structure and the second microelectronic device structure, and a second cross-sectional area at an interface of one of digit lines, the second cross-sectional area smaller than the first cross-sectional area.

Furthermore, in accordance with some embodiments of the disclosure, a memory device comprises array regions individually comprising memory cells comprising access devices and storage node devices, digit lines coupled to the access devices and extending in a first direction, word lines coupled to the access devices and extending in a second direction orthogonal to the first direction, and control logic devices over and in electrical communication with the memory cells. The memory device further comprises digit line exit regions horizontally alternating with the array regions in the first direction. The digit line exit regions individually comprising portions of the digit lines extending beyond the array regions adjacent thereto, and first deep contact structures individually comprising a first portion in contact with a digit line, a second portion in contact with the first portion, and a third portion in contact with the second portion, the second portion having a larger horizontal cross-sectional area than the third portion at an interface between the second portion and the third portion. The memory device further comprises word line exit regions horizontally alternating with the array regions in the second direction. The word line exit regions individually comprise portions of the word lines extending beyond the array regions adjacent thereto, second deep contact structures individually comprising a first additional portion in contact with a word line, a second additional portion in contact with the first additional portion; and a third additional portion in contact with the second additional portion, the second additional portion having a larger additional horizontal cross-sectional area than the third additional portion at an interface between the second additional portion and the third additional portion.

In accordance with yet additional embodiments, a microelectronic device comprises memory arrays comprising memory cells, digit lines coupled to the memory cells and extending in a first horizontal direction, word lines coupled to the memory cells and extending in a second horizontal direction, and digit line exit regions alternating with the memory arrays in the first horizontal direction. Each digit line exit region individually comprises a first digit line exit subregion including first deep contact structures in contact with odd ones of the digit lines, at least some of first deep contact structures horizontally neighboring each other in the second horizontal direction being horizontally offset from one another in the first horizontal direction, and a second digit line exit subregion including additional first deep contact structures in contact with even ones of the digit lines. The microelectronic device further comprises word line exit region alternating with the memory arrays in the second horizontal direction. Each word line exit region individually comprises a first word line exit subregion including second deep contact structures in contact with odd ones of the word lines, and a second word line exit subregion including additional second deep contact structures in contact with even ones of the word lines.

In accordance with further embodiments, a method of forming a microelectronic device comprises forming a microelectronic device structure comprising memory cells, digit lines, at least one isolation material covering and surrounding the memory cells and the digit lines, first contact structures in contact with the digit lines and individually comprising tapered sidewalls, and second contact structures vertically extending through the at least one isolation material and in contact with the first contact structures, each of the second contact structures comprising a smaller dimension at a lower end thereof in contact with the first contact structures than at an upper end thereof. The method further comprises forming an additional microelectronic device structure comprising control logic devices and at least one additional isolation material covering and surrounding the control logic devices, attaching the additional microelectronic device structure to the microelectronic device structure to form an assembly, the control logic devices overlying the memory cells within the assembly, and forming third contact structures extending through the at least one additional isolation material and to the second contact structures.

Figure 13:
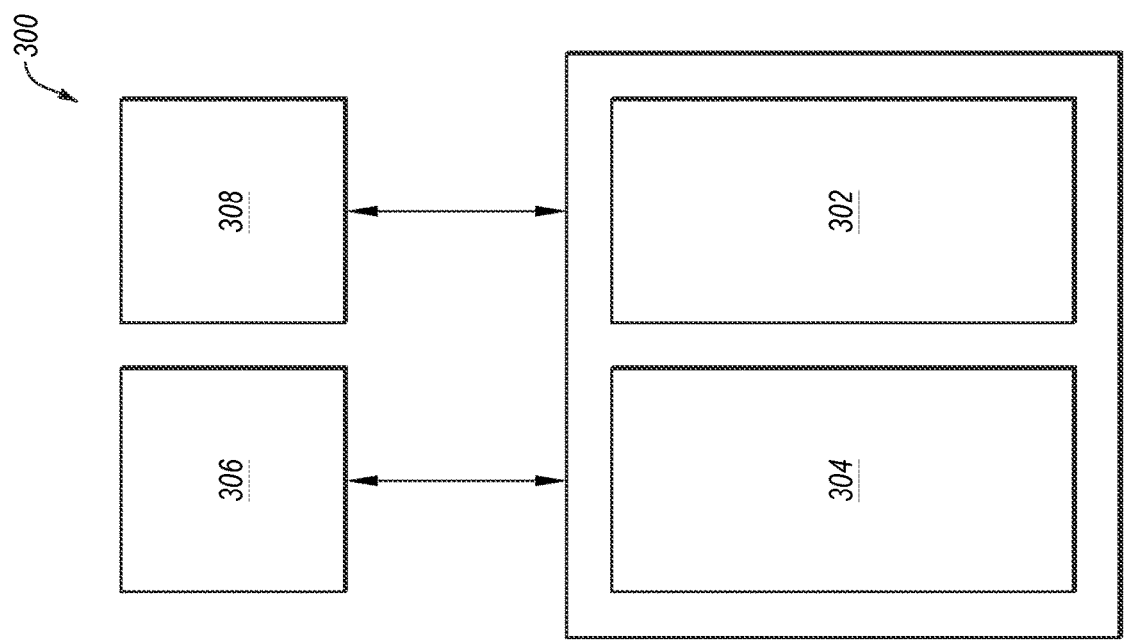
FIG. 13 is a schematic block diagram of an electronic system, in accordance with an embodiment of the disclosure.

Microelectronic devices (e.g., the microelectronic device 250 (FIG. 10A through FIG. 10D and FIG. 11)) in accordance with embodiments of the disclosure may be used in embodiments of electronic systems of the disclosure. For example, FIG. 13 is a block diagram illustrating an electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 300 includes at least one memory device 302. The memory device 302 may comprise, for example, a microelectronic device (e.g., the microelectronic device 250 (FIG. 10A through FIG. 10D and FIG. 11)) previously described herein. The electronic system 300 may further include at least one electronic signal processor device 304 (often referred to as a "microprocessor"). The electronic signal processor device 304 may, optionally, comprise a microelectronic device (e.g., the microelectronic device 250 (FIG. 10A through FIG. 10D and FIG. 11)) previously described herein. While the memory device 302 and the electronic signal processor device 304 are depicted as two (2) separate devices in FIG. 13, in additional embodiments, a single (e.g., only one) memory/processor device having the functionalities of the memory device 302 and the electronic signal processor device 304 is included in the electronic system 300. In such embodiments, the memory/processor device may include a microelectronic device (e.g., the microelectronic device 250 (FIG. 10A through FIG. 10D and FIG. 11)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprise a single touchscreen device that can be used both to input information to the electronic system 300 and to output visual information to a user. The input device 306 and the output device 308 may communicate electrically with one or more of the memory device 302 and the electronic signal processor device 304.

Accordingly, in at least some embodiments, an electronic device comprises an input device, an output device, a processor device operably coupled to the input device and the output device, and a memory device operably coupled to the processor device. The memory device comprises an array region comprising memory cells, odd digit lines, even digit lines, odd word lines, and even word lines, and a first digit line exit subregion on a first side of the array region and comprising a first group of first deep contact structures in contact with the odd digit lines. The first deep contact structures of the first group individually comprise a first contact structure in contact with one of the odd digit lines, a second contact structure in contact with the first contact structure and having an uppermost horizontal area larger than that of the first contact structure, and a third contact structure in contact with the second contact structure and having a lowermost horizontal area smaller than the uppermost horizontal area of the second contact structure. The memory device further comprises a second digit line exit subregion on a second side of the array region opposite the first side, the second digit line exit subregion comprising a second group of first deep contact structures in contact with the even digit lines, a first word line exit subregion on a third side of the array region and comprising a first group of second deep contact structures in contact with the odd word lines, a second word line exit subregion on a fourth side of the array region opposite the third side, the second word line exit subregion comprising a second group of second deep contact structures in contact with the even word lines, and control logic devices vertically overlying and in electrical communication with the memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first microelectronic device structure, comprising:
memory arrays comprising memory cells comprising access devices and storage node devices;
digit lines coupled to the access devices and extending in a first direction to a digit line exit region; and
word lines coupled to the access devices and extending in a second direction to a word line exit region;
a second microelectronic device structure attached to the first microelectronic device structure, the second microelectronic device structure comprising control logic devices over and in electrical communication with the memory cells; and
contact structures individually in contact with the digit lines in the digit line exit region and in electrical communication with at least some of the control logic devices, at least one of the contact structures comprising:
a first cross-sectional area at an interface of the first microelectronic device structure and the second microelectronic device structure; and
a second cross-sectional area at an interface of one of the digit lines, the second cross-sectional area smaller than the first cross-sectional area.

2. The microelectronic device of claim 1, wherein the at least one of the contact structures comprises:
a first portion in contact with the one of the digit lines; and
a second portion in contact with the first portion and the extending to the interface between the first microelectronic device structure and the second microelectronic device structure.

3. The microelectronic device of claim 1, wherein the at least one of the contact structures further comprises tapered sidewalls.

4. The microelectronic device of claim 1, further comprising additional contact structures individually in contact with the word lines in the word line exit region, at least one of the additional contact structures comprising:
a third cross-sectional area at the interface of the first microelectronic device structure and the second microelectronic device structure; and
a fourth cross-sectional area at an interface of one of the word lines, the fourth cross-sectional area smaller than the third cross-sectional area.

5. The microelectronic device of claim 1, wherein a first contact structure of the contact structures is horizontally offset in the first direction and the second direction from a horizontally neighboring second contact structure of the contact structures.

6. The microelectronic device of claim 1, wherein a first distance between the control logic devices and the storage node devices of the memory cells is less than a second distance between the control logic devices and the access devices of the memory cells.

7. The microelectronic device of claim 1, wherein a number of the memory cells of the first microelectronic device structure is greater than a number of transistors of the control logic devices of the second microelectronic device structure.

8. The microelectronic device of claim 1, wherein:
the contact structures contact odd digit lines of the digit lines in the digit line exit region; and
even digit lines of the digit lines are in contact with additional contact structures in an additional digit line exit region.

9. The microelectronic device of claim 1, wherein contact structures exhibit a larger dimension in the first direction than in the second direction.

10. The microelectronic device of claim 1, wherein a ratio between a dimension of each contact structure at the interface of the first microelectronic device structure and the second microelectronic device structure and a dimension of the respective contact structure at the interface of the digit lines and the contact structure is within a range of from about 1.5:1.0 to about 3.5:1.0.

11. A memory device, comprising:
array regions individually comprising:
memory cells comprising access devices and storage node devices;
digit lines coupled to the access devices and extending in a first direction;
word lines coupled to the access devices and extending in a second direction orthogonal to the first direction; and
control logic devices over and in electrical communication with the memory cells;
digit line exit regions horizontally alternating with the array regions in the first direction and individually comprising:
portions of the digit lines extending beyond the array regions adjacent thereto; and
first deep contact structures individually comprising:
a first portion in contact with a digit line;
a second portion in contact with the first portion; and
a third portion in contact with the second portion, the second portion having a larger horizontal cross-sectional area than the third portion at an interface between the second portion and the third portion; and
word line exit regions horizontally alternating with the array regions in the second direction and individually comprising:
portions of the word lines extending beyond the array regions adjacent thereto;
second deep contact structures individually comprising:
a first additional portion in contact with a word line;
a second additional portion in contact with the first additional portion; and
a third additional portion in contact with the second additional portion, the second additional portion having a larger cross-sectional area than the third additional portion at an interface between the second additional portion and the third additional portion.

12. The memory device of claim 11, wherein the interface between the second additional portion and the third portion of the first deep contact structures is larger than the interface between the second additional portion and the third additional portion of the second deep contact structures.

13. The memory device of claim 11, wherein the interface between the second portion and the third portion of the first deep contact structures is closer to the control logic devices than to the access devices.

14. The memory device of claim 11, wherein some of the first deep contact structures are horizontally staggered relative to some other of the first deep contact structures in the second direction.

15. The memory device of claim 11, wherein the first deep contact structures individually exhibit an ovular horizontal cross-sectional shape.

16. The memory device of claim 11, wherein:
the third additional portion of each of the first deep contact structures exhibits a larger dimension in the second direction than in the first direction; and
the third additional portion of each of the second deep contact structures exhibits a larger dimension in the first direction than in the second direction.

17. The memory device of claim 11, wherein some of the first deep contact structures are horizontally aligned with one another in the first direction and are horizontally offset from some of the other of the first deep contact structures in the first direction.

18. The memory device of claim 11, wherein the first deep contact structures comprise:
a first row of the first deep contact structures comprising a first group of the first deep contact structures horizontally aligned with each other in the first direction; and
a second row of the first deep contact structures comprising a second group of the first deep contact structures horizontally aligned with each other in the first direction, the second group of the first deep contact structures horizontally offset from the first group of the first deep contact structures in the first direction.

19. The memory device of claim 18, wherein a distance between two of the first deep contact structures neighboring one another within of the first row is substantially the same as an additional distance between two other of the first deep contact structures horizontally neighboring one another within the second row.

20. A method of forming a microelectronic device, the method comprising:
forming a microelectronic device structure comprising:
memory cells;
digit lines;
at least one isolation material covering and surrounding the memory cells and the digit lines;
first contact structures in contact with the digit lines and individually comprising tapered sidewalls; and
second contact structures vertically extending through the at least one isolation material and in contact with the first contact structures, each of the second contact structures comprising a smaller dimension at a lower end thereof in contact with one of the first contact structures than at an upper end thereof;
forming an additional microelectronic device structure comprising control logic devices and at least one additional isolation material covering and surrounding the control logic devices;
attaching the additional microelectronic device structure to the microelectronic device structure to form an assembly, the control logic devices overlying the memory cells within the assembly; and
forming third contact structures extending through the at least one additional isolation material and to the second contact structures.

21. The method of claim 20, wherein forming third contact structures extending through the at least one additional isolation material and to the second contact structures comprises forming the third contact structures to each have an additional lower end relatively smaller than the upper end of one of the second contact structures in contact therewith.

22. The method of claim 20, wherein forming a microelectronic device comprises:
forming the upper end of the second contact structures to have a horizontal width within a range from about 40 nm to about 70 nm; and
forming the lower end of each of the second contact structures to have an additional horizontal width within a range of about 20 nm to about 50 nm.

23. The method of claim 20, wherein forming third contact structures comprises:
forming a first row of the third contact structures; and
forming a second row of the third contact structures horizontally offset from the first row of the contact structures in a horizontal direction in which the digit lines extend in parallel.

24. The method of claim 23, wherein forming third contact structures comprises forming the third contact structures within the first row of the third contact structures to be horizontally offset from each other in an additional horizontal direction substantially perpendicular to the horizontal direction in which the digit lines extend in parallel.

25. The method of claim 20, wherein attaching the additional microelectronic device structure to the microelectronic device structure comprises attaching the additional microelectronic device structure to the microelectronic device structure such that storage node devices of the memory cells are located closer to the additional microelectronic device structure than are access devices of the microelectronic device structure.

26. The method of claim 20, wherein forming a microelectronic device structure comprises forming each of the first contact structures to comprise a lower boundary having a horizontal dimension within a range of from about 20 nm to about 40 nm in a first direction.

27. The method of claim 26, further comprising forming the lower boundary of each of the first contact structures to have an additional horizontal dimension, in a second direction orthogonal to the first direction, within a range of from about 30 nm to about 50 nm.

28. An electronic system, comprising:
an input device;
an output device;
a processor device operably connected to the input device and the output device; and
a memory device operably connected to the processor device and comprising:
an array region comprising memory cells, odd digit lines, even digit lines, odd word lines, and even word lines;

a first digit line exit subregion on a first side of the array region and comprising a first group of first deep contact structures in contact with the odd digit lines, the first deep contact structures of the first group individually comprising:
- a first contact structure in contact with one of the odd digit lines;
- a second contact structure in contact with the first contact structure and having an uppermost horizontal area larger than that of the first contact structure; and
- a third contact structure in contact with the second contact structure and having a lowermost horizontal area smaller than the uppermost horizontal area of the second contact structure;

a second digit line exit subregion on a second side of the array region opposite the first side, the second digit line exit subregion comprising a second group of first deep contact structures in contact with the even digit lines;

a first word line exit subregion on a third side of the array region and comprising a first group of second deep contact structures in contact with the odd word lines;

a second word line exit subregion on a fourth side of the array region opposite the third side, the second word line exit subregion comprising a second group of second deep contact structures in contact with the even word lines; and control logic devices vertically overlying and in electrical communication with the memory cells.

29. The electronic system of claim 28, further comprising an additional array region, the first digit line exit subregion between the array region and the additional array region.

30. The electronic system of claim 28, wherein every other first deep contact structure of the first group of first deep contact structures are horizontally aligned with one another.

31. The electronic system of claim 28, wherein the second deep contact structures of the first group of second deep contact structures are smaller than the first deep contact structures of the first group of first deep contact structures.

32. The electronic system of claim 28, wherein the memory cells comprise dynamic random access memory (DRAM) cells.

33. A microelectronic device, comprising:
- memory arrays comprising memory cells;
- digit lines coupled to the memory cells and extending in a first horizontal direction;
- word lines coupled to the memory cells and extending in a second horizontal direction;
- digit line exit regions alternating with the memory arrays in the first horizontal direction, each digit line exit region individually comprising:
  - a first digit line exit subregion including first deep contact structures in contact with odd ones of the digit lines, at least some of the first deep contact structures horizontally neighboring one another in the second horizontal direction being horizontally offset from one another in the first horizontal direction; and
  - a second digit line exit subregion including additional first deep contact structures in contact with even ones of the digit lines; and
- word line exit regions alternating with the memory arrays in the second horizontal direction, each word line exit region individually comprising:
  - a first word line exit subregion including second deep contact structures in contact with odd ones of the word lines; and
  - a second word line exit subregion including additional second deep contact structures in contact with even ones of the word lines.

34. The microelectronic device of claim 33, wherein sidewalls of the first deep contact structures are tapered.

35. The microelectronic device of claim 33, wherein the second digit line exit subregion is located on an opposite horizontal side of the memory arrays than the first digit line exit subregion.

36. The microelectronic device of claim 33, wherein at least some of the second deep contact structures horizontally neighboring one another in the first horizontal direction are horizontally offset from one another in the second horizontal direction.

* * * * *

UNITED STATES PATENT AND TRADEMARK OFFICE
CERTIFICATE OF CORRECTION

PATENT NO. : 11,791,273 B2
APPLICATION NO. : 17/500599
DATED : October 17, 2023
INVENTOR(S) : Fatma Arzum Simsek-Ege It is certified that error appears in the above-identified patent and that said Letters Patent is hereby corrected as shown below:

In the Specification

| | | |
|---|---|---|
| Column 3, | Line 51, | change "not necessary limited" to --not necessarily limited-- |
| Column 5, | Line 33, | change "palladium (Pa)," to --palladium (Pd)-- |
| Column 24, | Lines 9-10, | change "dimension $D_5$ of" to --dimension $D_8$ of-- |
| Column 24, | Line 22, | change "dimension $D_5$ is" to --dimension $D_8$ is-- |
| Column 24, | Line 29, | change "dimension $D_5$ may" to --dimension $D_8$ may-- |
| Column 24, | Line 30-31, | change "dimension $D_5$ are" to --dimension $D_8$ are-- |
| Column 24, | Line 43, | change "dimension $D_5$ of" to --dimension $D_8$ of-- |
| Column 24, | Line 50, | change "dimension $D_5$ of" to --dimension $D_8$ of-- |
| Column 24, | Line 53, | change "dimension $D_5$ of" to --dimension $D_8$ of-- |
| Column 24, | Line 59, | change "dimension $D_5$ is" to --dimension $D_8$ is-- |
| Column 24, | Line 64, | change "dimension $D_5$ of" to --dimension $D_8$ of-- |
| Column 25, | Line 1, | change "dimension $D_5$ of" to --dimension $D_8$ of-- |
| Column 38, | Line 67, | change "dimensions $D_4$, $D_5$ may" to --dimensions $D_4$, $D_8$ may-- |

Signed and Sealed this
Thirteenth Day of February, 2024

Katherine Kelly Vidal
*Director of the United States Patent and Trademark Office*